US008927971B2

(12) United States Patent
Watson

(10) Patent No.: US 8,927,971 B2
(45) Date of Patent: Jan. 6, 2015

(54) SEMICONDUCTING COMPOUNDS AND DEVICES INCORPORATING SAME

(75) Inventor: Mark D. Watson, Lexington, KY (US)

(73) Assignee: University of Kentucky Research Foundation, Lexington, KY (US)

(*) Notice: Subject to any disclaimer, the term of this patent is extended or adjusted under 35 U.S.C. 154(b) by 730 days.

(21) Appl. No.: 12/755,308

(22) Filed: Apr. 6, 2010

(65) Prior Publication Data
US 2010/0252112 A1 Oct. 7, 2010

Related U.S. Application Data

(60) Provisional application No. 61/166,896, filed on Apr. 6, 2009.

(51) Int. Cl.
H01L 51/00 (2006.01)
C08G 61/12 (2006.01)
C09B 69/10 (2006.01)
C09B 57/00 (2006.01)
C08G 73/10 (2006.01)
C08G 73/06 (2006.01)
C09B 57/08 (2006.01)
H01L 51/05 (2006.01)
H01L 51/42 (2006.01)

(52) U.S. Cl.
CPC .......... H01L 51/0035 (2013.01); C08G 61/123 (2013.01); C08G 2261/344 (2013.01); H01L 51/0545 (2013.01); H01L 51/0036 (2013.01); C09B 69/109 (2013.01); C09B 57/00 (2013.01); H01L 51/0043 (2013.01); H01L 51/0053 (2013.01); C08G 73/10 (2013.01); C08G 61/126 (2013.01); C08G 2261/92 (2013.01); Y02E 10/549 (2013.01); C08G 73/0672 (2013.01); C08G 2261/414 (2013.01); C09B 57/08 (2013.01); H01L 51/4253 (2013.01); C08G 2261/3223 (2013.01)
USPC ............. 257/40; 528/322; 528/310; 548/466; 548/454; 548/453; 136/263

(58) Field of Classification Search
USPC .................................. 528/310, 322
See application file for complete search history.

(56) References Cited

U.S. PATENT DOCUMENTS 3,609,477 A * 9/1971 Drangeid et al. ............. 257/284
7,342,247 B2 * 3/2008 Lee et al. .................... 257/40
2006/0249712 A1 11/2006 Heeney et al.
2009/0274971 A1 11/2009 Wu
2010/0326527 A1 * 12/2010 Facchetti et al. ............. 136/263
2011/0120558 A1 * 5/2011 Facchetti et al. ............. 136/263

FOREIGN PATENT DOCUMENTS

| EP | 1615237 | 1/2006 |
|---|---|---|
| EP | 1710266 | 10/2006 |
| WO | 2007/120788 | 10/2007 |
| WO | WO 2007120788 | * 10/2007 |
| WO | 2009/098250 | 8/2009 |
| WO | 2009/098253 | 8/2009 |
| WO | 2009/098254 | 8/2009 |
| WO | 2009/144205 | 12/2009 |
| WO | 2009/144302 | 12/2009 |
| WO | 2010/079064 | 7/2010 |

OTHER PUBLICATIONS

Zhan et al , J. Am. Chem. Soc, 2007, 129, 7246-7247.*
Letizia et al, J. Am. Chem. Soc, 2008, 130, 9679-9694.*
Dierschke et al., "A hybrid polymer of polyaniline and phthalimide dyes," Synthetic Metals, 156:433-443 (2006).
Faid et al., "Design of Novel Electroactive Polybithiophene Derivatives," Macromolecules, 26(10):2501-2507 (1993).
Grätzel et al., "Themed issue: solar cells," J. Mater. Chem., 19:5276-5278 (2009).
Guo et al., "Phthalimide-Based Polymers for High Performance Organic Thin-Film Transistors," J. Am. Chem. Soc., 131:7206-7207 (2009).
Kim et al., "High-Mobility Ambipolar Transistors and High-Gain Inverters from a Donor-Acceptor Copolymer Semiconductor," Adv. Mater., 22:478-482 (2010).
Koeckelberghs et al., "Chirality in Poly(phenylene-alt-bithiophene)s: A Comprehensive Study of Their Behavior in Film and Nonsolvents," Macromolecules, 40(23):8142-8150 (2007).
Witzel et al., "New Poly(arylene ethynylene)s Consisting of Electron-Deficient Aryleneimide Units," Macromol. Rapid Commun., 26:889-894 (2005).
Zotti et al., "Conducting polymers from anodic coupling of some regiochemically defined dialkoxy-substituted thiophene oligomers," Synthetic Metals, 73:217-225 (1995).
Crouch et al., "Hexyl-Substituted Oligoselenophenes with Central Tetrafluorophenylene Units: Synthesis, Characterisation and Application in Organic Field Effect Transistors," Macromol. Rapid Commun. 29:1839-1843 (2009).
Guo et al., "Conjugated Polymers from Naphthalene Bisimide," Organic Letters, 10(23):5333-5336 (2008).
He et al., "Characterization and Stability of Light-Emitting Diodes Based on Poly(bithiazole)'s," IEEE Transactions on Electron Devices, 44(8):1282-1288 (1997).
Lee et al., "Semiconducting polymers based on electron-donating bithiophene and electron-accepting 5,5'-bithiazole units for organic thin-film transistors," Synthetic Metals, 159:132-136 (2009).
Nishioka et al., "Electrical and Optical Properties of Poly(3-Alkylfuran) and Their Doping Effect," Synthetic Metals, 41-43:815-818 (1991).
Wang et al., "Tuning the Properties of Alternating Copolymers from Perfluorobenzene and Thiophene Derivatives," Polymer Preprints, 48(2):127 (2007).
Yan et al., "A High-Mobility Electron-Transporting Polymer for Printed Transistors," Nature, vol. 457, pp. 679-687 (Feb. 5, 2009).

* cited by examiner

Primary Examiner — Irina Krylova
(74) Attorney, Agent, or Firm — Karen K. Chan

(57) ABSTRACT

Disclosed are semiconducting compounds having one or more phthalimide units and/or one or more head-to-head (H-H) substituted biheteroaryl units. Such compounds can be monomeric, oligomeric, or polymeric, and can exhibit desirable electronic properties and possess processing advantages including solution–processability and/or good stability at ambient conditions.

15 Claims, 3 Drawing Sheets

US 8,927,971 B2

SEMICONDUCTING COMPOUNDS AND DEVICES INCORPORATING SAME

CROSS REFERENCE TO RELATED APPLICATION

This application claims priority to and the benefit of U.S. Provisional Patent Application Ser. No. 61/166,896, filed on Apr. 6, 2009, the disclosure of which is incorporated by reference herein in its entirety.

STATEMENT OF GOVERNMENT INTEREST

This invention was made with government support under Grant No. CHE-0616759 awarded by the National Science Foundation. The government has certain rights in the invention.

BACKGROUND

A new generation of optoelectronic devices such as organic thin film transistors (OTFTs), organic light emitting transistors (OLETs), organic light emitting diodes (OLEDs), printable circuits, organic photovoltaic (OPV) devices, electrochemical capacitors, and sensors are built upon organic semiconductors as their active components. To enable high device efficiencies such as large charge carrier mobilities ($\mu$) needed for transistor/circuit operations, or efficient exciton formation/splitting that is necessary for OLED/OPV operations, it is desirable that both p-type and n-type organic semiconductor materials are available. In addition, certain optoelectronic devices such as light emitting transistors require a semiconductor material which can transport both types of charge carriers efficiently. Furthermore, these organic semiconductor-based devices should exhibit satisfactory stability in ambient conditions and should be processable in a cost-effective manner. For example, a benchmark polymer, regioregular poly(3-hexylthiophene) (rr-P3HT), can provide hole mobilities ~0.1 cm$^2$/Vs and current modulation $\geq 10^5$, close to amorphous silicon, but only under inert atmosphere.

Accordingly, the art desires new organic semiconductor materials, particularly those that can have good charge transport characteristics, processing properties, and stability in ambient conditions.

SUMMARY

In light of the foregoing, the present teachings provide organic semiconductor materials that are prepared from monomeric, oligomeric, and polymeric compounds having one or more phthalimide units and/or one or more head-to-head (H-H) substituted biheteroaryl units. Also provided are associated devices and related methods for the preparation and use of these compounds. The present compounds can exhibit properties such as excellent charge transport characteristics in ambient conditions, chemical stability, low-temperature processability, large solubility in common solvents, and processing versatility (e.g., via various solution processes). As a result, field effect devices such as thin film transistors that incorporate one or more of the present compounds as the semiconductor layer can exhibit high performance in ambient conditions, for example, demonstrating one or more of large charge carrier mobilities, low threshold voltages, and high current on-off ratios. Similarly, other organic semiconductor-based devices such as OPVs, OLETs, and OLEDs can be fabricated efficiently using the organic semiconductor materials described herein.

The present teachings also provide methods of preparing such compounds and semiconductor materials, as well as various compositions, composites, and devices that incorporate the compounds and semiconductor materials disclosed herein.

The foregoing as well as other features and advantages of the present teachings will be more fully understood from the following figures, description, examples, and claims.

BRIEF DESCRIPTION OF DRAWINGS

It should be understood that the drawings described below are for illustration purposes only. The drawings are not necessarily to scale, with emphasis generally being placed upon illustrating the principles of the present teachings. The drawings are not intended to limit the scope of the present teachings in any way.

DETAILED DESCRIPTION

Figure 1:
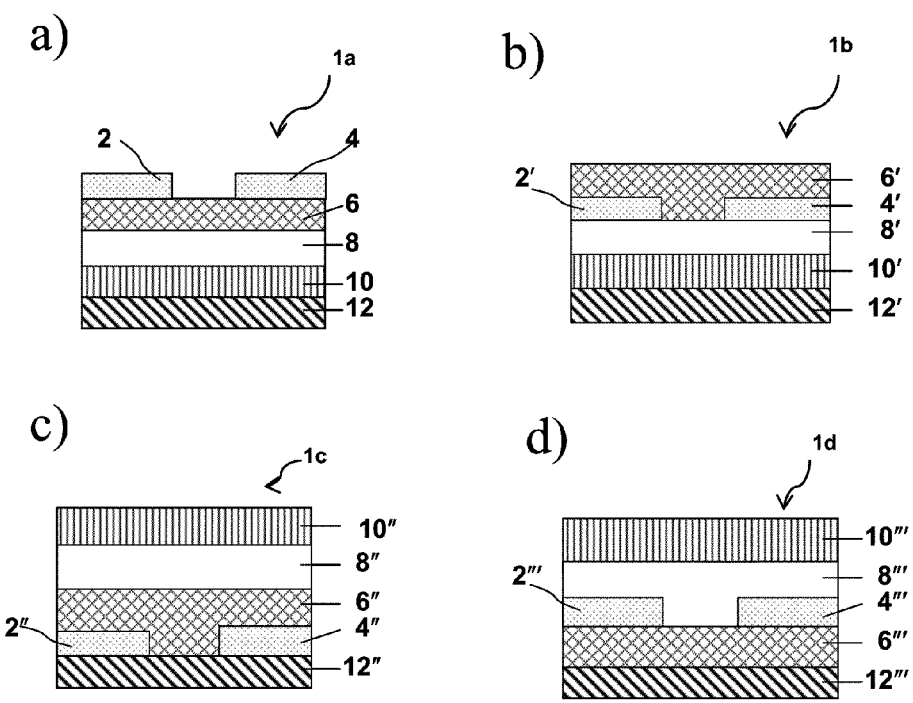
FIG. 1 illustrates four different configurations of thin film transistors: bottom-gate top contact (top left), bottom-gate bottom-contact (top right), top-gate bottom-contact (bottom left), and top-gate top-contact (bottom right); each of which can be used to incorporate compounds of the present teachings.

The present teachings provide organic semiconductor materials that are prepared from monomeric, oligomeric, and polymeric compounds having one or more phthalimide units and/or one or more head-to-head (H-H) substituted biheteroaryl units. Compounds of the present teachings can exhibit semiconductor behavior such as high carrier mobility and/or good current modulation characteristics in a field-effect device, light absorption/charge separation in a photovoltaic device, and/or charge transport/recombination/light emission in a light-emitting device. In addition, the present compounds can possess certain processing advantages such as solution-processability and/or good stability (for example, air stability) in ambient conditions. The compounds of the present teachings can be used to prepare p-type, n-type, or ambipolar semiconductor materials, which in turn can be used to fabricate various organic electronic articles, structures and devices, including field-effect transistors, unipolar circuitries, complementary circuitries, photovoltaic devices, and light emitting devices.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components and can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, an "oligomeric compound" (or "oligomer") or a "polymeric compound" (or "polymer") refers to a molecule including a plurality of one or more repeating units connected by covalent chemical bonds. An oligomeric or polymeric compound can be represented by the general formula:

wherein M is the repeating unit or monomer. The degree of polymerization can range from 2 to greater than 10,000. For example, for oligomeric compounds, the degree of polymerization can range from 2 to 9; and for polymeric compounds, the degree of polymerization can range from 10 to about 10,000. The oligomeric or polymeric compound can have only one type of repeating unit as well as two or more types of different repeating units. When a polymeric compound has only one type of repeating unit, it can be referred to as a homopolymer. When a polymeric compound has two or more types of different repeating units, the term "copolymer" or "copolymeric compound" can be used instead. The oligomeric or polymeric compound can be linear or branched. Branched polymers can include dendritic polymers, such as dendronized polymers, hyperbranched polymers, brush polymers (also called bottle-brushes), and the like. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer. For example, the general formula:

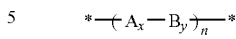

can be used to represent a co-oligomer or copolymer of A and B having x mole fraction of A and y mole fraction of B, where the manner in which comonomers A and B is repeated can be alternating, random, regiorandom, regioregular, or in blocks. The degree of polymerization (n) can range from 2 to greater than 10,000.

As used herein, a "cyclic moiety" can include one or more (e.g., 1-6) carbocyclic or heterocyclic rings. The cyclic moiety can be a cycloalkyl group, a heterocycloalkyl group, an aryl group, or a heteroaryl group (i.e., can include only saturated bonds, or can include one or more unsaturated bonds regardless of aromaticity), each including, for example, 3-24 ring atoms and can be optionally substituted as described herein. In embodiments where the cyclic moiety is a "monocyclic moiety," the "monocyclic moiety" can include a 3-14 membered aromatic or non-aromatic, carbocyclic or heterocyclic ring. A monocyclic moiety can include, for example, a phenyl group or a 5- or 6-membered heteroaryl group, each of which can be optionally substituted as described herein. In embodiments where the cyclic moiety is a "polycyclic moiety," the "polycyclic moiety" can include two or more rings fused to each other (i.e., sharing a common bond) and/or connected to each other via a spiro atom, or one or more bridged atoms. A polycyclic moiety can include an 8-24 membered aromatic or non-aromatic, carbocyclic or heterocyclic ring, such as a $C_{8\text{-}24}$ aryl group or an 8-24 membered heteroaryl group, each of which can be optionally substituted as described herein.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly π-conjugated and can include polycyclic aromatic hydrocarbons such as rylenes (or analogs thereof containing one or more heteroatoms) having the formula:

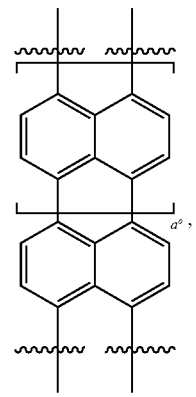

where a° can be an integer in the range of 0-3; coronenes (or analogs thereof containing one or more heteroatoms) having the formula:

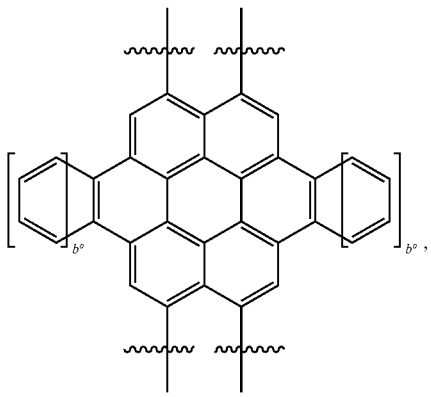

where b° can be an integer in the range of 0-3; and linear acenes (or analogs thereof containing one or more heteroatoms) having the formula:

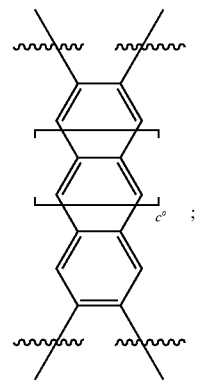

where c° can be an integer in the range of 0-4. The fused ring moiety can be optionally substituted as described herein.

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neopentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), and butyl groups (e.g., n-butyl, iso-butyl, sec-butyl, tert-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula $-C_sH_{2s+1-t}X^0{}_t$, where $X^0$, at each occurrence, is F, Cl, Br or I, s is an integer in the range of 1 to 40, and t is an integer in the range of 1 to 81, provided that t is less than or equal to 2s+1. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxy, hexoxy groups, and the like. The alkyl group in the —O-alkyl group can be substituted as described herein.

As used herein, "alkylthio" refers to an —S-alkyl group (which, in some cases, can be expressed as $-S(O)_w$-alkyl, wherein w is 0). Examples of alkylthio groups include, but are not limited to, methylthio, ethylthio, propylthio (e.g., n-propylthio and isopropylthio), t-butylthio, pentylthio, hexylthio groups, and the like. The alkyl group in the —S-alkyl group can be substituted as described herein.

As used herein, "arylalkyl" refers to an -alkyl-aryl group, where the arylalkyl group is covalently linked to the defined chemical structure via the alkyl group. An arylalkyl group is within the definition of a $-Y-C_{6-14}$ aryl group, where Y is a divalently alkyl group. An example of an arylalkyl group is a benzyl group ($-CH_2-C_6H_5$). An arylalkyl group can be optionally substituted, i.e., the aryl group and/or the alkyl group, can be substituted as disclosed herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, "cycloalkyl" refers to a non-aromatic carbocyclic group including cyclized alkyl, alkenyl, and alkynyl groups. In various embodiments, a cycloalkyl group can have 3 to 24 carbon atoms, for example, 3 to 20 carbon atoms (e.g., $C_{3-14}$ cycloalkyl group). A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 24 ring atoms, for example, 3 to 20 ring atoms (e.g., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., $C_{6-20}$ aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl(bicyclic), 2-naphthyl(bicyclic), anthracenyl(tricyclic), phenanthrenyl(tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —$C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

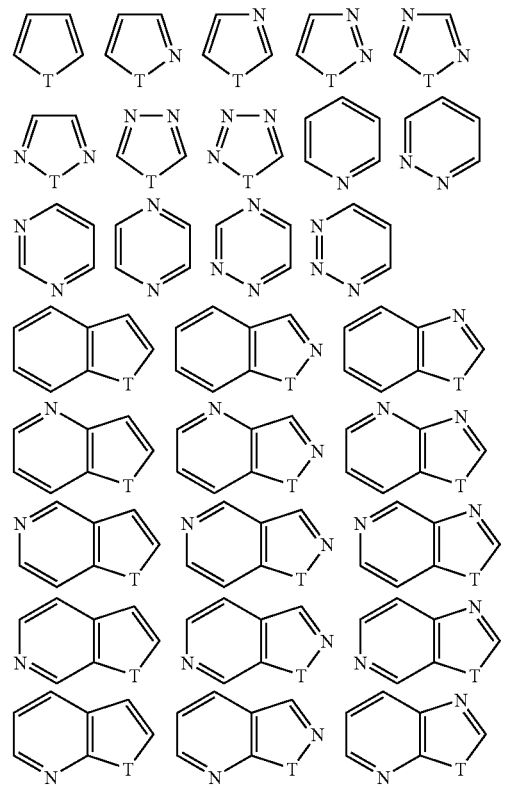

where T is O, S, NH, N-alkyl, N-aryl, N-(arylalkyl) (e.g., N-benzyl), $SiH_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Compounds of the present teachings can include a "divalent group" defined herein as a linking group capable of forming a covalent bond with two other moieties. For example, compounds of the present teachings can include a divalent $C_{1-20}$ alkyl group (e.g., a methylene group), a divalent $C_{2-20}$ alkenyl group (e.g., a vinylyl group), a divalent $C_{2-20}$ alkynyl group (e.g., an ethynylyl group). a divalent $C_{6-14}$ aryl group (e.g., a phenylyl group); a divalent 3-14 membered cycloheteroalkyl group (e.g., a pyrrolidylyl), and/or a divalent 5-14 membered heteroaryl group (e.g., a thienylyl group). Generally, a chemical group (e.g., —Ar—) is understood to be divalent by the inclusion of the two bonds before and after the group.

The electron-donating or electron-withdrawing properties of several hundred of the most common substituents, reflecting all common classes of substituents have been determined, quantified, and published. The most common quantification of electron-donating and electron-withdrawing properties is in terms of Hammett σ values. Hydrogen has a Hammett σ value of zero, while other substituents have Hammett σ values that increase positively or negatively in direct relation to their electron-withdrawing or electron-donating characteristics. Substituents with negative Hammett σ values are considered electron-donating, while those with positive Hammett σ values are considered electron-withdrawing. See Lange's Handbook of Chemistry, 12th ed., McGraw Hill, 1979, Table 3-12, pp. 3-134 to 3-138, which lists Hammett σ values for a large number of commonly encountered substituents and is incorporated by reference herein.

It should be understood that the term "electron-accepting group" can be used synonymously herein with "electron acceptor" and "electron-withdrawing group". In particular, an "electron-withdrawing group" ("EWG") or an "electron-accepting group" or an "electron-acceptor" refers to a functional group that draws electrons to itself more than a hydrogen atom would if it occupied the same position in a molecule. Examples of electron-withdrawing groups include, but are not limited to, halogen or halo (e.g., F, Cl, Br, I), —$NO_2$, —CN, —NC, —$S(R^o)_2^+$, —$N(R^o)_3^+$, —$SO_3H$, —$SO_2R^o$, —$SO_3R^o$, —$SO_2NHR^o$, —$SO_2N(R^o)_2$, —COOH, —$COR^o$, —$COOR^o$, —$CONHR^o$, —$CON(R^o)_2$, $C_{1-40}$ haloalkyl groups, $C_{6-14}$ aryl groups, and 5-14 membered electron-poor heteroaryl groups; where $R^o$ is a $C_{1-20}$ alkyl group, a $C_{2-20}$ alkenyl group, a $C_{2-20}$ alkynyl group, a $C_{1-20}$ haloalkyl group, a $C_{1-20}$ alkoxy group, a $C_{6-14}$ aryl group, a $C_{3-14}$ cycloalkyl group, a 3-14 membered cycloheteroalkyl group, and a 5-14 membered heteroaryl group, each of which can be optionally substituted as described herein. For example, each of the $C_{1-20}$ alkyl group, the $C_{2-20}$ alkenyl group, the $C_{2-20}$ alkynyl group, the $C_{1-20}$ haloalkyl group, the $C_{1-20}$ alkoxy group, the $C_{6-14}$ aryl group, the $C_{3-14}$ cycloalkyl group, the 3-14 membered cycloheteroalkyl group, and the 5-14 membered heteroaryl group can be optionally substituted with 1-5 small electron-withdrawing groups such as F, Cl, Br, —$NO_2$, —CN, —NC, —$S(R^o)_2^+$, —$N(R^o)_3^+$, —$SO_3H$, —$SO_2R^o$, —$SO_3R^o$, —$SO_2NHR^o$, —$SO_2N(R^o)_2$, —COOH, —$COR^o$, —$COOR^o$, —$CONHR^o$, and —$CON(R^o)_2$.

It should be understood that the term "electron-donating group" can be used synonymously herein with "electron donor". In particular, an "electron-donating group" or an "electron-donor" refers to a functional group that donates electrons to a neighboring atom more than a hydrogen atom would if it occupied the same position in a molecule. Examples of electron-donating groups include —OH, —$OR^o$, —$NH_2$, —$NHR^o$, —$N(R^o)_2$, and 5-14 membered electron-rich heteroaryl groups, where $R^o$ is a $C_{1-20}$ alkyl group, a $C_{2-20}$ alkenyl group, a $C_{2-20}$ alkynyl group, a $C_{6-14}$ aryl group, or a $C_{3-14}$ cycloalkyl group.

Various unsubstituted heteroaryl groups can be described as electron-rich (or π-excessive) or electron-poor (or π-deficient). Such classification is based on the average electron density on each ring atom as compared to that of a carbon atom in benzene. Examples of electron-rich systems include 5-membered heteroaryl groups having one heteroatom such as furan, pyrrole, and thiophene; and their benzofused counterparts such as benzofuran, benzopyrrole, and benzothiophene. Examples of electron-poor systems include 6-membered heteroaryl groups having one or more heteroatoms such as pyridine, pyrazine, pyridazine, and pyrimidine; as well as their benzofused counterparts such as quinoline, isoquinoline, quinoxaline, cinnoline, phthalazine, naphthyridine, quinazoline, phenanthridine, acridine, and purine. Mixed heteroaromatic rings can belong to either class depending on the type, number, and position of the one or more heteroatom(s) in the ring. See Katritzky, A. R and Lagowski, J. M., *Heterocyclic Chemistry* (John Wiley & Sons, New York, 1960).

At various places in the present specification, substituents are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

Compounds described herein can contain an asymmetric atom (also referred as a chiral center) and some of the compounds can contain two or more asymmetric atoms or centers, which can thus give rise to optical isomers (enantiomers) and diastereomers (geometric isomers). The present teachings include such optical isomers and diastereomers, including their respective resolved enantiomerically or diastereomerically pure isomers (e.g., (+) or (−) stereoisomer) and their racemic mixtures, as well as other mixtures of the enantiomers and diastereomers. In some embodiments, optical isomers can be obtained in enantiomerically enriched or pure form by standard procedures known to those skilled in the art, which include, for example, chiral separation, diastereomeric salt formation, kinetic resolution, and asymmetric synthesis. The present teachings also encompass cis- and trans-isomers of compounds containing alkenyl moieties (e.g., alkenes, azo, and imines). It also should be understood that the compounds of the present teachings encompass all possible regioisomers in pure form and mixtures thereof. In some embodiments, the preparation of the present compounds can include separating such isomers using standard separation procedures known to those skilled in the art, for example, by using one or more of column chromatography, thin-layer chromatography, simulated moving-bed chromatography, and high-performance liquid chromatography. However, mixtures of regioisomers can be used similarly to the uses of each individual regioisomer of the present teachings as described herein and/or known by a skilled artisan.

It is specifically contemplated that the depiction of one regioisomer includes any other regioisomers and any regioisomeric mixtures unless specifically stated otherwise.

As used herein, a "leaving group" ("LG") refers to a charged or uncharged atom (or group of atoms) that can be displaced as a stable species as a result of, for example, a substitution or elimination reaction. Examples of leaving groups include, but are not limited to, halogen (e.g., Cl, Br, I), azide ($N_3$), thiocyanate (SCN), nitro ($NO_2$), cyanate (CN), water ($H_2O$), ammonia ($NH_3$), and sulfonate groups (e.g., $OSO_2$—R, wherein R can be a $C_{1-10}$ alkyl group or a $C_{6-14}$ aryl group each optionally substituted with 1-4 groups independently selected from a $C_{1-10}$ alkyl group and an electron-withdrawing group) such as tosylate (toluenesulfonate, OTs), mesylate (methanesulfonate, OMs), brosylate (p-bromobenzenesulfonate, OBs), nosylate (4-nitrobenzenesulfonate, ONs), and triflate (trifluoromethanesulfonate, OTf).

As used herein, a "p-type semiconductor material" or a "p-type semiconductor" refers to a semiconductor material having holes as the majority current or charge carriers. In some embodiments, when a p-type semiconductor material is deposited on a substrate, it can provide a hole mobility in excess of about $10^{-5}$ cm$^2$/Vs. In the case of field-effect devices, a p-type semiconductor can also exhibit a current on/off ratio of greater than about 10.

As used herein, an "n-type semiconductor material" or an "n-type semiconductor" refers to a semiconductor material having electrons as the majority current or charge carriers. In some embodiments, when an n-type semiconductor material is deposited on a substrate, it can provide an electron mobility in excess of about $10^{-5}$ cm$^2$/Vs. In the case of field-effect devices, an n-type semiconductor can also exhibit a current on/off ratio of greater than about 10.

As used herein, "mobility" refers to a measure of the velocity with which charge carriers, for example, holes (or units of positive charge) in the case of a p-type semiconductor material and electrons in the case of an n-type semiconductor material, move through the material under the influence of an electric field. This parameter, which depends on the device architecture, can be measured using a field-effect device or space-charge limited current measurements.

As used herein, fill factor (FF) is the ratio (given as a percentage) of the actual maximum obtainable power, ($P_m$ or $V_{mp}*J_{mp}$), to the theoretical (not actually obtainable) power, ($J_{sc} \times V_{oc}$). Accordingly, FF can be determined using the equation:

$$FF=(V_{mp}*J_{mp})/(J_{sc}*V_{oc})$$

where $J_{mp}$ and $V_{mp}$ represent the current density and voltage at the maximum power point ($P_m$), respectively, this point being obtained by varying the resistance in the circuit until J*V is at its greatest value; and $J_{sc}$ and $V_{oc}$ represent the short circuit current and the open circuit voltage, respectively. Fill factor is a key parameter in evaluating the performance of solar cells. Commercial solar cells typically have a fill factor of about 0.60% or greater.

As used herein, the open-circuit voltage ($V_{oc}$) is the difference in the electrical potentials between the anode and the cathode of a device when there is no external load connected.

As used herein, the power conversion efficiency (PCE) of a solar cell is the percentage of power converted from absorbed light to electrical energy. The PCE of a solar cell can be calculated by dividing the maximum power point ($P_m$) by the input light irradiance (E, in W/m$^2$) under standard test conditions (STC) and the surface area of the solar cell ($A_c$ in m$^2$). STC typically refers to a temperature of 25° C. and an irradiance of 1000 W/m$^2$ with an air mass 1.5 (AM 1.5) spectrum.

As used herein, a component (such as a thin film layer) can be considered "photoactive" if it contains one or more compounds that can absorb photons to produce excitons for the generation of a photocurrent.

As used herein, a compound can be considered "ambient stable" or "stable at ambient conditions" when the carrier mobility or the reduction-potential of the compound is maintained at about its initial measurement when the compound is exposed to ambient conditions, for example, air, ambient temperature, and humidity, over a period of time. For example, a compound can be described as ambient stable if its carrier mobility or reduction potential does not vary more than 20% or more than 10% from its initial value after exposure to ambient conditions, including, air, humidity and temperature, over a 3 day, 5 day, or 10 day period.

As used herein, "solution-processable" refers to compounds (e.g., polymers), materials, or compositions that can be used in various solution-phase processes including spin-coating, printing (e.g., inkjet printing, screen printing, pad printing, offset printing, gravure printing, flexographic printing, lithographic printing, mass-printing and the like), spray coating, electrospray coating, drop casting, dip coating, and blade coating.

Throughout the specification, structures may or may not be presented with chemical names. Where any question arises as to nomenclature, the structure prevails.

The present teachings relate to compounds having one or more phthalimide units and/or one or more head-to-head (H-H) substituted biheteroaryl units, as well as the use of these compounds in electronic, optoelectronic, or optical devices. More specifically, the present compounds can be employed either by themselves or along with other inorganic or organic materials as a semiconductor component in various electronic, optoelectronic, or optical devices, where the semiconductor component is capable of exhibiting a charge carrier mobility (µ) of $10^{-5}$ cm$^2$/V-sec or greater and a current on/off ratio ($I_{on}/I_{off}$) of 10 or greater.

Accordingly, in one aspect, the present teachings relate to phthalimide-based monomeric, oligomeric, and polymeric compounds. More specifically, these compounds can include one or more optionally substituted phthalimide 3,6-diyl units that can be identical or different, and independently can have the formula:

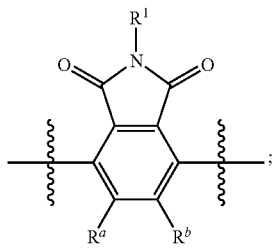

where $R^1$, $R^a$ and $R^b$, at each occurrence, independently can be H or a substitution group which can impart desirable properties to the compound as a whole. For example, certain substitution groups including one or more electron-withdrawing or electron-donating moieties can modulate the electronic properties of the compound, while substitution groups that include one or more aliphatic chains can improve the solubility of the compound in organic solvents.

Accordingly, in certain embodiments, the present compounds can include one or more N-substituted phthalimide 3,6-diyl units. For example, the present compounds can include one or more N-alkyl substituted phthalimide 3,6-diyl units, that is, $R^1$ can be a linear or branched $C_{1-40}$ alkyl group, examples of which include an n-hexyl group, an n-octyl group, an n-undecyl group, an n-dodecyl group, a 1-methylpropyl group, a 1-methylbutyl group, a 1-methylpentyl group, a 1-methylhexyl group, a 1,3-dimethylbutyl group, a 1-ethylpropyl group, a 1-ethylbutyl group, a 2-ethylhexyl group, a 2-hexyloctyl group, a 2-octyldodecyl group, and a 2-decyltetradecyl group. For example, $R^1$ can be a branched alkyl group selected from:

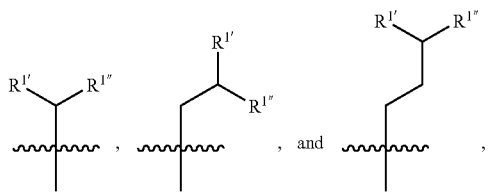

where $R^{1''}$ and $R^{1'''}$, independently are a linear $C_{1-20}$ alkyl group. In certain embodiments, $R^1$ can be a linear or branched $C_{2-40}$ alkenyl group (such as the linear or branched $C_{1-40}$ alkyl groups specified above but with one or more —$CH_2CH_2$— groups replaced by —CH=CH— groups). In certain embodiments, $R^1$ can be a linear or branched $C_{1-40}$ haloalkyl group (such as the linear or branched $C_{1-40}$ alkyl groups specified above but with one or more hydrogen atoms replaced by halogen atoms such as F).

In certain embodiments, $R^1$, at each occurrence, can be a moiety including a $C_{1-40}$ alkyl group, a $C_{2-40}$ alkenyl group, or a $C_{1-40}$ haloalkyl group. For example, $R^1$ can be a linear or branched $C_{3-40}$ alkyl or alkenyl group, an arylalkyl group (e.g., a benzyl group) substituted with a linear or branched $C_{3-40}$ alkyl or alkenyl group, an aryl group (e.g., a phenyl group) substituted with a linear or branched $C_{3-40}$ alkyl or alkenyl group, or a biaryl group (e.g., a biphenyl group) substituted with a linear or branched $C_{3-40}$ alkyl or alkenyl group, wherein each of these groups optionally can be substituted with 1-5 halo groups (e.g., F). In some embodiments, $R^1$ can be a biaryl group wherein the two aryl groups are covalently linked via a linker. For example, the linker can be a divalent $C_{1-40}$ alkyl group wherein one or more non-adjacent $CH_2$ groups optionally can be replaced by —O—, —S—, or —Se—, provided that O, S, and/or Se atoms are not linked directly to one another. The linker can include other heteroatoms and/or functional groups as described herein.

More generally, $R^1$, at each occurrence, independently can be selected from H, a $C_{1-40}$ alkyl group, a $C_{2-40}$ alkenyl group, a $C_{2-40}$ alkynyl group, a $C_{1-40}$ haloalkyl group, and 1-4 cyclic moieties, wherein:

each of the $C_{1-40}$ alkyl group, the $C_{2-40}$ alkenyl group, the $C_{2-40}$ alkynyl group, and the $C_{1-40}$ haloalkyl group optionally can be substituted with 1-10 substituents independently selected from a halogen, —CN, $NO_2$, OH, —$NH_2$, —NH($C_{1-20}$ alkyl), —N($C_{1-20}$ alkyl)$_2$, —S(O)$_2$OH, —CHO, —C(O)—$C_{1-20}$ alkyl, —C(O)OH, —C(O)—O$C_{1-20}$ alkyl, —C(O)$NH_2$, —C(O)NH—$C_{1-20}$ alkyl, —C(O)N($C_{1-20}$ alkyl)$_2$, —O$C_{1-20}$ alkyl, —$SiH_3$, —SiH($C_{1-20}$ alkyl)$_2$, —$SiH_2$($C_{1-20}$ alkyl), and —Si($C_{1-20}$ alkyl)$_3$;

one or more —$CH_2$— groups in the $C_{1-40}$ alkyl group, the $C_{2-40}$ alkenyl group, the $C_{2-40}$ alkynyl group, and the $C_{1-40}$ haloalkyl group optionally can be replaced by a Functional group such as —O—, —S—, —NH—, or —N($C_{1-6}$ alkyl)-; and each of the 1-4 cyclic moieties can be the same or different, can be covalently bonded to each other or the imide nitrogen via an optional linker, and can be optionally substituted with 1-5 substituents independently selected from a halogen, —CN, oxo, $NO_2$, OH, =C(CN)$_2$, —$NH_2$, —NH($C_{1-40}$ alkyl), —N($C_{1-40}$ alkyl)$_2$, S(O)$_2$OH, —CHO, —C(O)OH, —C(O)—$C_{1-40}$ alkyl, —C(O)—O$C_{1-40}$ alkyl, —C(O)$NH_2$, —C(O)NH—$C_{1-40}$ alkyl, —C(O)N($C_{1-40}$ alkyl)$_2$, —$SiH_3$, —SiH($C_{1-40}$ alkyl)$_2$, —$SiH_2$($C_{1-40}$ alkyl), —Si($C_{1-40}$ alkyl)$_3$, —O—$C_{1-40}$ alkyl, a $C_{1-40}$ alkyl group, a $C_{2-40}$ alkenyl group, a $C_{2-40}$ alkynyl group, and a $C_{1-40}$ haloalkyl group; wherein each of the $C_{1-40}$ alkyl group, the $C_{2-40}$ alkenyl group, the $C_{2-40}$ alkynyl group, and the $C_{1-40}$ haloalkyl group optionally can be substituted with 1-5 substituents independently selected from a halogen, —CN, $NO_2$, OH, —$NH_2$, —NH($C_{1-6}$ alkyl), —N($C_{1-6}$ alkyl)$_2$, —S(O)$_2$OH, —CHO, —C(O)—$C_{1-6}$ alkyl, —C(O)OH, —C(O)—O$C_{1-6}$ alkyl, —C(O)$NH_2$, —C(O)NH—$C_{1-6}$ alkyl, —C(O)N($C_{1-6}$ alkyl)$_2$, —O$C_{1-6}$ alkyl, —$SiH_3$, —SiH($C_{1-6}$ alkyl)$_2$, —$SiH_2$ ($C_{1-6}$ alkyl), and —Si($C_{1-6}$ alkyl)$_3$.

For example, where $R^1$ includes one, two, three, or four cyclic moieties, one or more cyclic moieties (for example, the terminal cyclic moiety) can be substituted with a $C_{1-40}$ alkyl group, a $C_{2-40}$ alkenyl group, a $C_{2-40}$ alkynyl group, or a $C_{1-40}$ haloalkyl group. In addition, where $R^1$ includes two, three, or four cyclic moieties, the cyclic moieties can be covalently bonded to each other via an optional linker L, where L can be a divalent $C_{1-20}$ alkyl group, a divalent $C_{1-20}$ haloalkyl group, or a divalent functional group such as —Y—O—Y—, —Y—S—Y—, —Y—S(O)—Y—, —Y—S(O)$_2$—Y—, —Y—C(O)—Y—, —Y—[NR$^c$C(O)]—Y—, —Y—NR$^c$—Y—, —Y—[SiR$^c{}_2$]—Y—, where Y, at each occurrence, independently is selected from a divalent $C_{1-20}$ alkyl group, a divalent $C_{2-20}$ alkenyl group, a divalent $C_{2-20}$ haloalkyl group, and a covalent bond; and R$^c$, at each occurrence, independently is selected from H, a $C_{1-6}$ alkyl group, a $C_{6-14}$ aryl group, and a —$C_{1-6}$ alkyl-$C_{6-14}$ aryl group.

To further illustrate, in various embodiments, $R^1$, at each occurrence, independently can be selected from H, a $C_{1-40}$ alkyl group, a $C_{2-40}$ alkenyl group, a $C_{1-40}$ haloalkyl group, and a moiety (e.g., an aryl group) comprising a $C_{1-40}$ alkyl group, a $C_{2-40}$ alkenyl group, or a $C_{1-40}$ haloalkyl group. In some embodiments, $R^1$, at each occurrence, independently can be selected from a $C_{3-40}$ alkyl group, a $C_{4-40}$ alkenyl group, and a $C_{3-40}$ haloalkyl group, where each of these groups can be linear or branched. In certain embodiments, $R^1$, at each occurrence, independently can be selected from a $C_{6-40}$ alkyl group, a $C_{6-40}$ alkenyl group, and a $C_{6-40}$ haloalkyl group, each of which can be linear or branched. In particular embodiments, $R^1$, at each occurrence, independently can be a $C_{6-40}$ alkyl group or a $C_{6-40}$ haloalkyl group, which can be either linear or branched.

Further examples of $R^1$ include:

1) linear or branched $C_{1-40}$ alkyl groups and $C_{2-40}$ alkenyl groups such as:

n-hexyl, n-dodecyl, 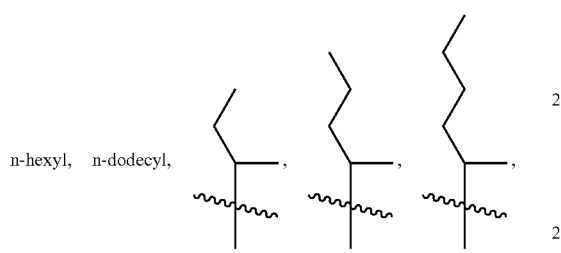

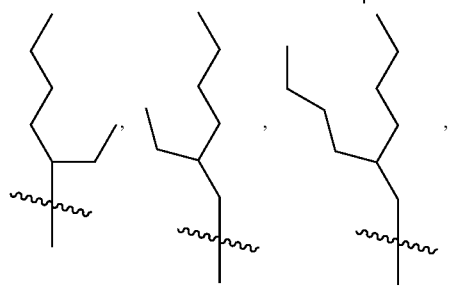

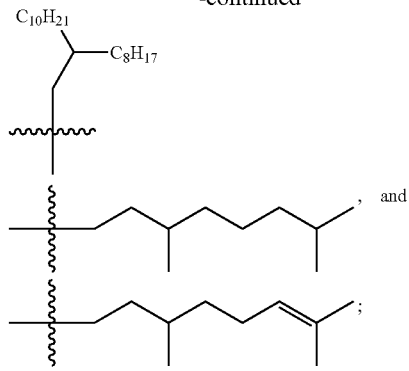

2) optionally substituted cycloalkyl groups such as:

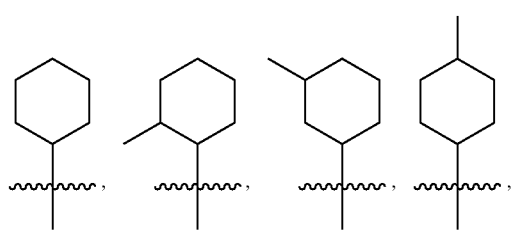

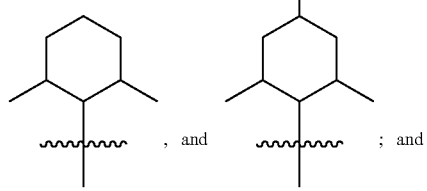

; and 3) optionally substituted aryl groups, arylalkyl groups, biaryl groups, biarylalkyl groups such as:

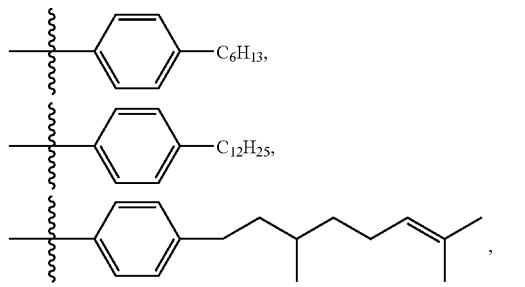

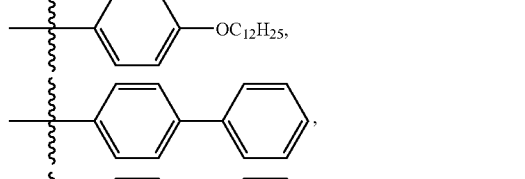

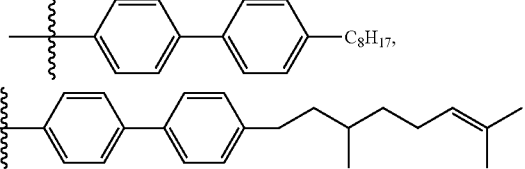

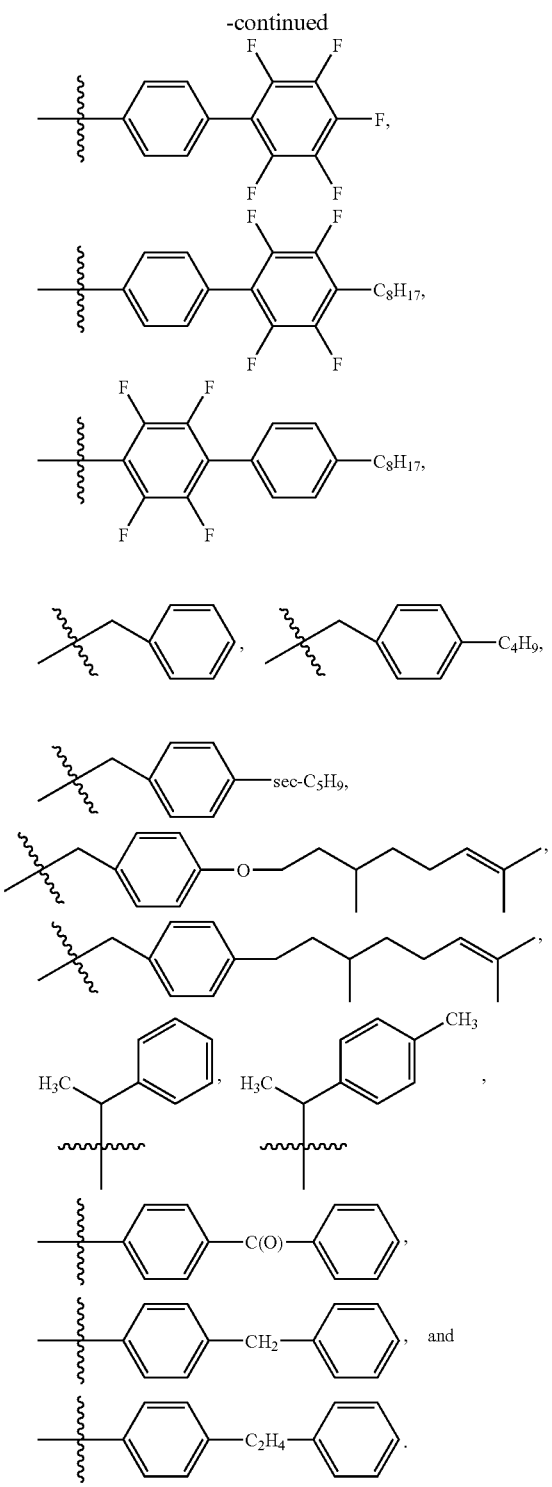

In addition to or in place of functionalization of the imide nitrogen atom, the phthalimide 3,6-diyl units in the present compounds can be substituted at the C4 and/or C5 positions. Accordingly, $R^a$ and/or $R^b$ independently can be a small functional group such as a halogen (e.g. F or Cl) or —CN, or a solubilizing group such as a $C_{1-40}$ alkyl group, a $C_{2-40}$ alkenyl group, a $C_{1-40}$ haloalkyl group, a $C_{1-40}$ alkoxy group, or a $C_{1-40}$ alkylthio group. In other embodiments, both $R^a$ and $R^b$ can be H.

In some embodiments, the present compounds are monomeric compounds. For example, the monomeric compounds can have the formula:

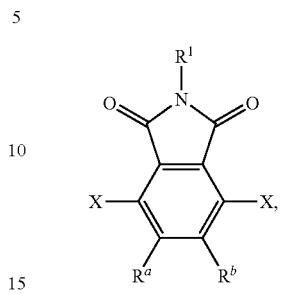

where X, at each occurrence, can be independently selected from H, a leaving group, a $C_{1-40}$ alkyl group, a $C_{2-40}$ alkenyl group, a $C_{2-40}$ alkynyl group, a $C_{1-40}$ haloalkyl group, a $C_{1-40}$ alkoxy group, and a $C_{1-40}$ alkylthio group; and $R^1$, $R^a$, and $R^b$ are as defined herein. In certain embodiments, X can be a polymerizable group that allows either self-polymerization of the present monomeric compounds into homopolymers or their co-polymerization with additional unit(s) into co-oligomers or co-polymers as described in more detailed hereinbelow. Such self-polymerization and co-polymerization can be effected via various polymerization schemes including metal-catalyzed coupling reactions known by those skilled in the art, such as Stille coupling, Suzuki coupling, Negishi coupling, Kumada coupling, and Yamamoto coupling. For example, X can be selected from a halogen (e.g., Cl, Br, I), a sulfonate group, an organotin moiety, and a boronic ester moiety.

Accordingly, in some embodiments, the present compounds are oligomeric or polymeric compounds including optionally substituted phthalimide 3,6-diyl units, where the phthalimide units form part of the backbone of the compounds (instead of being grafted to the backbone as pendant groups). For example, in certain embodiments, the oligomeric or polymeric compounds can include a repeating unit of the formula:

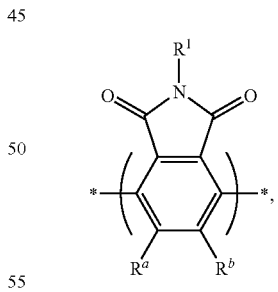

where $R^1$, $R^a$, and $R^b$ are as defined herein. The degree of polymerization (n) can be in the range of 2 to about 10,000. For example, for oligomeric compounds, the degree of polymerization can range from 2 to 9; and for polymeric compounds, the degree of polymerization can range from 10 to 10,000.

In various embodiments, the present monomeric, oligomeric, or polymeric compounds can include other units in addition to the one or more optionally substituted phthalimide 3,6-diyl units. Using $M^1$ to represent

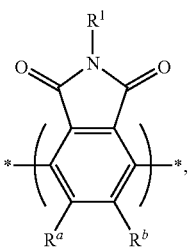

the present compounds can be a monomeric compound having, for example, a formula selected from:

X-M¹-Ar—X, X-M¹-[π-2]-X,

X-M¹-Ar—Ar—X, X-[π-2]-M¹-[π-2]-X,

X-M¹-Z—Ar—X, X-M¹-Z-[π-2]-X,

X—Ar-M¹-Ar—X, and X—Ar-M¹-Ar-[π-2]-X, where Ar, at each occurrence, independently can be an optionally substituted monocyclic moiety (e.g., a 5- or 6-membered aryl or heteroaryl group); Z, at each occurrence, independently can be a conjugated linear linker (which includes one or more unsaturated bonds); π-2, at each occurrence, independently can be an optionally substituted polycyclic moiety that is not an optionally substituted phthalimide 3,6-diyl unit; and X, at each occurrence, independently can be selected from H, a $C_{1-40}$ alkyl group, a $C_{2-40}$ alkenyl group, a $C_{2-40}$ alkynyl group, a $C_{1-40}$ haloalkyl group, a $C_{1-40}$ alkoxy group, a $C_{1-40}$ alkylthio group, and various reactive or polymerizable groups (e.g., a halogen, a sulfonate group, an organotin moiety, a boronic ester moiety etc.) as described herein.

In various embodiments, the present compounds can include homopolymers of an optionally substituted phthalimide 3,6-diyl unit, co-oligomers or co-polymers of two different optionally substituted phthalimide 3,6-diyl units, and co-oligomers or co-polymers of at least one repeating unit that includes an optionally substituted phthalimide 3,6-diyl unit and at least one other repeating unit that does not includes an optionally substituted phthalimide 3,6-diyl unit.

Accordingly, certain oligomeric and polymeric compounds of the present teachings can be represented by the formula:

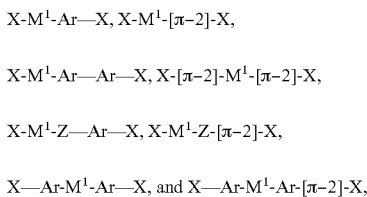

wherein:
M¹, at each occurrence, independently is

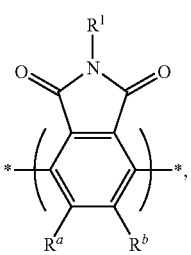

wherein:

R¹ is selected from H, a $C_{1-40}$ alkyl group, a $C_{2-40}$ alkenyl group, and a $C_{1-40}$ haloalkyl group; and $R^a$ and $R^b$ independently are selected from H, a halogen, CN, a $C_{1-40}$ alkyl group, a $C_{2-40}$ alkenyl group, a $C_{1-40}$ haloalkyl group, a $C_{1-40}$ alkoxy group, or a $C_{1-40}$ alkylthio group;

M², at each occurrence, independently is a repeating unit that includes at least one of Ar, Z, and π-2, wherein:
Ar, at each occurrence, independently is an optionally substituted monocyclic moiety;

Z, at each occurrence, independently is a conjugated linear linker including one or more unsaturated bonds; and π-2, at each occurrence, independently is an optionally substituted polycyclic moiety;

x is a real number representing the mole fraction of M¹;
y is a real number representing the mole fraction of M²;
wherein 0<x≤1.0, 0≤y<1.0, and x+y~1; and
n is an integer the range of 2 to 10,000.

In certain embodiments, the present compounds can be co-oligomers or co-polymers of two different repeating units where at least one of such repeating units includes an optionally substituted phthalimide 3,6-diyl unit. In particular embodiments, such co-oligomers or co-polymers can include one or more repeating units M², where each M² independently can be:

where Ar, Z, and π-2 are as defined herein; as well as combinations of two or more of Ar, Z, and π-2 such as:

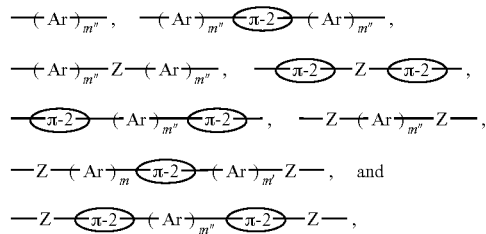

where m and m' independently are 0, 1, 2, 3, or 4; and m" is 1, 2, 3, or 4.

In certain embodiments, the present compounds can include two or more different repeating units and can be represented by the formula:

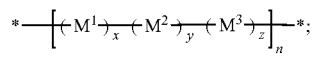

wherein:
M¹ is

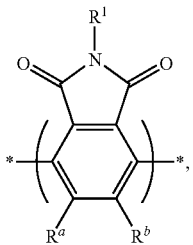

wherein R¹, Rᵃ, and Rᵇ are as defined herein;
M² and M³ are different repeating units each including at least one of Ar, Z, and π-2, wherein Ar, Z, and π-2 are as defined herein;
x is a real number representing the mole fraction of M¹;
y is a real number representing the mole fraction of M²;
z is a real number representing the mole fraction of M³;
wherein $0.02 \leq x \leq 0.98$, $0.02 \leq y \leq 0.98$, $0 \leq z \leq 0.50$, and $x+y+z \sim 1.00$; and
n is an integer the range of 2 to 10,000.

In the above formula, M² and optionally M³ can be repeated with the phthalimide units M¹ in a regular (e.g., alternating) or random manner. If at least one of M¹, M², and M³ is substituted, the polymer can be regioregular or regiorandom in terms of the orientation of the various units relative to each other. Without wishing to be bound by any particular theory, it is believed that the present polymeric compounds can retain desirable properties even when the mole fraction of the optionally substituted phthalimide units x varies from as low as 0.02 to 0.50 or greater. For example, the present compounds can include random copolymers having at least 0.02 mole percent of optionally substituted phthalimide 3,6-diyl units.

The pairing of the phthalimide unit and such one or more co-monomers, the imide position functionalization of the phthalimide unit, and any functionalization on the co-monomer(s) will be determined by the application of the polymeric compounds. For example, for electronic, optical, and optoelectronic devices, the composition of the polymeric compounds can be affected by one or more of the following considerations: 1) the electron-withdrawing capability for semiconductor processing in air and stable charge transport operation; 2) modulation of the majority carrier type depending on the electronic structure of the monomers; 3) regiochemistry of the polymerization possibly affording regioregular polymers; 4) the core planarity and linearity of the polymer chain; 5) the capability of additional functionalization of the π-conjugated core; 6) the potential for increased solubility of the polymer for solution processing; 7) achievement of strong π-π interactions/intermolecular electronic coupling; and 8) bandgap modulation via electron donor-acceptor coupling of electron-poor (acceptor) and electron-rich (donor) A-B or B-A repeating units.

In some embodiments, π-2 can be a polycyclic $C_{8-24}$ aryl group or a polycyclic 8-24 membered heteroaryl group, wherein each of these groups can be optionally substituted with 1-6 $R^d$ groups. Such one or more substitution groups $R^d$, at each occurrence, independently can be selected from:
a) halogen, b) —CN, c) —NO₂, d) —N(Rᵉ)₂, e) oxo, f) —OH, g) =C(Rᶠ)₂, h) —C(O)Rᵉ, i) —C(O)ORᵉ, j) —C(O)N(Rᵉ)₂, k) —SH, l) —S(O)₂—Rᵉ, m) —S(O)₂ORᵉ, n) —(OCH₂CH₂)ₜORᵉ, o) a $C_{1-40}$ alkyl group, p) a $C_{2-40}$ alkenyl group, q) a $C_{2-40}$ alkynyl group, r) a $C_{1-40}$ alkoxy group, s) a $C_{1-40}$ alkylthio group, t) a $C_{1-40}$ haloalkyl group, u) a —Y—$C_{3-10}$ cycloalkyl group, v) a —Y—$C_{6-14}$ aryl group, w) a —Y—$C_{6-14}$ haloaryl group, x) a —Y-3-12 membered cycloheteroalkyl group, and y) a —Y-5-14 membered heteroaryl group, wherein each of the $C_{1-40}$ alkyl group, the $C_{2-40}$ alkenyl group, the $C_{2-40}$ alkynyl group, the $C_{1-40}$ alkoxy group, the $C_{1-40}$ alkylthio group, the $C_{1-40}$ haloalkyl group, the $C_{3-10}$ cycloalkyl group, the $C_{6-14}$ aryl group, the $C_{6-14}$ haloaryl group, the 3-12 membered cycloheteroalkyl group, and the 5-14 membered heteroaryl group is optionally substituted with 1-4 $R^f$ groups;
Rᵉ, at each occurrence, independently can be selected from H, a $C_{1-40}$ alkyl group, and a —Y—$C_{6-14}$ aryl group;
Rᶠ, at each occurrence, independently can be selected from a) halogen, b) —CN, c) —NO₂, d) oxo, e) —OH, f) —NH₂, g) —NH($C_{1-20}$ alkyl), h) —N($C_{1-20}$ alkyl)₂, i) —N($C_{1-20}$ alkyl)-$C_{6-14}$ aryl, j) —N($C_{6-14}$ aryl)₂, k) —S(O)_wH, l) —S(O)_w—$C_{1-20}$ alkyl, m) —S(O)₂OH, n) —S(O)₂—O$C_{1-20}$ alkyl, o) —S(O)₂—O$C_{6-14}$ aryl, p) —CHO, q) —C(O)—$C_{1-20}$ alkyl, r) —C(O)—$C_{6-14}$ aryl, s) —C(O)OH, t) —C(O)—O$C_{1-20}$ alkyl, u) —C(O)—O$C_6$-14 aryl, v) —C(O)NH₂, w) —C(O)NH—$C_{1-20}$ alkyl, x) —C(O)N($C_{1-20}$ alkyl)₂, y) —C(O)NH—$C_{6-14}$ aryl, z) —C(O)N($C_{1-20}$ alkyl)-$C_{6-14}$ aryl, aa) —C(O)N($C_{6-14}$ aryl)₂, ab) —C(S)NH₂, ac) —C(S)NH—$C_{1-20}$ alkyl, ad) —C(S)N($C_{1-20}$ alkyl)₂, ae) —C(S)N($C_{6-14}$ aryl)₂, af) —C(S)N($C_{1-20}$ alkyl)-$C_{6-14}$ aryl, ag) —C(S)NH—$C_{6-14}$ aryl, ah) —S(O)_w NH₂, ai) —S(O)_wNH($C_{1-20}$ alkyl), aj) —S(O)_wN($C_{1-20}$ alkyl)₂, ak) —S(O)_wNH($C_{6-14}$ aryl), al) —S(O)_wN($C_{1-20}$ alkyl)-$C_{6-14}$ aryl, am) —S(O)_wN($C_{6-14}$ aryl)₂, an) —SiH₃, ao) —SiH($C_{1-20}$ alkyl)₂, ap) —SiH₂($C_{1-20}$ alkyl), aq) —Si($C_{1-20}$ alkyl)₃, ar) a $C_{1-20}$ alkyl group, as) a $C_{2-20}$ alkenyl group, at) a $C_{2-20}$ alkynyl group, au) a $C_{1-20}$ alkoxy group, av) a $C_{1-20}$ alkylthio group, aw) a $C_{1-20}$ haloalkyl group, ax) a $C_{3-10}$ cycloalkyl group, ay) a $C_{6-14}$ aryl group, az) a $C_{6-14}$ haloaryl group, ba) a 3-12 membered cycloheteroalkyl group, or bb) a 5-14 membered heteroaryl group;
Y, at each occurrence, independently can be selected from a divalent $C_{1-10}$ alkyl group, a divalent $C_{1-10}$ haloalkyl group, and a covalent bond;
t is 1, 2, 3, 4, 5, 6, 7, 8, 9 or 10; and
w, at each occurrence, is independently 0, 1, or 2.

For example, π-2 can have a planar and highly conjugated cyclic core which can be optionally substituted as disclosed herein. Examples of suitable cyclic cores include naphthalene, anthracene, tetracene, pentacene, perylene, pyrene, coronene, fluorene, indacene, indenofluorene, and tetraphenylene, as well as their analogs in which one or more carbon atoms can be replaced with a heteroatom such as O, S, Si, Se, N, or P. In certain embodiments, π-2 can include at least one electron-withdrawing group.

In certain embodiments, π-2 can include two or more (e.g., 2-4) fused rings where each ring can be a five-, six-, or seven-membered ring optionally substituted with 1-6 $R^d$ groups, wherein $R^d$ is as defined herein. For example, in the various embodiments described herein, $R^d$ can be an electron-withdrawing group such as a halogen, —CN, oxo, =C(Rᶠ)₂, a $C_{1-20}$ alkoxy group, a $C_{1-20}$ alkylthio group, or a $C_{1-20}$ haloalkyl group. In certain embodiments, $R^d$ can be a halogen (e.g., F, Cl, Br, or I), —CN, a $C_{1-6}$ alkoxy group, —OCF₃, or —CF₃. In particular embodiments, $R^d$ can be =O, —CN, =C(CN)₂, F, Cl, Br, or I.

In some embodiments, π-2 can include a monocyclic ring (e.g., a 1,3-dioxolane group or a derivative thereof including optional substituents and/or ring heteroatoms) covalently bonded to a second monocyclic ring or a polycyclic system via a spiroatom (e.g., a spiro carbon atom).

In some embodiments, π-2 can be selected from:

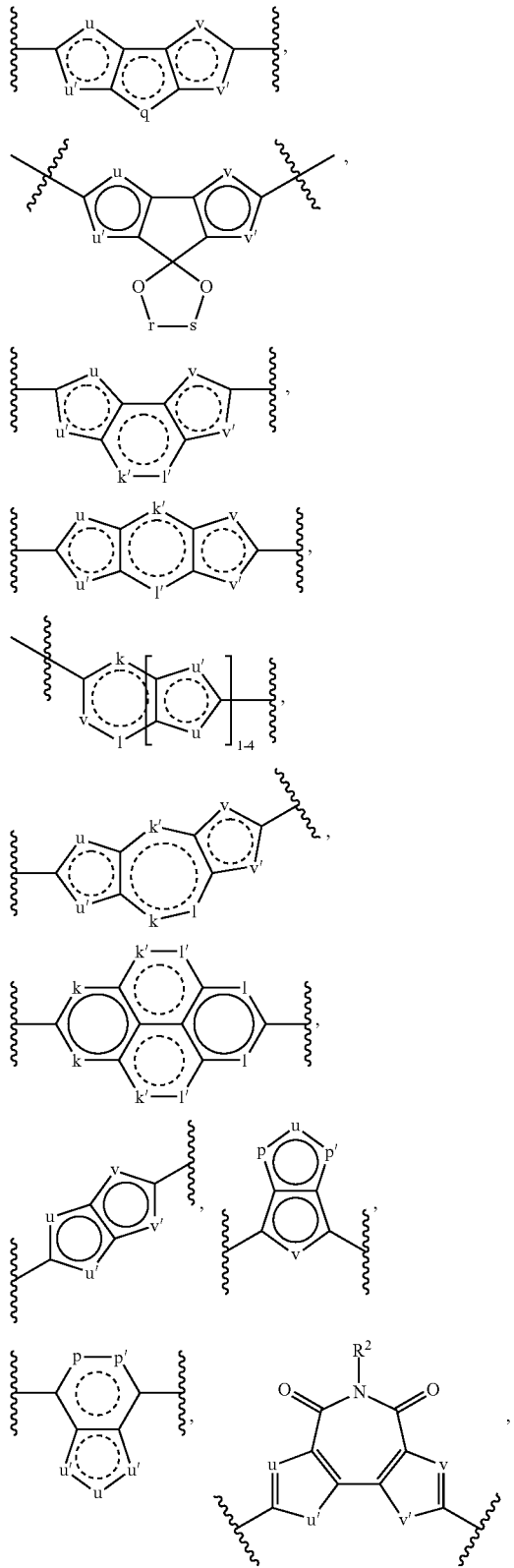

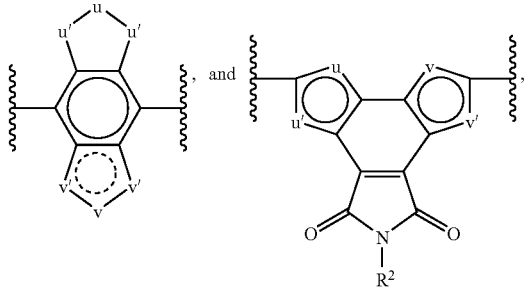

wherein:

k, k', l and l', at each occurrence, are independently selected from $-CR^2=$, $=CR^2-$, $-C(O)-$, and $-C(C(CN)_2)-$;

p, p', q and q', at each occurrence, are independently selected from $-CR^2=$, $=CR^2-$, $-C(O)-$, $-C(C(CN)_2)-$, $-O-$, $-S-$, $-N=$, $=N-$, $N(R^2)-$, $-SiR^2=$, $=SiR^2-$, and $-SiR^2R^2-$;

r and s, at each occurrence, are independently selected from $-CR^2R^2-$ or $-C(C(CN)_2)-$;

u, u', v and v', at each occurrence, are independently selected from $-CR^2=$, $=CR^2-$, $-C(O)-$, $-C(C(CN)_2)-$, $-S-$, $-S(O)-$, $-S(O)_2-$, $-O-$, $-N=$, $=N-$, $-SiR^2=$, $=SiR^2-$, $-SiR^2R^2-$, $-CR^2R^2-CR^2R^2-$, and $-CR^2=CR^2-$; and $R^2$, at each occurrence, independently is H or $R^d$, wherein $R^d$ is as defined herein.

In certain embodiments, π-2 can be selected from:

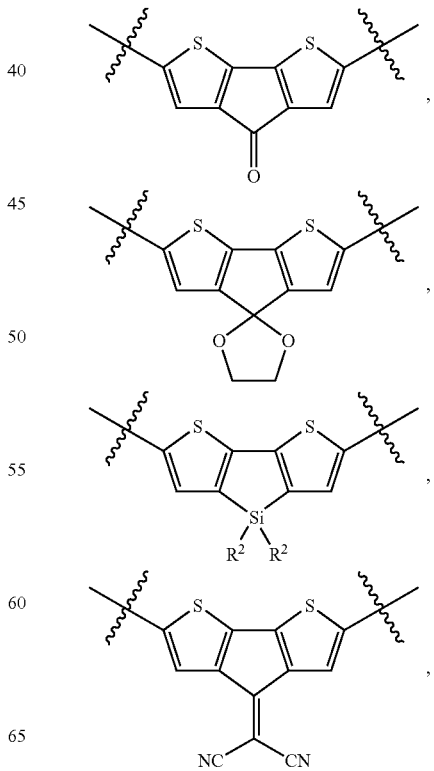

-continued
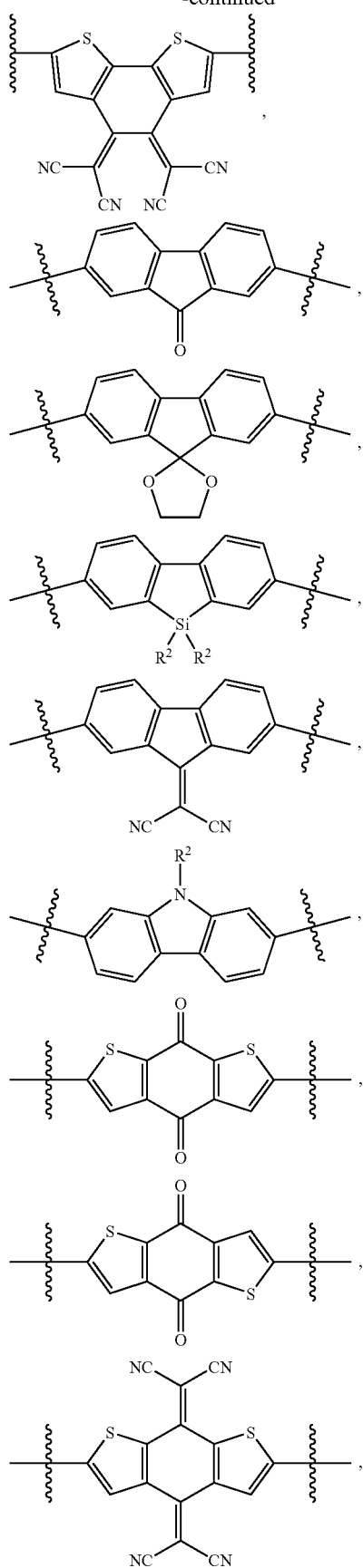
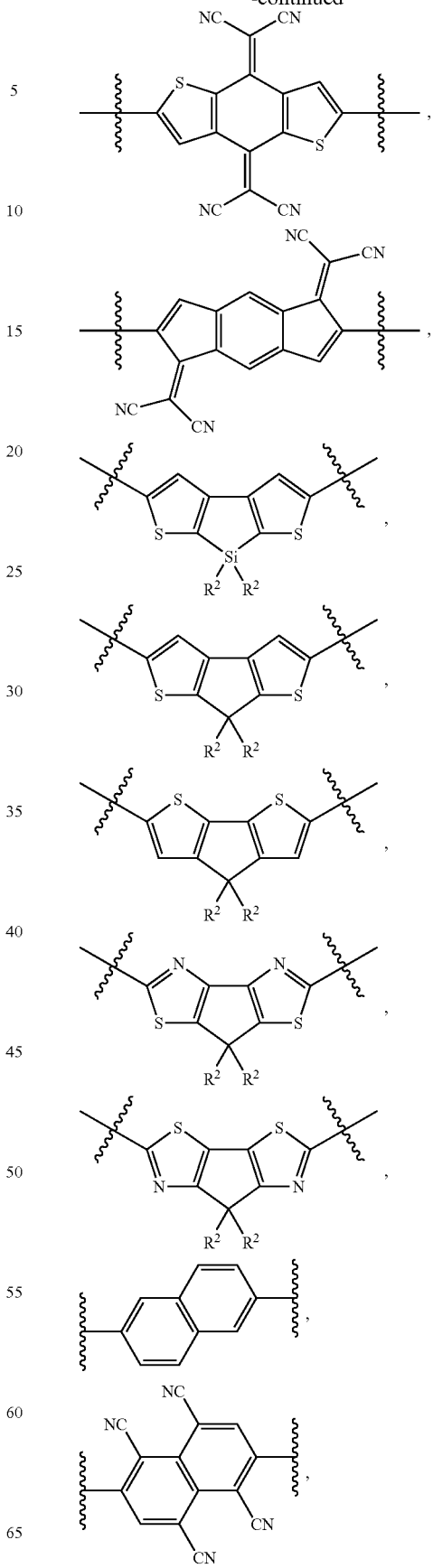

-continued
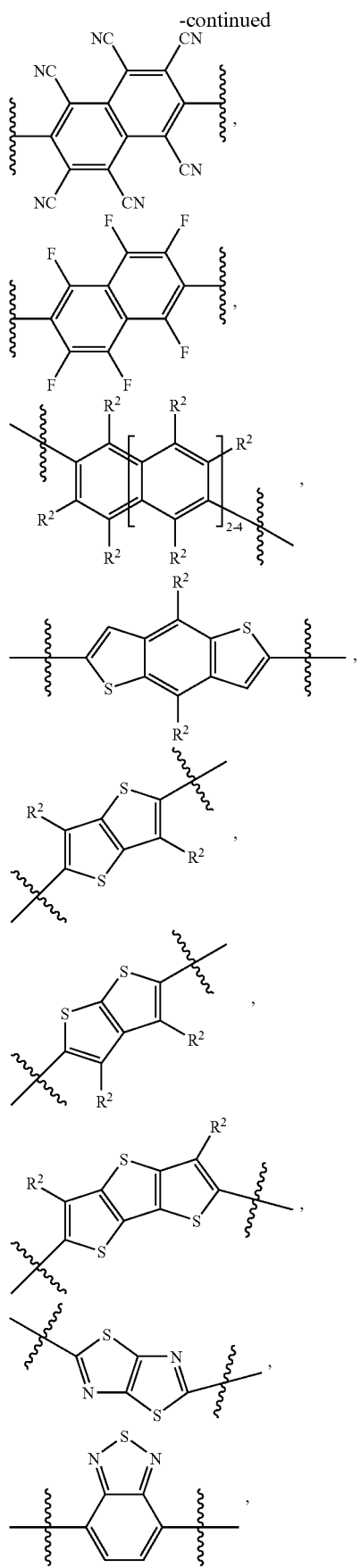
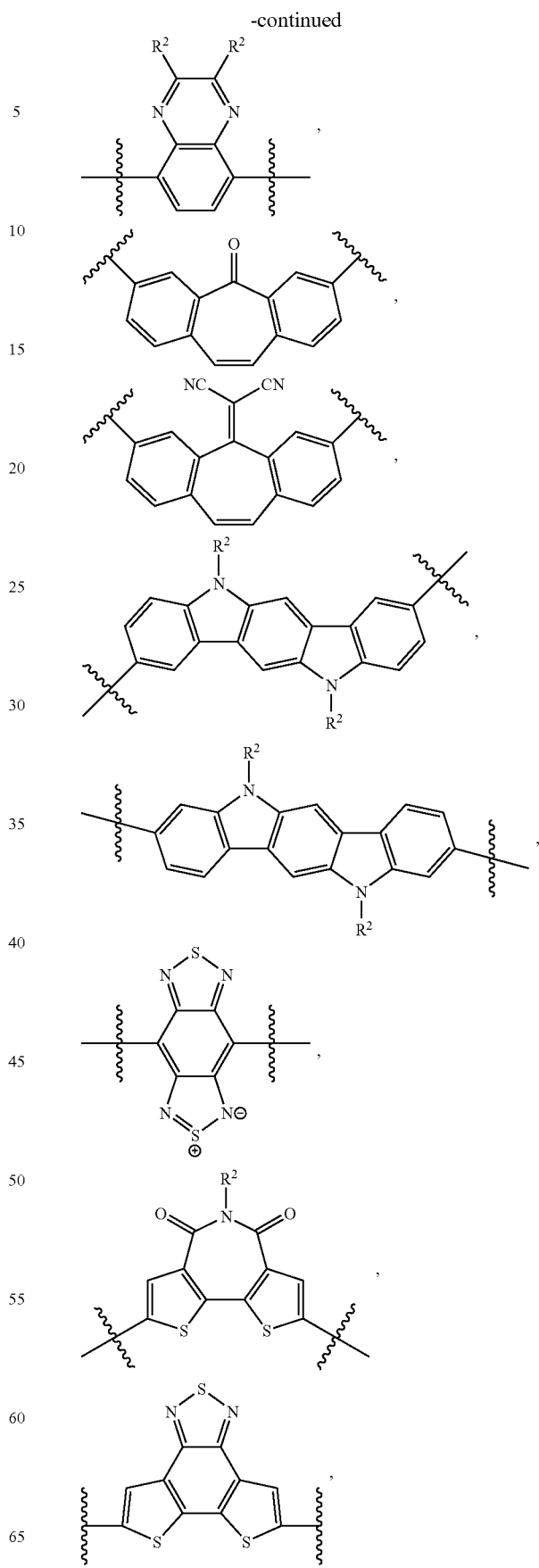

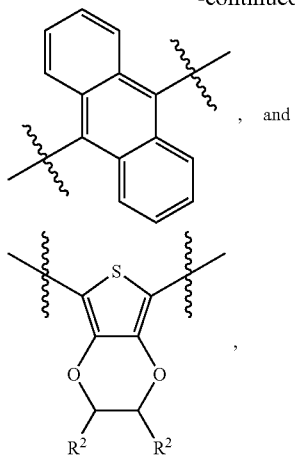

wherein R² is as defined herein. For example, R², at each occurrence, independently can be selected from H, a halogen (e.g. F or Cl), —CN, a $C_{1-40}$ alkyl group, a $C_{2-40}$ alkenyl group, a $C_{1-40}$ haloalkyl group, and a $C_{1-40}$ alkoxy group.

In various embodiments, Ar, at each occurrence, independently can be an optionally substituted monocyclic moiety selected from:

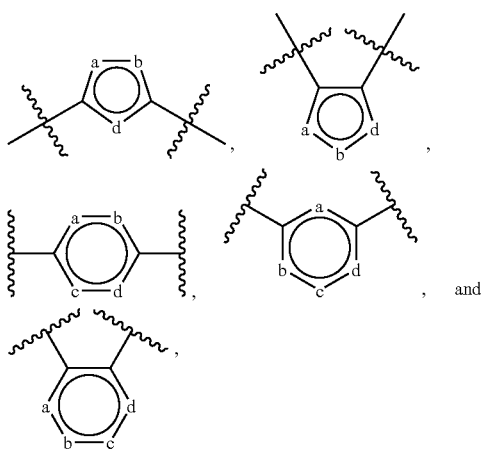

wherein:
a, b, c and d independently are selected from —O—, —S—, —Se—, —CH=, =CH—, —CR³=, =CR³—, —C(O)—, —C(C(CN)₂)—, —N=, =N—, —NH— and —NR³—;
R³, at each occurrence, is independently selected from a) halogen, b) —CN, c) —NO₂, d) —N(R$^e$)₂, e) —OH, f) —SH, g) —(OCH₂CH₂)$_t$OR$^e$, h) —C(O)R$^e$, i) —C(O)OR$^e$, j) —C(O)N(R$^e$)₂, k) a $C_{1-40}$ alkyl group, l) a $C_{2-40}$ alkenyl group, m) a $C_{2-40}$ alkynyl group, n) a $C_{1-40}$ alkoxy group, o) a $C_{1-40}$ alkylthio group, p) a $C_{1-40}$ haloalkyl group, q) a —Y—$C_{3-14}$ cycloalkyl group, r) a —Y—$C_{6-14}$ aryl group, s) a —Y-3-14 membered cycloheteroalkyl group, and t) a —Y-5-14 membered heteroaryl group, wherein each of the $C_{1-40}$ alkyl group, the $C_{2-40}$ alkenyl group, the $C_{2-40}$ alkynyl group, the $C_{1-40}$ alkoxy group, the $C_{1-40}$ alkylthio group, the $C_{1-40}$ haloalkyl group, the $C_{3-14}$ cycloalkyl group, the $C_{6-14}$ aryl group, the 3-14 membered cycloheteroalkyl group, and the 5-14 membered heteroaryl group optionally is substituted with 1-5 R$^f$ groups;

wherein R$^e$, R$^f$, Y and t are as defined herein.

In certain embodiments, each Ar independently can be an optionally substituted 5- or 6-membered aryl or heteroaryl group. For example, each Ar can be selected from a phenyl group, a thienyl group, a furyl group, a pyrrolyl group, an isothiazolyl group, a thiazolyl group, a 1,2,4-thiadiazolyl group, a 1,3,4-thiadiazolyl group, and a 1,2,5-thiadiazolyl group, wherein each group can be divalent or monovalent, and optionally can be substituted with 1-4 substituents independently selected from a halogen, —CN, an oxo group, a $C_{1-6}$ alkyl group, a $C_{1-6}$ alkoxy group, a $C_{1-6}$ haloalkyl group, NH₂, NH($C_{1-6}$ alkyl) and N($C_{1-6}$ alkyl)₂. In particular embodiments, each Ar can be selected from a thienyl group, an isothiazolyl group, a thiazolyl group, a 1,2,4-thiadiazolyl group, a 1,3,4-thiadiazolyl group, a 1,2,5-thiadiazolyl group, a phenyl group, and a pyrrolyl group, wherein each group optionally can be substituted with 1-2 substituents independently selected from a halogen, —CN, an oxo group, a $C_{1-6}$ alkyl group, a $C_{1-6}$ alkoxy group, a $C_{1-6}$ haloalkyl group, NH₂, NH($C_{1-6}$ alkyl) and N($C_{1-6}$ alkyl)₂. In some embodiments, Ar can be unsubstituted. In some embodiments, Ar can be a thienyl group, an isothiazolyl group, a thiazolyl group, a 1,2,4-thiadiazolyl group, a 1,3,4-thiadiazolyl group, and a 1,2,5-thiadiazolyl group, wherein each optionally is substituted with 1-2 $C_{1-6}$ alkyl groups.

By way of example, (Ar)$_m$, (Ar)$_{m'}$, and (Ar)$_{m''}$ can be selected from:

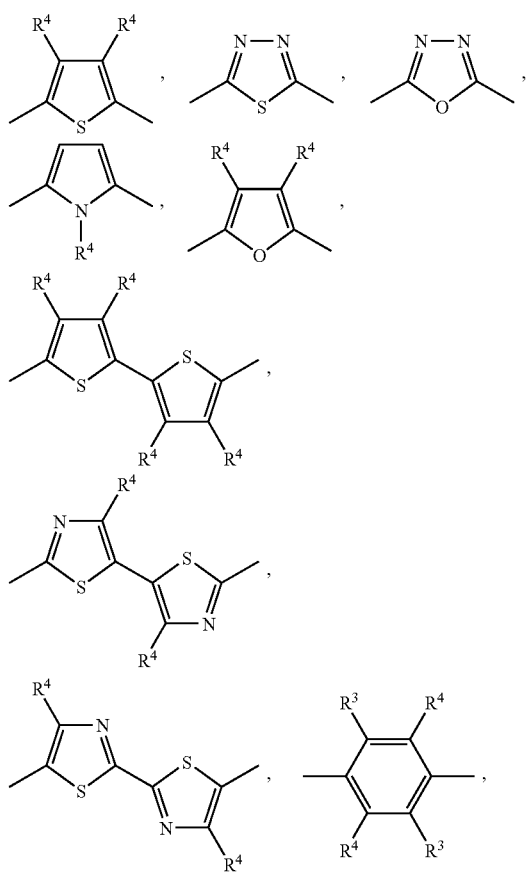

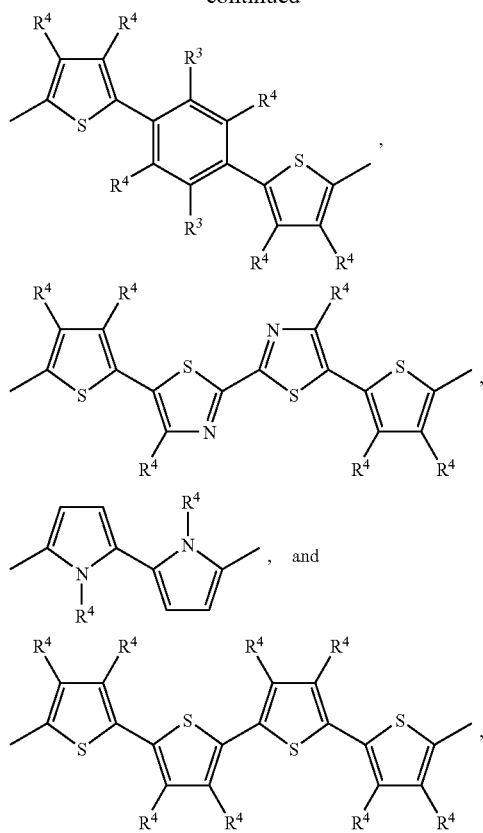

wherein $R^4$, at each occurrence, independently is H or $R^3$, and $R^3$ is as defined herein. In particular embodiments,

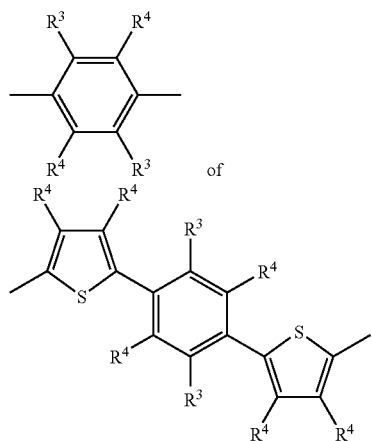

can be selected from:

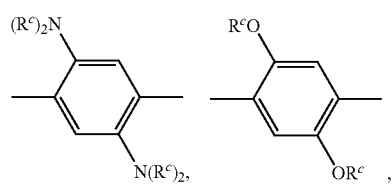

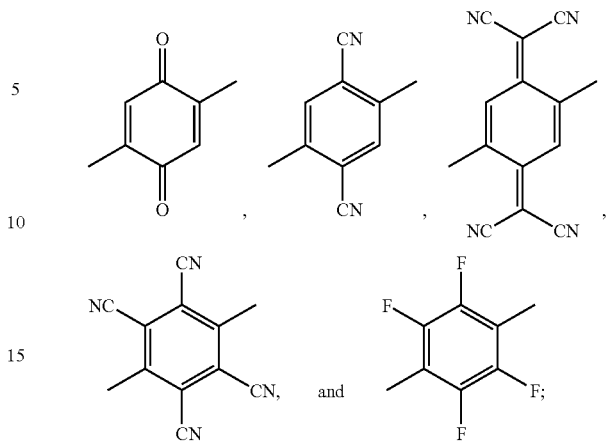

wherein $R^e$ is as defined herein.

In various embodiments, the linker Z can be a conjugated system by itself (e.g., including two or more double or triple bonds) or can form a conjugated system with its neighboring components. For example, in embodiments where Z is a linear linker, Z can be a divalent ethenyl group (i.e., having one double bond), a divalent ethynyl group (i.e., having one tripe bond), a $C_{4-40}$ alkenyl or alkynyl group that includes two or more conjugated double or triple bonds, or some other non-cyclic conjugated systems that can include heteroatoms such as Si, N, P, and the like. For example, Z can be selected from:

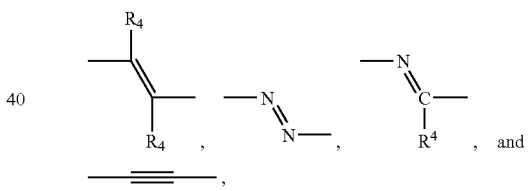

wherein $R^4$ is as defined herein. In certain embodiments, Z can be selected from:

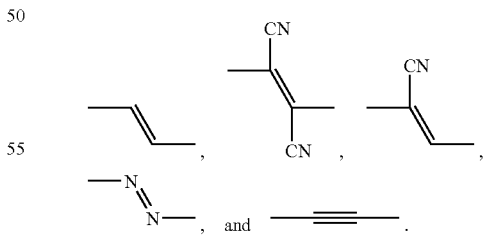

In some embodiments, $M^2$ and/or $M^3$ (if present) can include one or more 5-membered heteroaryl groups optionally substituted with 1-2 $R^3$ groups, wherein $R^3$, at each occurrence, independently is selected from a halogen, —CN, —(OCH$_2$CH$_2$)$_t$OR$^e$, a $C_{1-20}$ alkyl group, a $C_{1-20}$ alkoxy group, and a $C_{1-20}$ haloalkyl group, and $R^e$ and t are as defined herein. For example, $M^2$ and $M^3$ can be selected from:

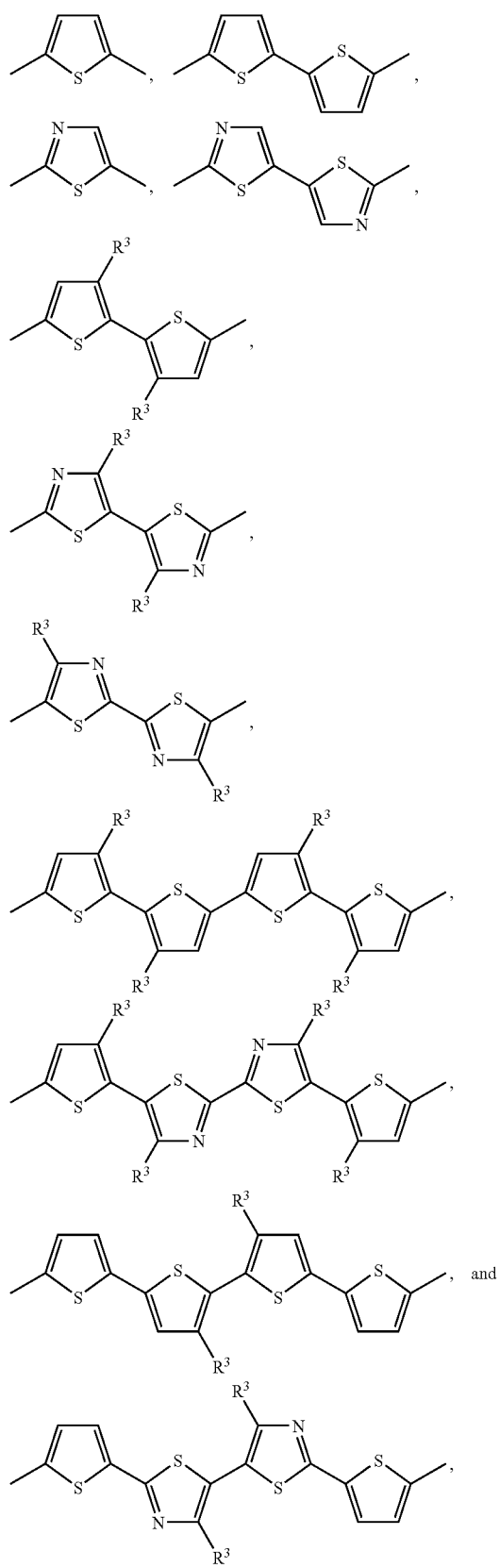

wherein $R^3$, at each occurrence, independently can be selected from a halogen, —CN, —(OCH$_2$CH$_2$)$_t$OR$^e$, a C$_{1-20}$ alkyl group, a C$_{1-20}$ alkoxy group, and a C$_{1-20}$ haloalkyl group, and R$^e$ and t are as defined herein. For example, R$^3$, at each occurrence, independently can be selected from a C$_{1-20}$ alkyl group and a C$_{1-20}$ alkoxy group.

In some embodiments, M$^2$ and/or M$^3$ can have the formula:

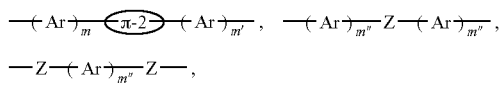

which can be selected from:

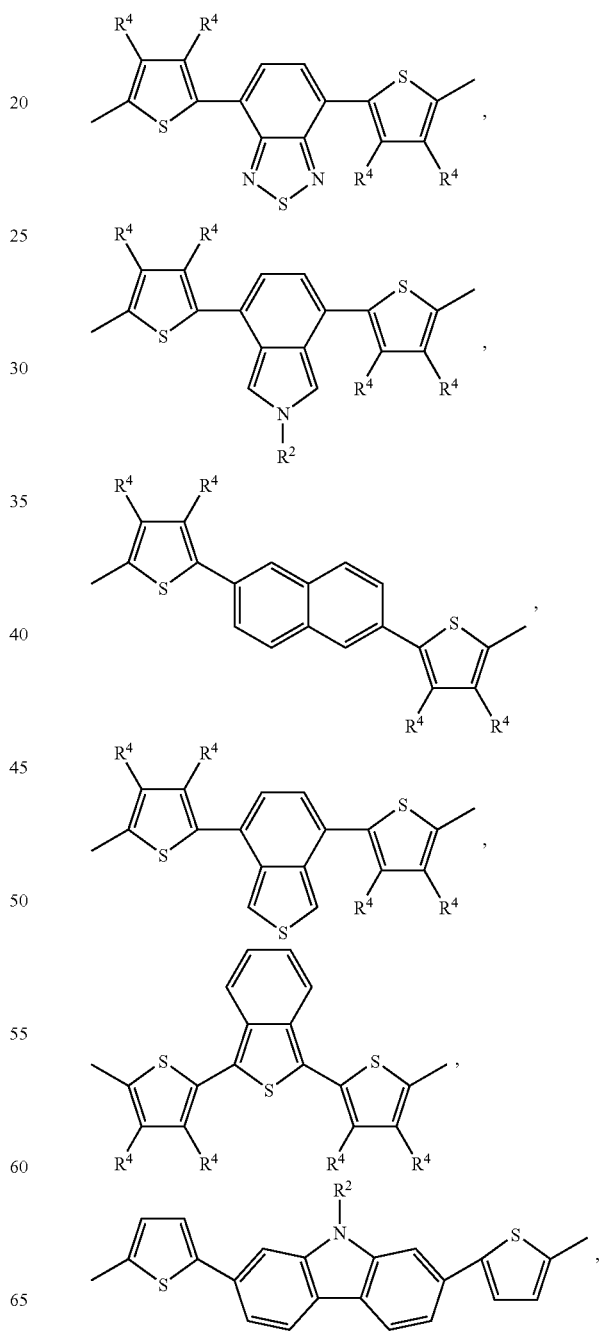

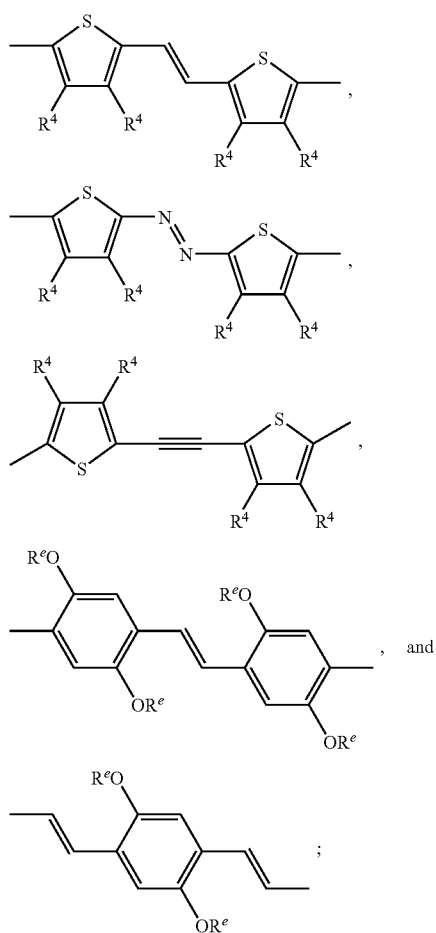

wherein:

$R^e$ is a $C_{1-20}$ alkyl group;

$R^2$ is selected from a $C_{1-20}$ alkyl group, a $C_{1-20}$ alkoxy group, and a $C_{1-20}$ haloalkyl group; and $R^4$, at each occurrence, is independently selected from H, a halogen, —CN, a $C_{1-20}$ alkyl group, a $C_{1-20}$ alkoxy group, a $C_{1-20}$ alkylthio group, and a $C_{1-20}$ haloalkyl group.

In some embodiments, $M^2$ and/or $M^3$ can be selected from:

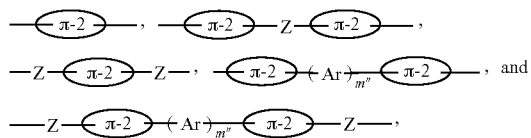

wherein π-2 is an optionally substituted $C_{8-24}$ aryl group or 8-24 membered heteroaryl group selected from:

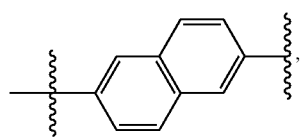

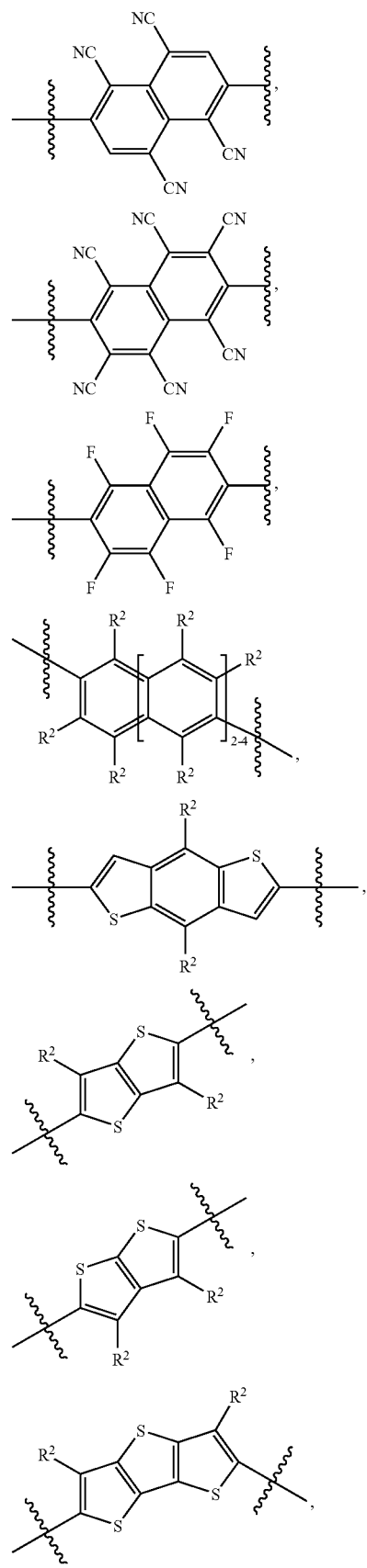

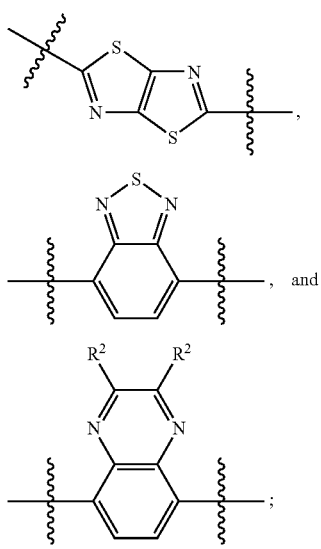

wherein $R^2$ is selected from H, a $C_{1-20}$ alkyl group, a $C_{1-20}$ alkoxy group, and a $C_{1-20}$ haloalkyl group; and Ar, Z, and m" are as defined herein.

Accordingly, the present compounds can include oligomers and polymers having a repeating unit selected from:

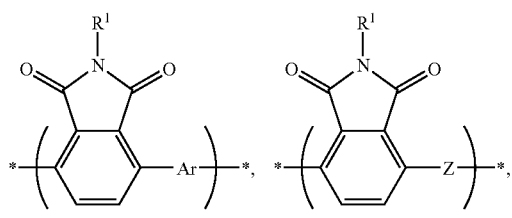

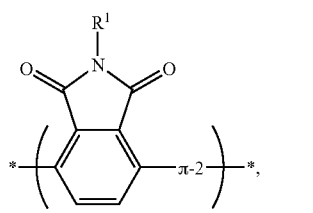

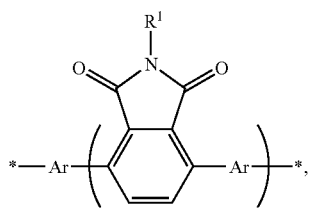

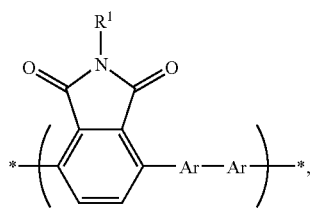

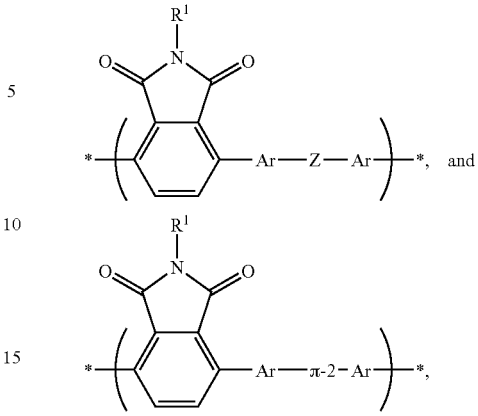

where $R^1$, Ar, Z, and π-2 are as defined herein.

In particular embodiments, the present teachings relate to monomeric, oligomeric or polymeric compounds that include one or more optionally substituted phthalimide 3,6-diyl units and one or more optionally substituted 5-membered heteroaryl groups (e.g., a thienyl group). For example, the one or more 5-membered heteroaryl groups can be optionally substituted with 1-2 $R^3$ groups, where $R^3$, at each occurrence, is independently selected from a halogen, —CN, —(OCH$_2$CF$_1$)$_{1-10}$—O—C$_{1-6}$ alkyl, a $C_{1-20}$ alkyl group, a $C_{1-20}$ alkoxy group, a $C_{1-20}$ alkylthio group, and a $C_{1-20}$ haloalkyl group. In particular embodiments, the present teachings relate to monomeric, oligomeric or polymeric compounds that include one or more optionally substituted phthalimide 3,6-diyl units and one or more aryl (e.g., a phenyl group) or heteroaryl (e.g., a thienyl group) groups substituted with at least one electron-donating group (e.g., an alkyl group, an alkoxy group, or an alkylthio group). In particular embodiments, the present teachings relate to monomeric, oligomeric or polymeric compounds that include one or more optionally substituted phthalimide 3,6-diyl units and one or more optionally substituted polycyclic conjugated moieties (e.g., a polycyclic aryl group including a thienyl group fused with one or more cyclic groups).

In particular embodiments, the present teachings relate to monomeric, oligomeric or polymeric compounds that include one or more optionally substituted phthalimide 3,6-diyl units and one or more optionally substituted biheteroaryl units. In particular embodiments, the one or more biheteroaryl units each comprise two 3-substituted heteroaryl units that are head-to-head (H-H) in orientation to each other. While semiconducting compounds reported in the literature have typically avoided H-H linkages due to the general belief that steric interactions will cause significant backbone torsion thereby precluding backbone planarity and disrupting packing, it has been found surprisingly that certain compounds having H-H disubstituted biheteroaryl linkages can exhibit extended conjugation and close intermolecular π-stacking.

Accordingly, in particular embodiments, the present teachings relate to monomeric, oligomeric or polymeric compounds that include one or more optionally substituted phthalimide 3,6-diyl units and one or more biheteroaryl units of the formula:

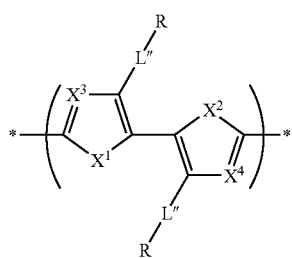

wherein:
L", at each occurrence, is independently selected from —CH$_2$— and —O—;
R, at each occurrence, is independently selected from a C$_{1-40}$ alkyl group, a C$_{2-40}$ alkenyl group, a C$_{2-40}$ alkynyl group, and a C$_{1-40}$ haloalkyl group, wherein one or more non-adjacent CH$_2$ groups independently are optionally replaced by —O—;
X$^1$ and X$^2$, at each occurrence, are independently selected from S, O, and Se; and
X$^3$ and X$^4$, at each occurrence, are independently selected from N, CH and CF.

For example, each of X$^1$ and X$^2$ in the above formula can be S, while L", R, X$^3$ and X$^4$ are as defined above and hereinbelow. Accordingly, the present teachings include monomeric, oligomeric or polymeric compounds including one or more units of the formula:

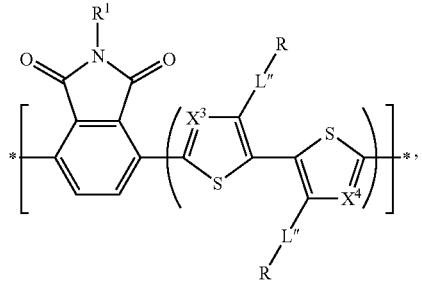

where L", R, R$^1$, X$^3$ and X$^4$ are as defined above and hereinbelow.

In particular embodiments, the present teachings include oligomers and polymers represented by:

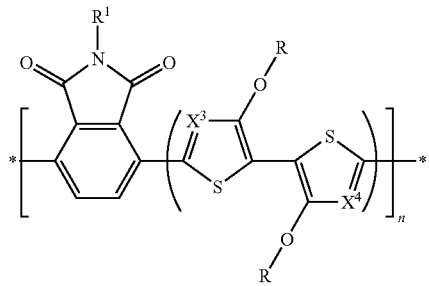

wherein R$^1$ is a linear or branched C$_{1-40}$ alkyl or haloalkyl group; R, at each occurrence, independently is a linear or branched C$_{1-40}$ alkyl or haloalkyl group; X$^3$ and X$^4$, independently are CH or N; and n is an integer in the range of 10 to 10,000. For example, R$^1$ and R independently can be an n-C$_{6-40}$ alkyl or haloalkyl group or a branched C$_{6-40}$ alkyl or haloalkyl group selected from

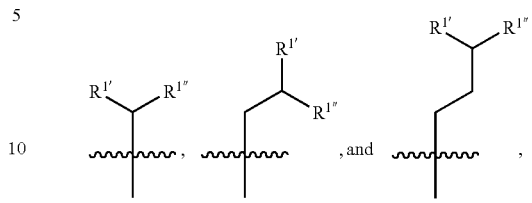

wherein R$^{1'}$ and R$^{1'''}$, independently are an n-C$_{1-20}$ alkyl or haloalkyl group.

To further illustrate, the present monomeric, oligomeric or polymeric compounds can include one or more optionally substituted phthalimide 3,6-diyl units and one or more units selected from:

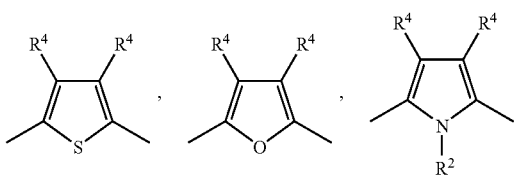

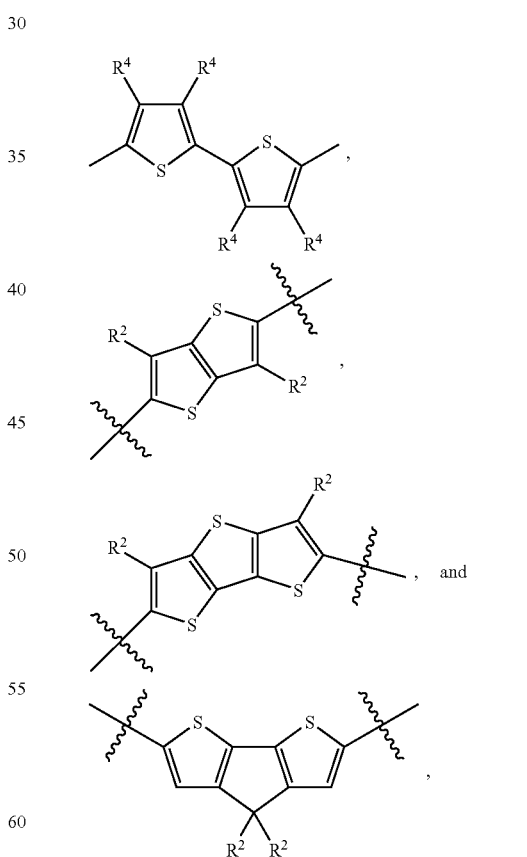

wherein R$^2$ and R$^4$, at each occurrence, are independently selected from H, a C$_{1-20}$ alkyl group, —(OCH$_2$CF$_2$)$_{1-10}$—O—C$_{1-6}$ alkyl, and a C$_{1-20}$ alkoxy group. For example, the one or more co-repeating units can be selected from:

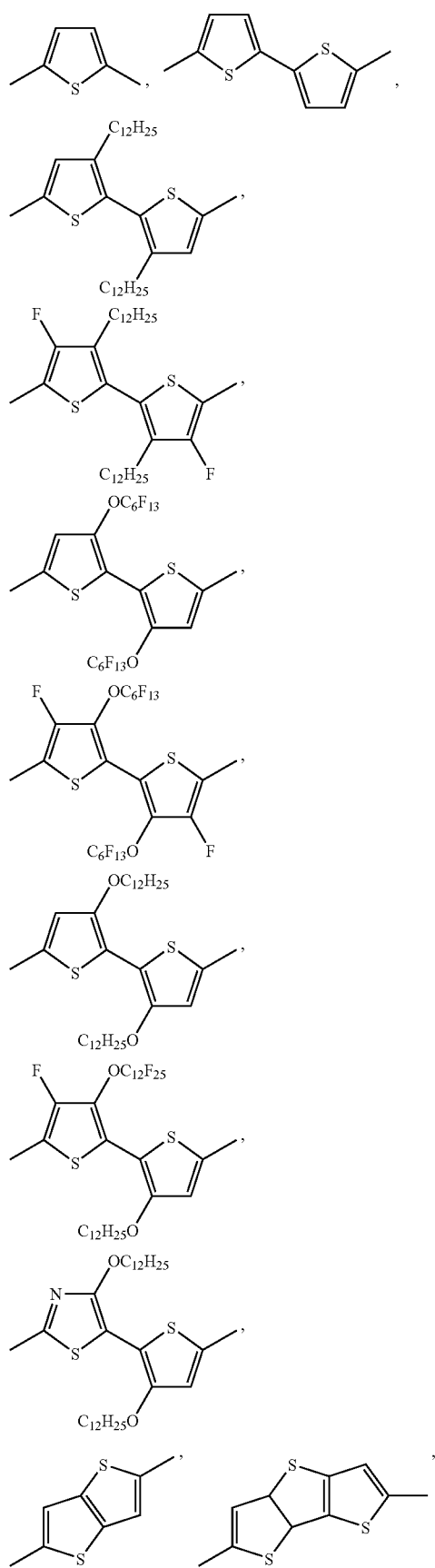
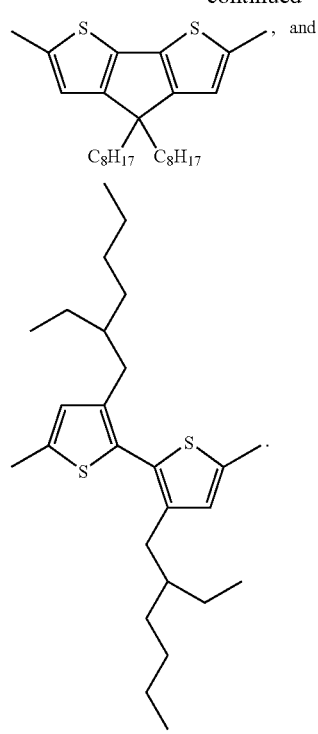
Exemplary compounds of the present teachings include those having one or more units selected from:
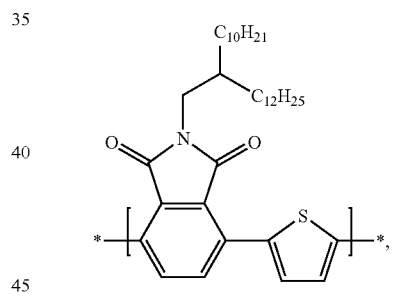
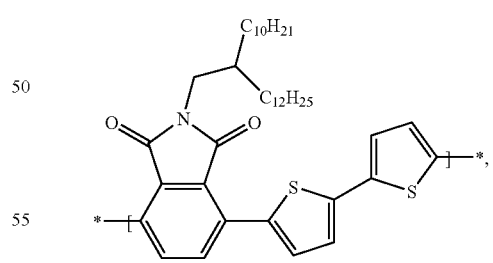
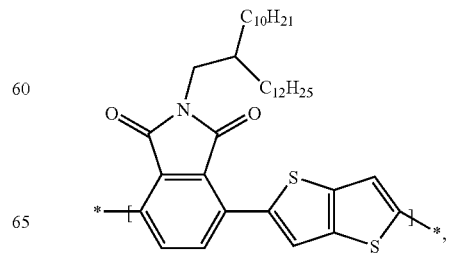

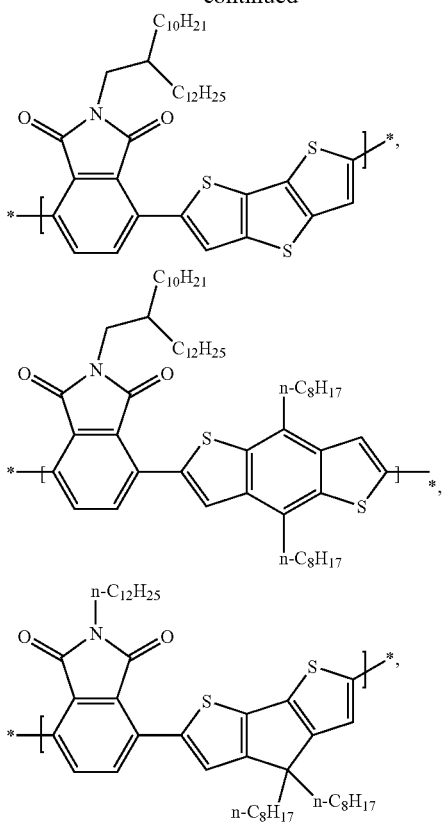

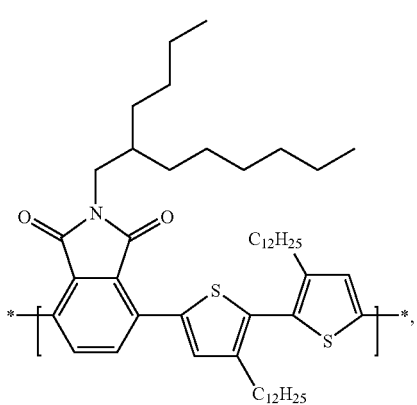

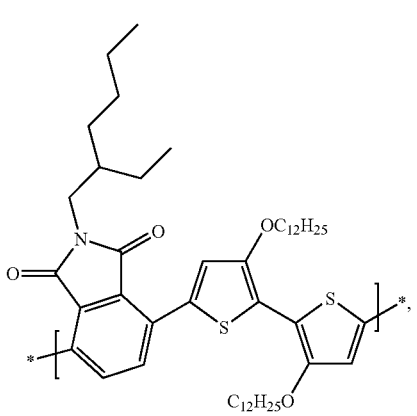

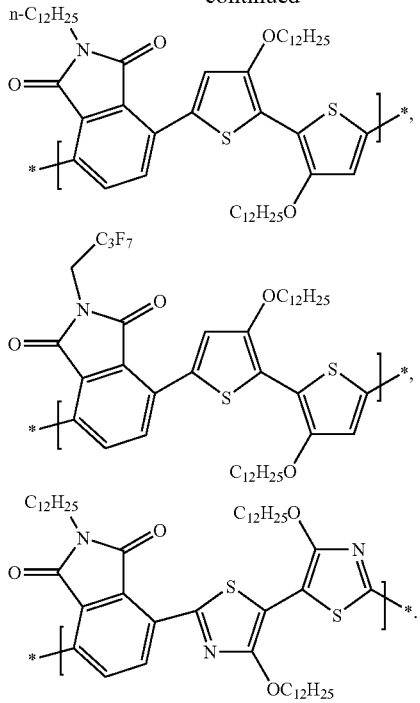

It should be understood that the present teachings can exclude certain polymers including N-substituted 3,6-phthalimide units. For example, the present teachings can exclude certain polymers where $M^2$ includes an unsubstituted phenyl group, a phenyl group substituted with one or more electron-withdrawing groups, or an unsubstituted pyridinyl group. In particular, the present teachings can exclude the following polymers:

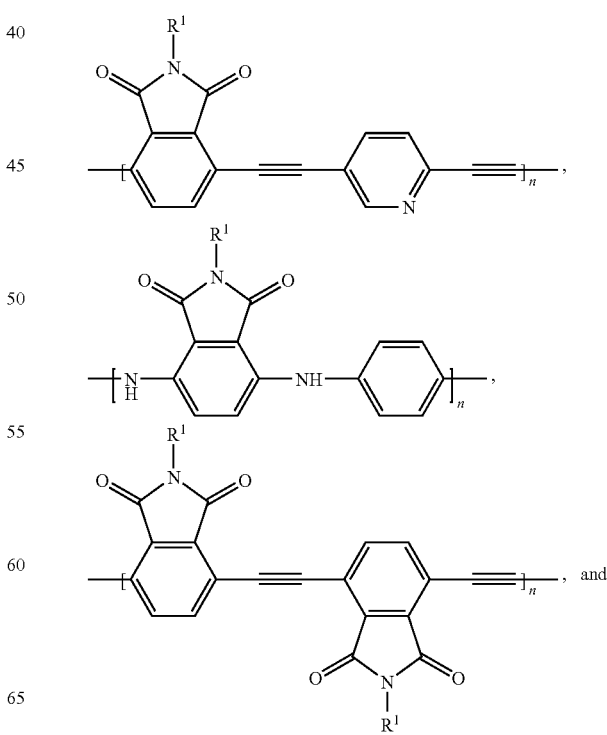

-continued

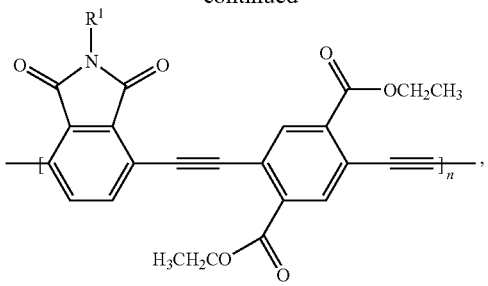

where $R^1$ is a $C_{1-20}$ alkyl group or a (2,6-diisopropyl)phenyl group.

Another aspect of the present teachings relates to monomeric, oligomeric, and polymeric compounds having one or more biheteroaryl units that are identical or different and have the formula:

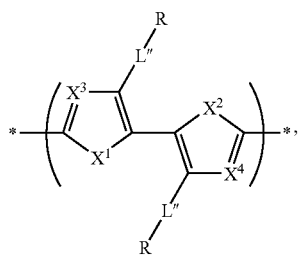

wherein:
L", at each occurrence, is independently selected from —CH₂— and —O—;
R, at each occurrence, independently is selected from a $C_{1-40}$ alkyl group, a $C_{2-40}$ alkenyl group, a $C_{2-40}$ alkynyl group, and a $C_{1-40}$ haloalkyl group, wherein optionally one or more non-adjacent CH₂ groups are replaced by —O—, provided that no two oxygen atoms are linked directly to one another;
$X^1$ and $X^2$, at each occurrence, are independently selected from S, O, and Se;
$X^3$ and $X^4$, at each occurrence, are independently selected from N, CH, and CF.

More specifically, the present teachings can relate to oligomeric and polymeric compounds including H-H substituted biheteroaryl units, where the oligomeric or polymeric compounds have a highest occupied molecular orbital energy (HOMO energy or $E_{HOMO}$) of less than about −4.8 eV (i.e., more negative than about −4.8 eV), for example, less than about −4.9 eV, or less than about −5.0 eV. For example, the present compounds can have an $E_{HOMO}$ between about −4.8 eV and about −7.0 eV.

As used herein, the highest occupied molecular orbital energy ($E_{HOMO}$ in eV) of a compound is calculated from its oxidation potential ($E_{ox}$ in V). Further, as used herein, the $E_{ox}$ of a compound is determined by cyclic voltammetry. Specifically, cyclic voltammetry measurements are performed on thin films of the semiconducting compound deposited on a working electrode using a 2% (w/w) toluene solution of the compound. All the measurements are carried out with a BAS-CV-50W voltammetric analyzer under a nitrogen atmosphere in a 0.1 M solution of tetra-n-butylammonium hexafluorophosphate in dry actonitrile as the supporting electrolyte. The supporting electrolyte solution is thoroughly purged with N₂ before the CV measurements. A platinum disk working electrode, a platinum wire counter electrode, and a silver wire reference electrode are employed and Fc/Fc⁺ is used as the reference for such measurements. A scan rate of 50 mV/S is used. The measured $E_{ox}$ value, and the corresponding $E_{HOMO}$ value, are further referenced based on the corresponding values of regioregular poly-3-hexylthiophene (rrP3HT). Specifically, the $E_{HOMO}$ of a compound (e.g., a polymer) reported herein is determined using the following equation:

$E_{HOMO}$(compound)=$E_{HOMO}$(rr-P3HT, based on CV, literature)−($E_{ox}$ compound−$E_{ox}$ rrP3HT)

For example, the $E_{HOMO}$ of rrP3HT is typically reported to be −4.9 eV, based on cyclic voltammetry measurements (see e.g., Osaka, I.; Zhang, R.; Sauve', G.; Smilgies, D.-M.; Kowalewski, T.; McCullogh, R. D. *J. Am. Chem. Soc.* 2009, 131, 2521-29). Therefore, the equation above becomes:

$E_{HOMO}$(compound)=−4.9 eV−($E_{ox}$ polymer−$E_{ox}$ rrP3HT)

Using the setup described above, the $E_{ox}$ of rrP3HT was determined to be +0.25 V vs. Fc/Fc⁺, and the $E_{ox}$ measured for polymer P2 was determined to be +0.34 V vs. Fc/Fc⁺. Therefore, $E_{HOMO}$ (P2)=−4.9−(0.34−0.25)=−4.99 eV. Such a 0.1 eV lowering of $E_{HOMO}$ relative to rrP3HT should be sufficient to improve the ambient stability of OFETs (see Ong, B. S.; Wu, Y.; Liu, P.; Gardner, S. *J. Am. Chem. Soc.* 2004, 126, 3378-79).

In certain embodiments, oligomeric and polymeric compounds according to the present teachings can have one or more biheteroaryl units of the formula:

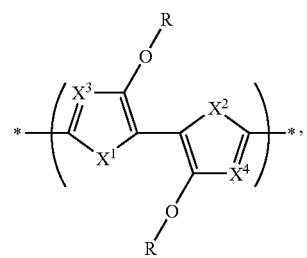

wherein $X^1$, $X^2$, $X^3$, $X^4$, and R are as defined herein.

In particular embodiments, oligomeric and polymeric compounds according to the present teachings can include H-H dialkoxy-substituted biheteroaryl units selected from:

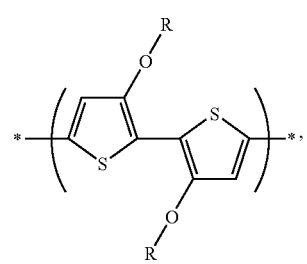

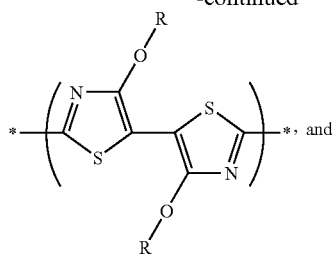

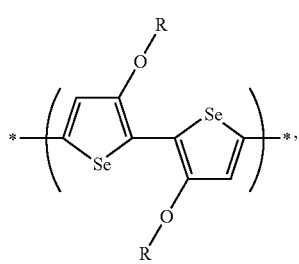

where R is an n-$C_{1-40}$ alkyl or haloalkyl group or a branched $C_{3-40}$ alkyl or haloalkyl group

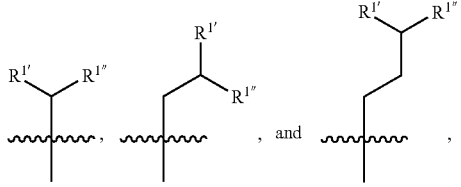

wherein $R^{1\prime}$ and $R^{1\prime\prime\prime}$, independently are an n-$C_{1-20}$ alkyl or haloalkyl group.

In certain embodiments, oligomeric and polymeric compounds according to the present teachings can have one or more biheteroaryl units of the formula:

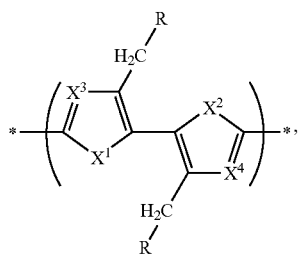

wherein $X^1$, $X^2$, $X^3$, $X^4$, and R are as defined herein.

In particular embodiments, oligomeric and polymeric compounds according to the present teachings can include H-H dialkyl-substituted biheteroaryl units selected from:

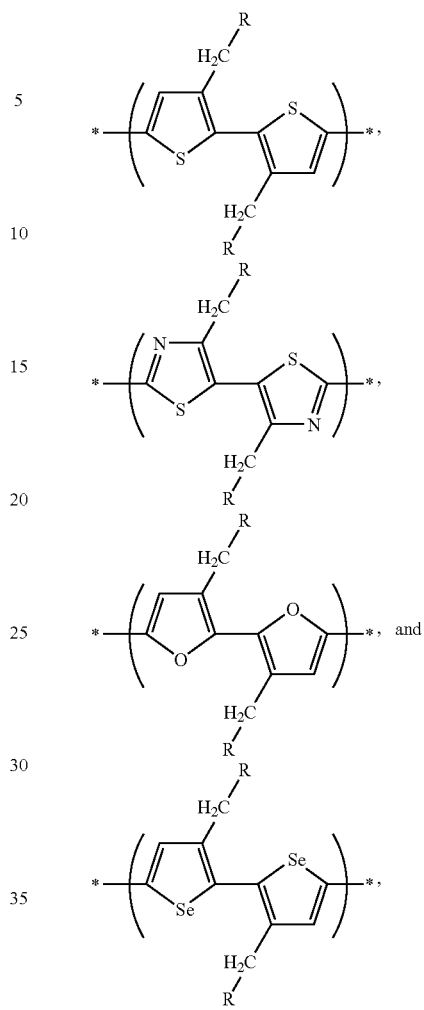

where R is an n-$C_{1-40}$ alkyl or haloalkyl group or a branched $C_{3-40}$ alkyl or haloalkyl group selected from

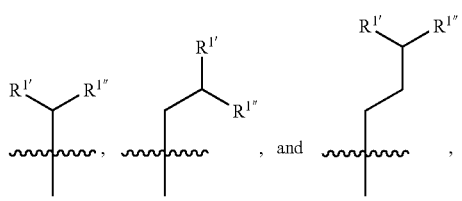

wherein $R^{1\prime}$ and $R^{1\prime\prime\prime}$, independently are an n-$C_{1-20}$ alkyl or haloalkyl group.

In various embodiments, the present monomeric, oligomeric or polymeric compounds can include at least one other unit that is different from the biheteroaryl unit(s). Such other unit(s) can include one or more conjugated linkers (Z) and/or one or more monocyclic (Ar) or polycyclic (π-2) moieties. In certain embodiments, the other unit(s) can be a monocyclic or polycyclic moiety including one or more electron-withdrawing groups. In certain embodiments, the other unit(s) can have an oxidation potential ($E_{ox}$) of about +0.5 V or greater, for example, +0.6 V or greater, and in particular embodiments, about +0.7 V or greater, wherein $E_{ox}$ is measured as described herein. The biheteroaryl units and the other unit(s) can be repeated in a regular (e.g., alternating) or random manner. Accordingly, these copolymers can be generally represented by the formula:

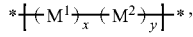

where $M^1$ represents the biheteroaryl unit; x represents the mole fraction of $M^1$ in the polymeric compound; $M^2$, in this case, represents one or more additional units that are different from $M^1$; and y represents the mole fraction of each $M^2$ in the polymeric compound; wherein $0<x\leq1$, $0<y<1$, and the sum of x and y is about 1. In the above formula, the one or more additional units $M^2$ can be repeated with the biheteroaryl units $M^1$ in a regular (e.g., alternating) or random manner. If at least one of $M^1$ and $M^2$ is substituted, the polymer can be regioregular or regiorandom in terms of the orientation of the various units relative to each other. Without wishing to be bound by any particular theory, it is believed that the present polymeric compounds can retain desirable properties even when the mole fraction of the biheteroaryl units, i.e., "x," varies from as low as 0.02 to 0.50 or greater. For example, the present compounds can include random copolymers having at least 0.02 mole percent of the biheteroary units described herein.

To further illustrate, and using $M^1$ to represent the biheteroaryl unit and $M^2$ and $M^3$ to represent a second or third co-unit, the present compounds, for example, can have a repeating unit of a formula selected from:

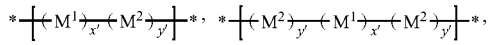

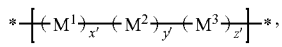

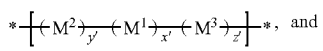

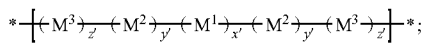

wherein x', y', and z' are independently an integer ranging from 1 to 10. In particular embodiments, each of x', y', and z' can be 1. In embodiments where the other unit(s) are substituted or otherwise asymmetrical, the copolymers can be regioregular or regiorandom in terms of the orientation of the various units relative to each other. The degree of polymerization can range from 2 to about 10,000. For example, for oligomeric compounds, the degree of polymerization can range from 2 to 9; and for polymeric compounds, the degree of polymerization can range from 10 to 10,000.

In particular embodiments, such other unit(s) $M^2$ and $M^3$ can be selected from a vinyl group optionally substituted with 1-2 electron withdrawing groups (e.g., a halogen such as F or Cl or a CN group), a carbonyl group, a 5-membered heteroaryl group optionally substituted with 1-2 electron withdrawing groups, a phenyl group optionally substituted with 1-4 electron-withdrawing groups, a naphthalenyl group optionally substituted with 1-6 electron-withdrawing groups, and a polycyclic moiety selected from:

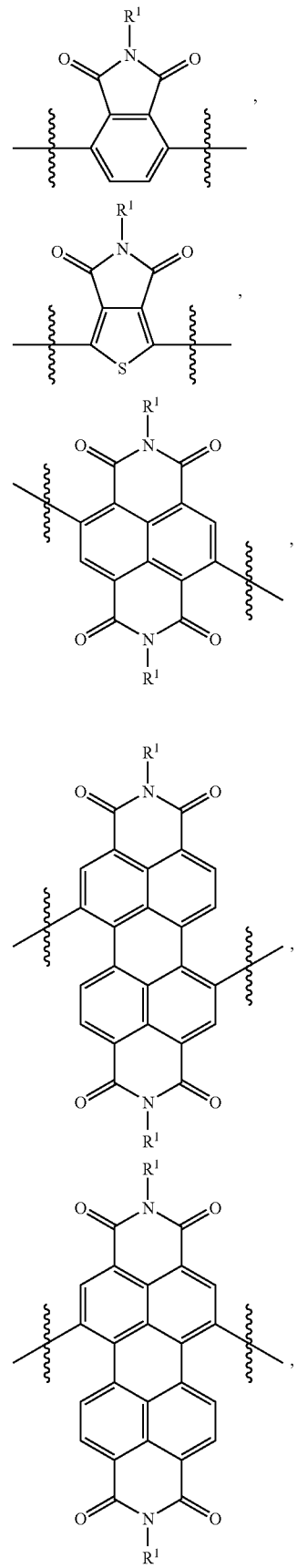

51
-continued
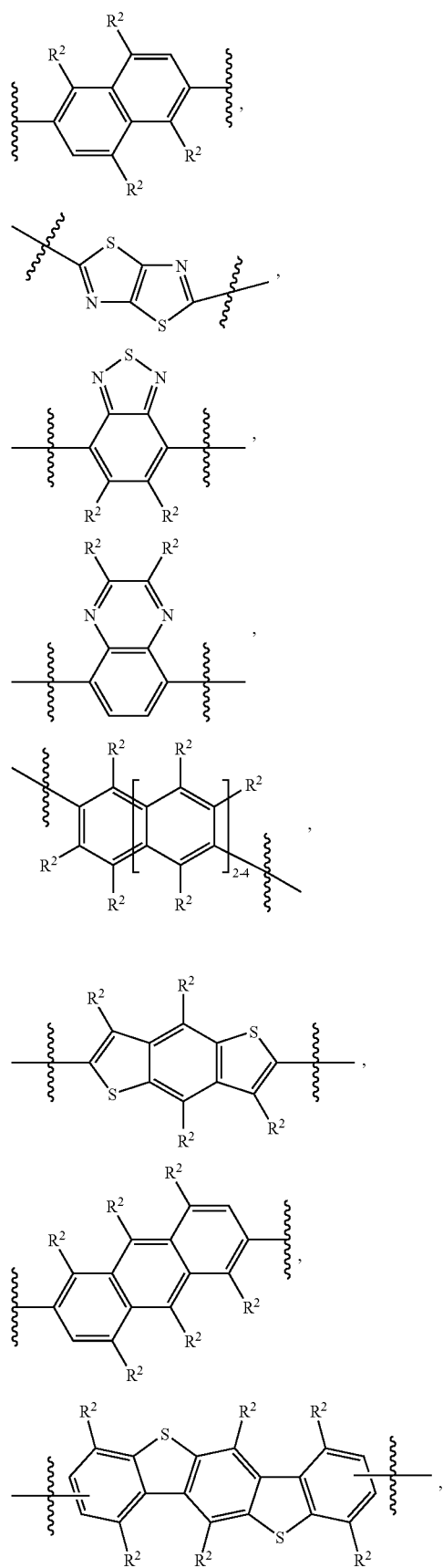
52
-continued
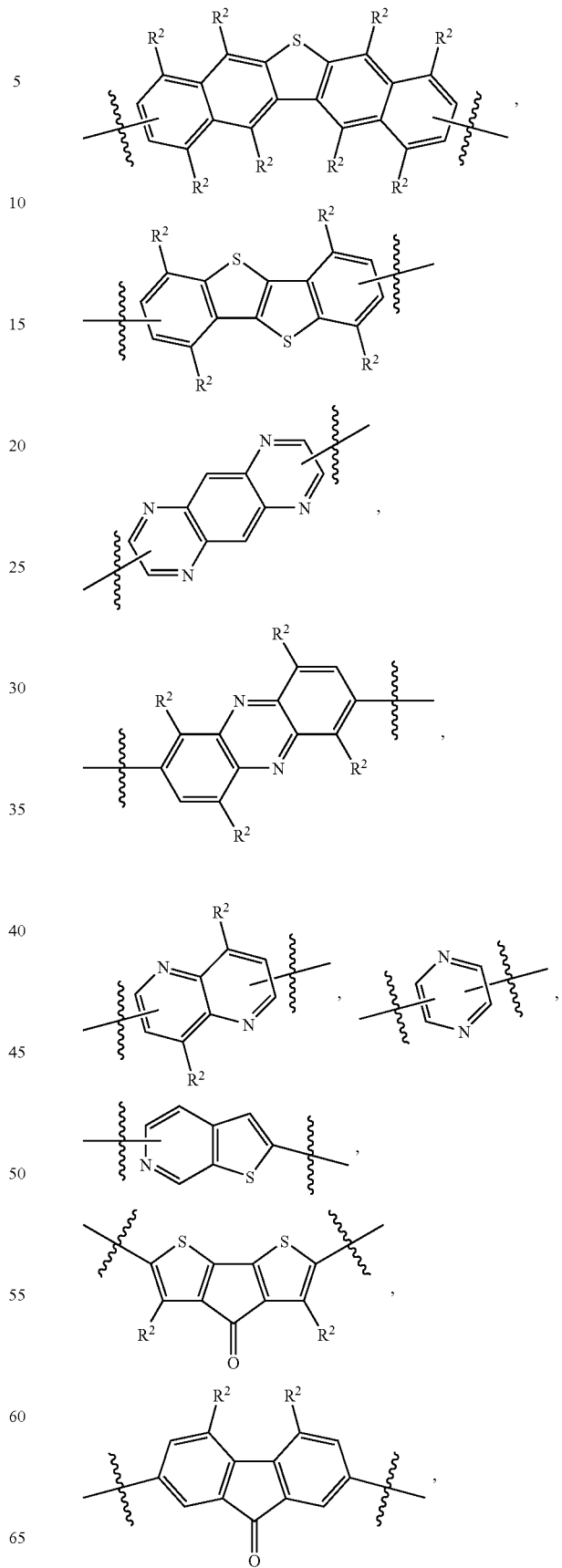

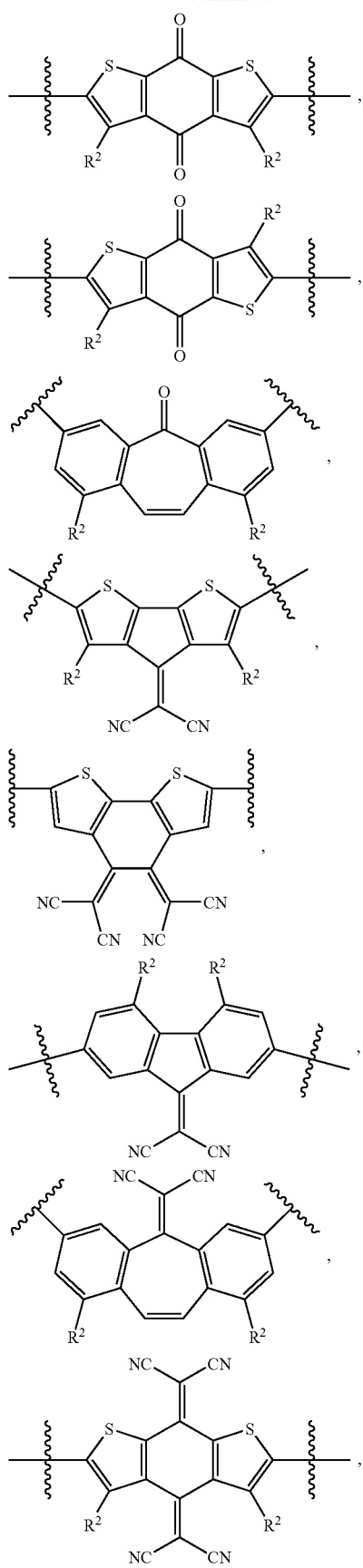

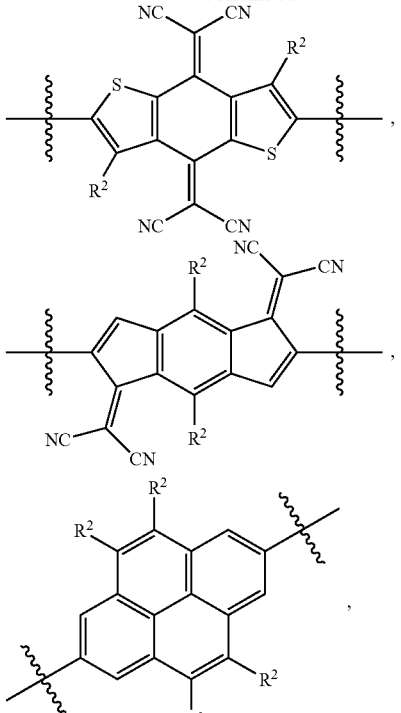

wherein:
R¹ is selected from a $C_{1-40}$ alkyl group, a $C_{2-40}$ alkenyl group, and a $C_{1-40}$ haloalkyl group; and
R², at each occurrence, is independently selected from H, a $C_{1-40}$ alkyl group, a $C_{2-40}$ alkenyl group, a $C_{1-40}$ haloalkyl group, and an electron-withdrawing group.

In certain embodiments, the present compounds can be monomeric compounds having a formula selected from:

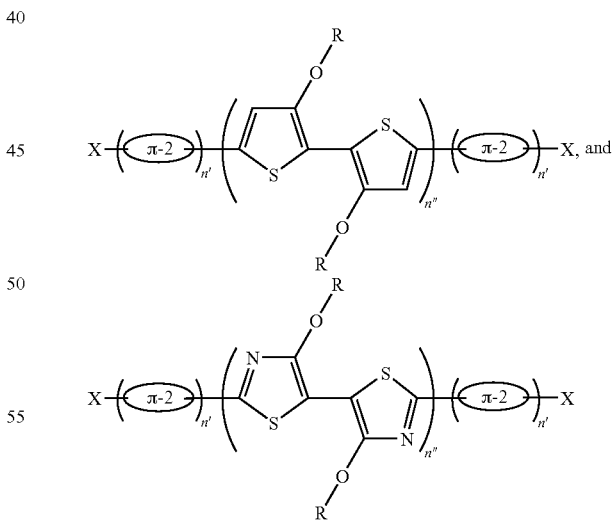

wherein π-2, at each occurrence, is independently an optionally substituted $C_{8-24}$ aryl or 8-24 membered heteroaryl group; X, at each occurrence, is independently selected from H, a leaving group, a $C_{1-40}$ alkyl group, a $C_{2-40}$ alkenyl group, a $C_{2-40}$ alkynyl group, a $C_{1-40}$ haloalkyl group, a $C_{1-40}$ alkoxyl group, and a $C_{1-40}$ alkylthio group; n', at each occurrence, is independently an integer ranging from 1 to 100; n" is independently an integer ranging from 1 to 10; and R is as defined herein. In particular embodiments, n" is an odd integer such as 1, 3, 5 or 7.

In certain embodiments, the present teachings relate to oligomeric or polymeric compounds having the formula:

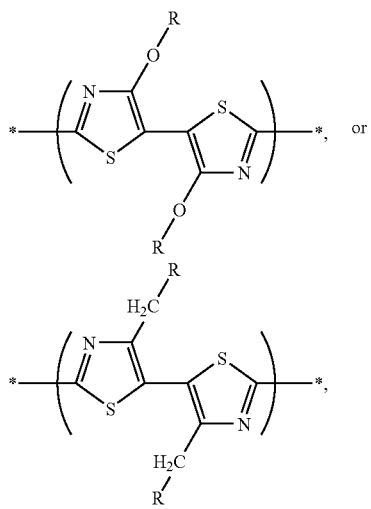

and co-oligomers or co-polymers that include at least one of these bithiazolyl units and at least one other unit. These compounds can have a HOMO energy level ($E_{HOMO}$) between about −4.8 eV and about −7.0 eV, where the $E_{HOMO}$ is determined as described herein. The degree of polymerization can range from 2 to about 10,000. For example, for oligomeric compounds, the degree of polymerization can range from 2 to 9; and for polymeric compounds, the degree of polymerization can range from 10 to 10,000.

In certain embodiments, the present teachings relate to co-oligomeric or co-polymeric compounds that include bithienyl units selected from:

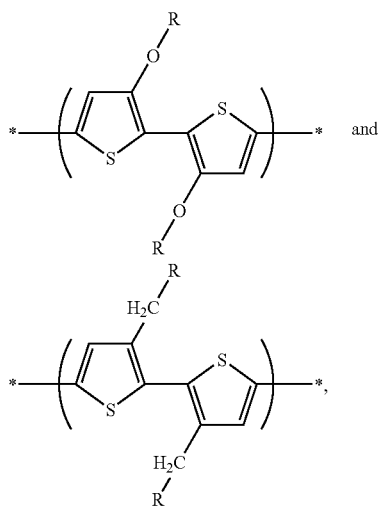

and at least one other unit which can help lower the HOMO energy level of the co-oligomeric or co-polymeric compounds. Such other unit(s) can have an oxidation potential ($E_{ox}$) of about +0.5 V or greater, for example, about +0.6 V or greater, and in particular embodiments, about +0.7 V or greater, wherein $E_{ox}$ is measured as described herein. The degree of polymerization can range from 2 to about 10,000. For example, for oligomeric compounds, the degree of polymerization can range from 2 to 9; and for polymeric compounds, the degree of polymerization can range from 10 to 10,000.

Exemplary co-oligomeric or co-polymeric compounds can include repeating units such as:

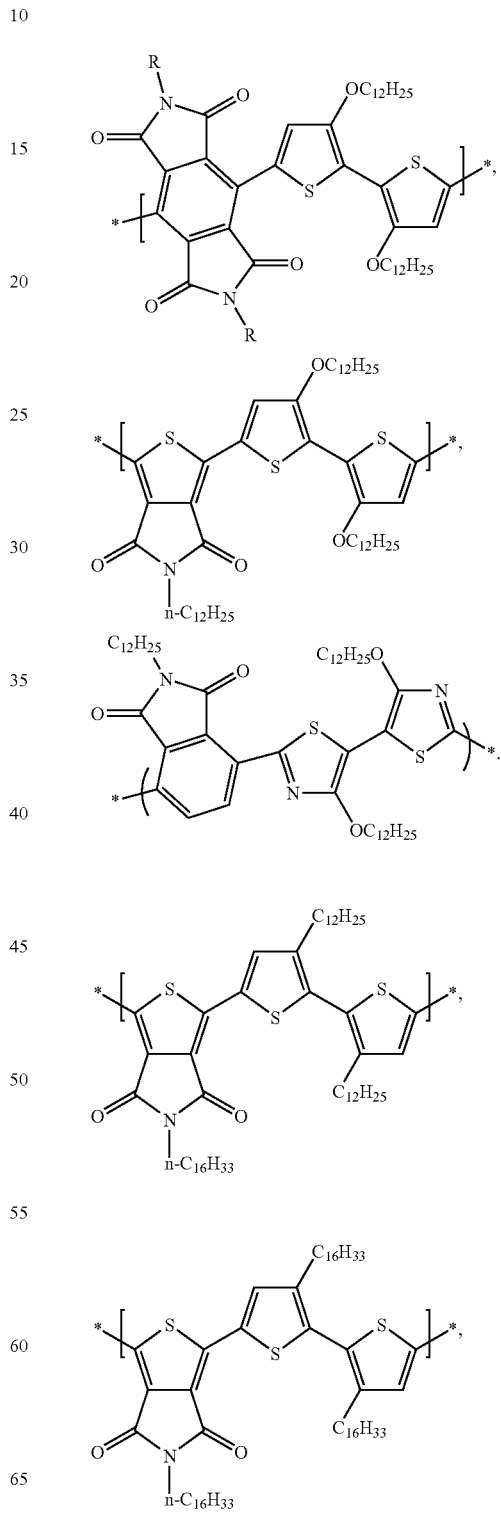

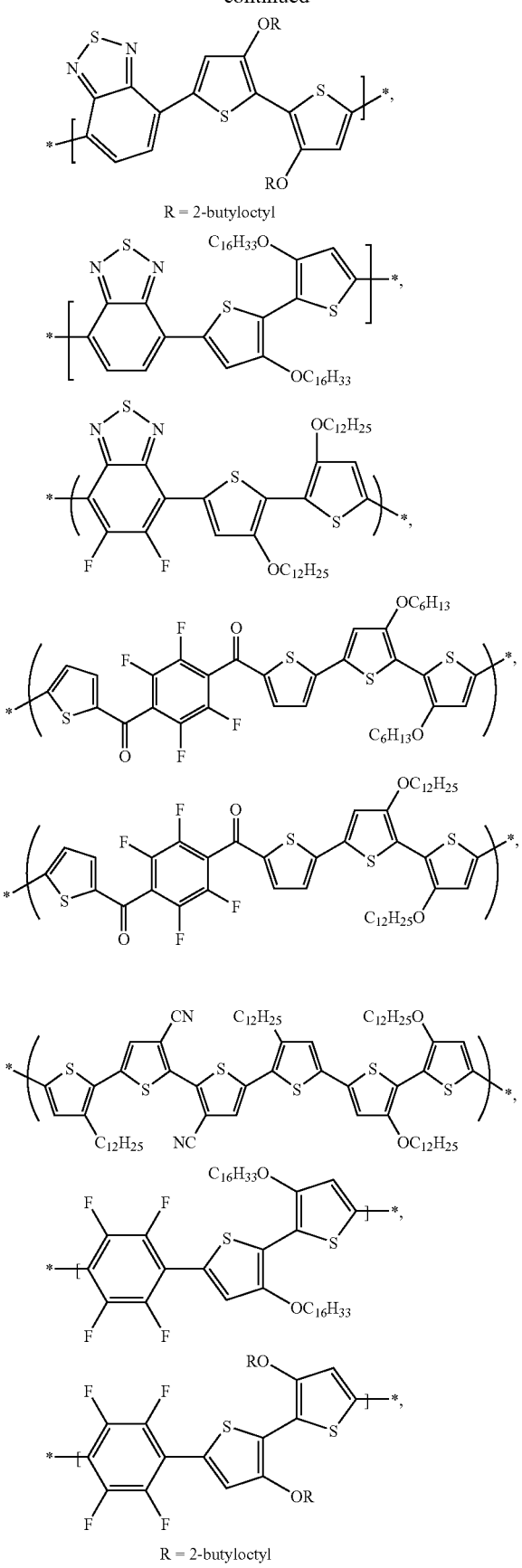

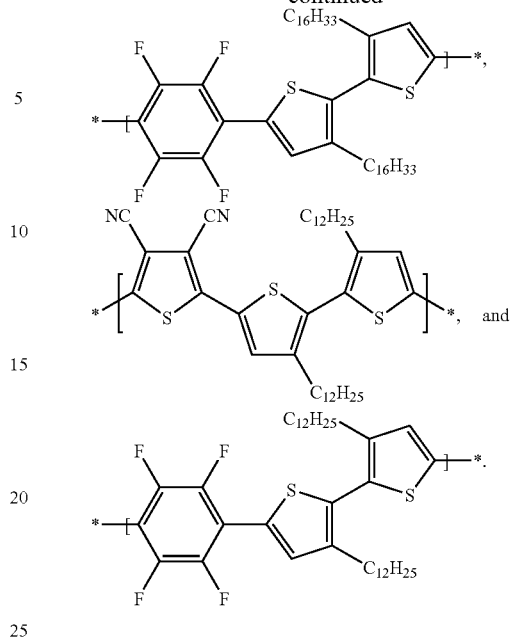

Compounds of the present teachings can be prepared according to procedures analogous to those described in the Examples. In particular, Stille coupling can be used to prepare co-polymeric compounds according to the present teachings with high molecular weight and in high yield (≥75%) and purity, as confirmed by $^1$H NMR spectra, elemental analysis, and GPC measurements.

Alternatively, the present compounds can be prepared from commercially available starting materials, compounds known in the literature, or via other readily prepared intermediates, by employing standard synthetic methods and procedures known to those skilled in the art. Standard synthetic methods and procedures for the preparation of organic molecules and functional group transformations and manipulations can be readily obtained from the relevant scientific literature or from standard textbooks in the field. It will be appreciated that where typical or preferred process conditions (i.e., reaction temperatures, times, mole ratios of reactants, solvents, pressures, etc.) are given, other process conditions can also be used unless otherwise stated. Optimum reaction conditions can vary with the particular reactants or solvent used, but such conditions can be determined by one skilled in the art by routine optimization procedures. Those skilled in the art of organic synthesis will recognize that the nature and order of the synthetic steps presented can be varied for the purpose of optimizing the formation of the compounds described herein.

The processes described herein can be monitored according to any suitable method known in the art. For example, product formation can be monitored by spectroscopic means, such as nuclear magnetic resonance spectroscopy (NMR, e.g., $^1$H or $^{13}$C), infrared spectroscopy (IR), spectrophotometry (e.g., UV-visible), mass spectrometry (MS), or by chromatography such as high pressure liquid chromatography (HPLC), gas chromatography (GC), gel-permeation chromatography (GPC), or thin layer chromatography (TLC).

The reactions or the processes described herein can be carried out in suitable solvents which can be readily selected by one skilled in the art of organic synthesis. Suitable solvents typically are substantially nonreactive with the reactants, intermediates, and/or products at the temperatures at which the reactions are carried out, i.e., temperatures that can range from the solvent's freezing temperature to the solvent's boiling temperature. A given reaction can be carried out in one solvent or a mixture of more than one solvent. Depending on the particular reaction step, suitable solvents for a particular reaction step can be selected.

Certain embodiments disclosed herein can be stable in ambient conditions ("ambient stable") and soluble in common solvents. As used herein, a compound can be considered electrically "ambient stable" or "stable at ambient conditions" when the carrier mobility or the oxidation potential of the compound is maintained at about its initial measurement when the compound is exposed to ambient conditions, for example, air, ambient temperature, and humidity, over a period of time. For example, a compound according to the present teachings can be described as ambient stable if its carrier mobility or oxidation potential does not vary more than 20% or more than 10% from its initial value after exposure to ambient conditions, including, air, humidity and temperature, over a 3 day, 5 day, or 10 day period. In addition, a compound can be considered ambient stable if the optical absorption of the corresponding film does not vary more than 20% (preferably, does not vary more than 10%) from its initial value after exposure to ambient conditions, including air, humidity and temperature, over a 3 day, 5 day, or 10 day period.

As used herein, a compound can be considered soluble in a solvent when at least 0.1 mg of the compound can be dissolved in 1 mL of the solvent. Examples of common organic solvents include petroleum ethers; acetonitrile; aromatic hydrocarbons such as benzene, toluene, xylene, and mesitylene; ketones such as acetone, and methyl ethyl ketone; ethers such as tetrahydrofuran, dioxane, bis(2-methoxyethyl)ether, diethyl ether, di-isopropyl ether, and t-butyl methyl ether; alcohols such as methanol, ethanol, butanol, and isopropyl alcohol; aliphatic hydrocarbons such as hexanes; esters such as methyl acetate, ethyl acetate, methyl formate, ethyl formate, isopropyl acetate, and butyl acetate; amides such as dimethylformamide and dimethylacetamide; sulfoxides such as dimethylsulfoxide; halogenated aliphatic and aromatic hydrocarbons such as dichloromethane, chloroform, ethylene chloride, chlorobenzene, dichlorobenzene, and trichlorobenzene; and cyclic solvents such as cyclopentanone, cyclohexanone, and 2-methypyrrolidone.

The present compounds can be fabricated into various articles of manufacture using solution processing techniques in addition to other more expensive processes such as vapor deposition. Various solution processing techniques have been used with organic electronics. Common solution processing techniques include, for example, spin coating, drop-casting, zone casting, dip coating, blade coating, or spraying. Another example of solution processing technique is printing. As used herein, "printing" includes a noncontact process such as inkjet printing, microdispensing and the like, and a contact process such as screen-printing, gravure printing, offset printing, flexographic printing, lithographic printing, pad printing, microcontact printing and the like.

Compounds of the present teachings can be used to prepare semiconductor materials (e.g., compositions and composites), which in turn can be used to fabricate various articles of manufacture, structures, and devices. In some embodiments, semiconductor materials incorporating one or more compounds of the present teachings can exhibit p-type semiconductor activity, n-type semiconductor activity, ambipolar activity, light absorption, and/or light emission.

The present teachings, therefore, further provide methods of preparing a semiconductor material. The methods can include preparing a composition that includes one or more compounds disclosed herein dissolved or dispersed in a liquid medium such as a solvent or a mixture of solvents, depositing the composition on a substrate to provide a semiconductor material precursor, and processing (e.g., heating) the semiconductor precursor to provide a semiconductor material (e.g., a thin film semiconductor) that includes a compound disclosed herein. In various embodiments, the liquid medium can be an organic solvent, an inorganic solvent such as water, or combinations thereof. In some embodiments, the composition can further include one or more additives independently selected from viscosity modulators, detergents, dispersants, binding agents, compatiblizing agents, curing agents, initiators, humectants, antifoaming agents, wetting agents, pH modifiers, biocides, and bactereriostats. For example, surfactants and/or polymers (e.g., polystyrene, polyethylene, poly-alpha-methylstyrene, polyisobutene, polypropylene, polymethylmethacrylate, and the like) can be included as a dispersant, a binding agent, a compatiblizing agent, and/or an antifoaming agent. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, drop-casting, zone casting, dip coating, blade coating, or spraying.

Various articles of manufacture including electronic devices, optical devices, and optoelectronic devices, such as thin film semiconductors, field effect transistors (e.g., thin film transistors), photovoltaics, photodetectors, organic light emitting devices such as organic light emitting diodes (OLEDs) and organic light emitting transistors (OLETs), complementary metal oxide semiconductors (CMOSs), complementary inverters, diodes, capacitors, sensors, D flip-flops, rectifiers, and ring oscillators, that make use of the compounds disclosed herein are within the scope of the present teachings as are methods of making the same. The present compounds can offer processing and operation advantages in the fabrication and/or the use of these devices.

For example, articles of manufacture such as the various devices described herein can be an electronic or optoelectronic device including a first electrode, a second electrode, and a semiconducting component in contact with the first electrode and the electrode, where the semiconducting component includes a compound of the present teachings. These devices can include a composite having a semiconducting component (or semiconductor material) of the present teachings and a substrate component and/or a dielectric component. The substrate component can be selected from doped silicon, an indium tin oxide (ITO), ITO-coated glass, ITO-coated polyimide or other plastics, aluminum or other metals alone or coated on a polymer or other substrate, a doped polythiophene, and the like. The dielectric component can be prepared from inorganic dielectric materials such as various oxides (e.g., $SiO_2$, $Al_2O_3$, $HfO_2$), organic dielectric materials such as various polymeric materials (e.g., polycarbonate, polyester, polystyrene, polyhaloethylene, polyacrylate), and self-assembled superlattice/self-assembled nanodielectric (SAS/SAND) materials (e.g., as described in Yoon, M-H. et al., PNAS, 102 (13): 4678-4682 (2005), the entire disclosure of which is incorporated by reference herein), as well as hybrid organic/inorganic dielectric materials (e.g., described in U.S. patent application Ser. No. 11/642,504, the entire disclosure of which is incorporated by reference herein). In some embodiments, the dielectric component can include the crosslinked polymer blends described in U.S. patent application Ser. Nos. 11/315,076, 60/816,952, and 60/861,308, the entire disclosure of each of which is incorporated by reference herein. The composite also can include one or more electrical contacts. Suitable materials for the source, drain, and gate electrodes include metals (e.g., Au, Al, Ni, Cu), transparent conducting oxides (e.g., ITO, IZO, ZITO, GZO, GIO, GITO), and conducting polymers (e.g., poly(3,4-ethylenedioxythiophene) poly(styrenesulfonate) (PEDOT:PSS), polyaniline (PANI), polypyrrole (PPy)). One or more of the composites described herein can be embodied within various organic electronic, optical, and optoelectronic devices such as organic thin film transistors (OTFTs), specifically, organic field effect transistors (OFETs), as well as sensors, capacitors, unipolar circuits, complementary circuits (e.g., inverter circuits), and the like.

Accordingly, an aspect of the present teachings relates to methods of fabricating an organic field effect transistor that incorporates a semiconductor material of the present teachings. The semiconductor materials of the present teachings can be used to fabricate various types of organic field effect transistors including top-gate top-contact capacitor structures, top-gate bottom-contact capacitor structures, bottom-gate top-contact capacitor structures, and bottom-gate bottom-contact capacitor structures.

FIG. 1 illustrates the four common types of OFET structures: (top left) bottom-gate top-contact structure, (top right) bottom-gate bottom-contact structure, (bottom left) top-gate bottom-contact structure, and (bottom right) top-gate top-contact structure. As shown in FIG. 1, an OFET can include a gate dielectric component (e.g., shown as 8, 8', 8'', and 8'''), a semiconductor component or semiconductor layer (e.g., shown as 6, 6', 6'', and 6'''), a gate electrode or contact (e.g., shown as 10, 10', 10'', and 10'''), a substrate (e.g., shown as 12, 12', 12'', and 12'''), and source and drain electrodes or contacts (e.g., shown as 2, 2', 2'', 2''', 4, 4', 4'', and 4'''). As shown, in each of the configurations, the semiconductor component is in contact with the source and drain electrodes, and the gate dielectric component is in contact with the semiconductor component on one side and the gate electrode on an opposite side.

In certain embodiments, OTFT devices can be fabricated with the present compounds on doped silicon substrates, using $SiO_2$ as the dielectric, in top-contact geometries. In particular embodiments, the active semiconductor layer which incorporates at least a compound of the present teachings can be deposited at room temperature or at an elevated temperature. In other embodiments, the active semiconductor layer which incorporates at least one compound of the present teachings can be applied by spin-coating or printing as described herein. For top-contact devices, metallic contacts can be patterned on top of the films using shadow masks.

In certain embodiments, OTFT devices can be fabricated with the present compounds on plastic foils, using polymers as the dielectric, in top-gate bottom-contact geometries. In particular embodiments, the active semiconducting layer which incorporates at least a compound of the present teachings can be deposited at room temperature or at an elevated temperature. In other embodiments, the active semiconducting layer which incorporates at least a compound of the present teachings can be applied by spin-coating or printing as described herein. Gate and source/drain contacts can be made of Au, other metals, or conducting polymers and deposited by vapor-deposition and/or printing.

In various embodiments, a semiconducting component incorporating compounds of the present teachings can exhibit p-type semiconducting activity, for example, a hole mobility of $10^{-4}$ $cm^2$/V-sec or greater and/or a current on/off ratio ($I_{on}/I_{off}$) of $10^3$ or greater.

Other articles of manufacture in which compounds of the present teachings are useful are photovoltaics or solar cells. Compounds of the present teachings can exhibit broad optical absorption and/or a tuned redox properties and bulk carrier mobilities, making them desirable for such applications. Accordingly, the compounds described herein can be used as a donor (p-type) semiconductor material in a photovoltaic design, which includes an adjacent n-type semiconductor material that forms a p-n junction. The compounds can be in the form of a thin film semiconductor, which can be deposited on a substrate to form a composite. Exploitation of compounds of the present teachings in such devices is within the knowledge of a skilled artisan.

Accordingly, another aspect of the present teachings relates to methods of fabricating an organic light-emitting transistor, an organic light-emitting diode (OLED), or an organic photovoltaic device that incorporates one or more semiconductor materials of the present teachings.

Figure 2:
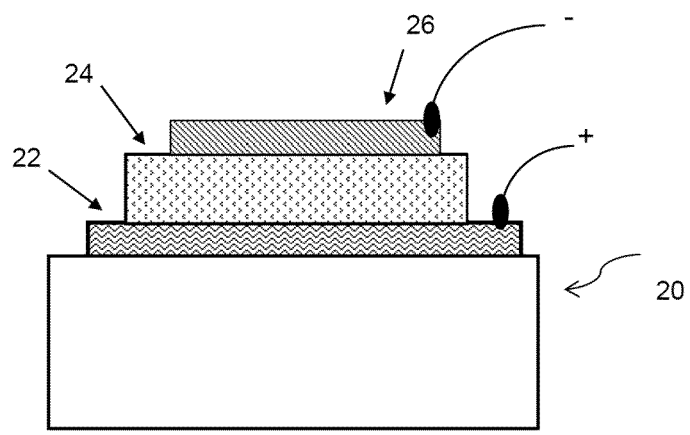
FIG. 2 illustrates a representative structure of a bulk-heterojunction organic photovoltaic device (also known as solar cell) which can incorporate one or more compounds of the present teachings as the donor and/or acceptor materials.

FIG. 2 illustrates a representative structure of a bulk-heterojunction organic photovoltaic device (also known as solar cell) which can incorporate one or more compounds of the present teachings as the donor and/or acceptor materials. As shown, a representative solar cell generally includes a substrate 20 (e.g., glass), an anode 22 (e.g., ITO), a cathode 26 (e.g., aluminum or calcium), and a photoactive layer 24 disposed between the anode and the cathode which can incorporate one or more compounds of the present teachings as the electron donor (p-channel) and/or electron acceptor (n-channel) materials. For example, the photoactive layer 24 can be composed of a blend material that includes one or more compounds according to the present teachings blended with one or more fullerene derivatives (e.g., PCBM).

Figure 3:
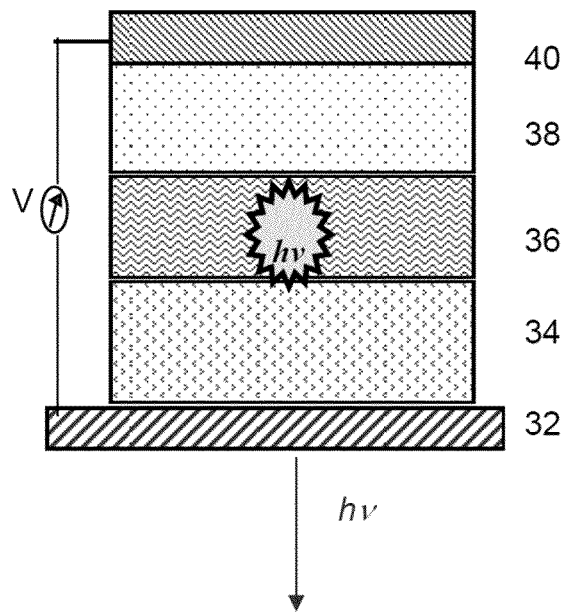
FIG. 3 illustrates a representative structure of an organic light-emitting device which can incorporate one or more compounds of the present teachings as electron-transporting and/or emissive and/or hole-transporting materials.

FIG. 3 illustrates a representative structure of an OLED which can incorporate one or more compounds of the present teachings as electron-transporting and/or emissive and/or hole-transporting materials. As shown, an OLED generally includes a substrate 30 (not shown), a transparent anode 32 (e.g., ITO), a cathode 40 (e.g., metal), and one or more organic layers which can incorporate one or more compounds of the present teachings as hole-transporting (n-channel) (layer 34 as shown) and/or emissive (layer 36 as shown) and/or electron-transporting (p-channel) materials (layer 38 as shown). In embodiments where the present compounds only have one or two of the properties of hole transport, electron transport, and emission, the present compounds can be blended with one or more further organic compounds having the remaining required property or properties.

The following examples are provided to illustrate further and to facilitate the understanding of the present teachings and are not in any way intended to limit the invention.

THF, acetonitrile and toluene were distilled from appropriate drying agents and stored over molecular sieves under argon. Regioregular poly(3-hexylthiophene) (rr-P3HT) was purchased from American Dye Source, Inc. (Quebec, Canada). 5,5'-Bis(tributylstannyl)-3,3'-bis(dodecyloxy)-2,2'-bithiophene was synthesized via procedures as described in Guo, X.; Watson, M. D., Org. Lett. (2008), 10: 5333-5336. All other reagents were used as received except where noted. Unless otherwise stated, all manipulations and reactions were carried out under argon atmosphere using standard Schlenk techniques. $^1H$ and $^{13}C$ spectra were recorded on a Varian INOVA 400 MHz spectrometer. Chemical shifts were referenced to residual protio-solvent signals. GC-MS data were collected from an Agilent technologies 6890N GC with 5973

MSD. Relative molecular weights of polymers were measured using a Waters 600E HPLC system, driven by Waters Empower Software and equipped with two linear mixed-bed GPC columns (American Polymer Standards Corporation, AM Gel Linear/15) in series. Eluting polymers were detected with both refractive index and photodiode array detectors and the system was calibrated with 11 narrow PDI polystyrene samples in the range 580 to $2\times10^6$ Da with THF at a flow rate of 1 mL/min. UV-Vis data were recorded on a Varian Cary 1 UV-Visible spectrophotometer. Elemental analysis and ICP were performed by Robertson Microlit Laboratories.

EXAMPLE 1

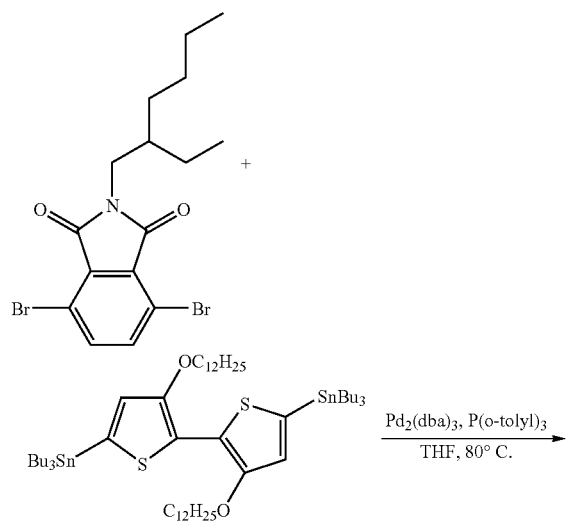

N-(2-ethylhexyl)-3,6-dibromophthalimide: 3,6-Dibromo phthalic anhydride (1.53 g, 5 mmol), 2-ethylhexyl amine (0.84 g, 6.5 mmol) and glacial acetic acid (30 ml) were combined and refluxed under argon for two hours. After most of the acetic acid was removed under reduced pressure, N-(2-ethylhexyl)-3,6-dibromophthalimide was separated via column chromatography (silica gel, dichloromethane:hexanes 1:3). Colorless crystals were obtained after recrystallization from hexanes (1.88 g, 90%). $^1$H NMR (CDCl$_3$, 400 MHz, ppm): δ 7.63 (s, 2H), 3.56 (d, 2H), 1.80 (m, 1H), 1.29 (m, 8H), 0.88 (m, 6H). $^{13}$C NMR (CDCl$_3$, 100 MHz, ppm): δ 165.34, 139.71, 131.42, 117.71, 42.66, 38.46, 30.77, 28.76, 24.09, 23.16, 14.26, 10.59. mp: 65° C. GC-MS: m/z: 415 ($C_{16}H_{19}Br_2NO_2^+$), 319 (100%). Anal. Calcd for $C_{16}H_{19}Br_2NO_2$(%): C, 46.07; H, 4.59; N, 3.36. Found (%): C, 46.09; H, 4.32; N, 3.37.

P1: In an air-free flask, monomers N-(2-ethylhexyl)-3,6-dibromophthalimide (83.43 mg, 0.2 mmol) and 5,5'-bis(tributylstannyl)-3,3'-bis(dodecyloxy)-2,2'-bithiophene (222.60 mg, 0.2 mmol) were combined under argon followed by addition of a mixture of tris(dibenzylideneacetone) dipalladium (0) and tri(o-tolyl)phosphine (1:8 molar ratio between Pd$_2$(dba)$_3$ and P(o-tolyl)$_3$; Pd loading: 0.03 equiv). The flask and its contents were subjected to 3 pump/purge cycles with argon followed by addition of anhydrous, degassed THF (4 ml) via syringe. The sealed reaction mixture was stirred at 80° C. for 24 hours. After cooling to room temperature, the deeply colored reaction mixture was dripped into 100 ml vigorously stirred methanol (containing 5 ml 12 M HCl). The precipitated solid was stirred for 4 hours and collected by centrifugation and decantation. The solid polymer was dissolved in chloroform and reprecipitated into methanol. After filtration and drying under reduced pressure, the polymer was subjected to sequential Soxhlet extraction using methanol, acetone and hexane (24 hours for each solvent) and finally chloroform. The chloroform solution was concentrated to 20 ml, dripped into vigorously stirred methanol and the resulting solid collected by centrifugation and decantation. After drying in vacuo, a blue solid with copper-like metallic luster was obtained (151.72 mg, 96% yield, $M_n$: 117.3 kDa). $^1$H NMR (C$_2$D$_2$Cl$_4$, 100° C., 400 MHz, ppm): δ: 7.94 (brs, 2H), 7.90 (brs, 2H), 4.35 (brs, 4H), 3.69 (brs, 2H), 2.01 (m, 5H), 1.68 (brs, 4H), 1.38 (m, 42H), 0.99 (m, 12H). Anal. Calcd for $C_{48}H_{71}NO_4S_2$(%): C, 72.96; H, 9.06; N, 1.77. Found (%): C, 72.69; H, 8.81; N, 1.79.

EXAMPLE 2

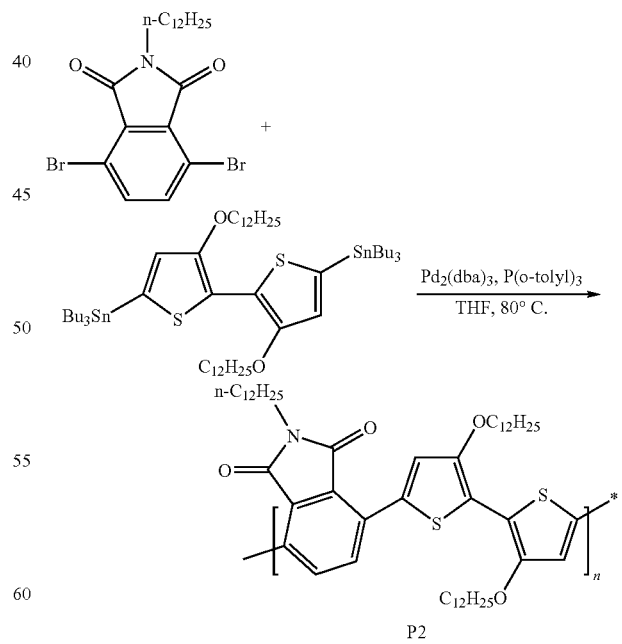

Polymer P2 was prepared and isolated in a manner similar to that employed for P1. After drying in vacuo, a blue solid with copper-like metallic luster was obtained (90% yield). $M_n$: 207.5 KDa; $M_w$: 394.3 KDa; PDI: 1.90. $^1$H NMR ($C_2D_2Cl_4$, 100° C., 400 MHz, ppm): δ 7.96 (brs, 2H), 7.89 (brs, 2H), 4.35 (brs, 4H), 3.76 (brs, 2H), 2.04 (brs, 4H), 1.79 (brs, 2H), 1.69 (brs, 4H), 1.39 (m, 50H), 0.93 (m, 9H). Anal. Calcd for $C_{52}H_{79}NO_4S_2$ (%): C, 73.80; H, 9.41; N, 1.66. Found (%): C, 73.55; H, 9.36; N, 1.63.

EXAMPLE 3

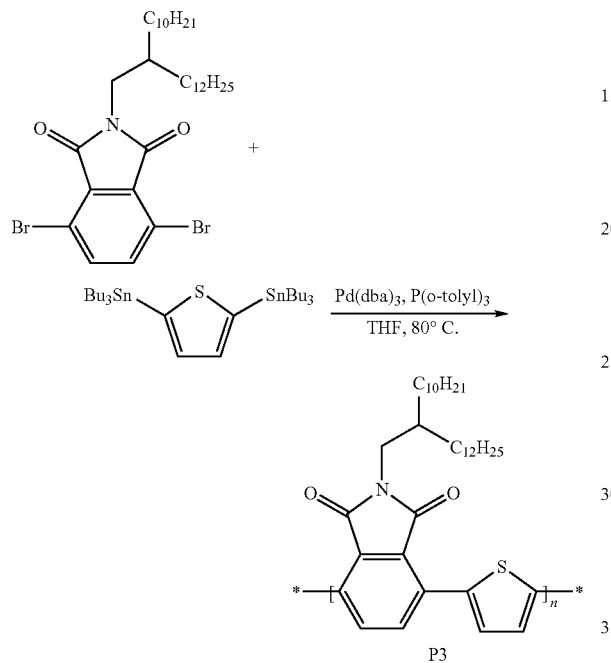

P3

Polymer P3 was prepared and isolated in a manner similar to that employed for P1. After drying in vacuo, an orange-red solid was collected (yield 82%). $M_n$: 13.0 KDa; $M_w$: 20.5 KDa; PDI: 1.58. $^1$H NMR (CDCl$_3$, 400 MHz, ppm): δ 7.89 (brs, 2H); 7.85 (brs, 2H); 3.59 (b, 2H); 1.92 (b, 1H), 1.22 (m, 40H), 0.84 (t, 6H). $^{13}$C NMR (CDCl$_3$, 100 MHz, ppm): δ 167.70; 139.70; 135.94; 132.17; 131.00; 128.29; 42.95; 37.18; 32.15; 31.78; 30.27; 29.92; 29.89; 29.58; 26.58; 22.92; 14.35. (Note: some peaks in $^{13}$C NMR overlap).

EXAMPLE 4

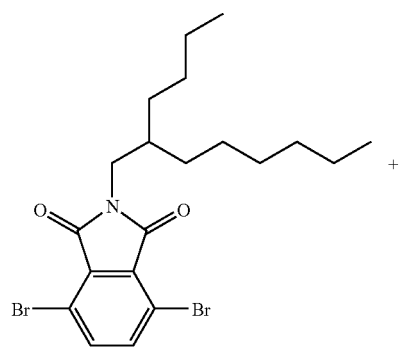

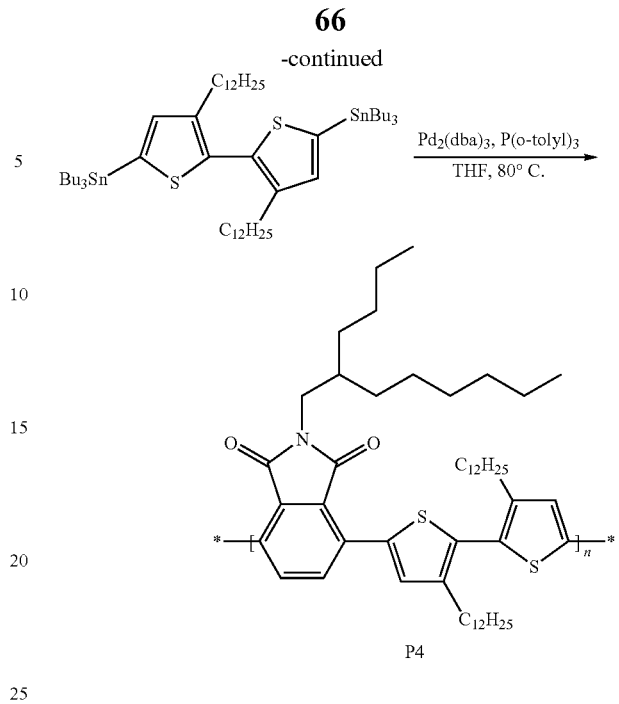

P4

Polymer P4 was prepared and isolated in a manner similar to that employed for P1. After drying in vacuo, an orange solid was collected (yield 84%). $M_n$: 22.0 KDa; $M_w$: 42.0 KDa; PDI: 1.91. $^1$H NMR (CDCl$_3$, 400 MHz, ppm): δ 7.80 (brs, 4H); 3.60 (b, 2H); 2.66 (t, 4H); 1.95 (b, 1H); 1.67 (b, 4H); 1.22 (m, 52H), 0.87 (m, 12H).

EXAMPLE 5

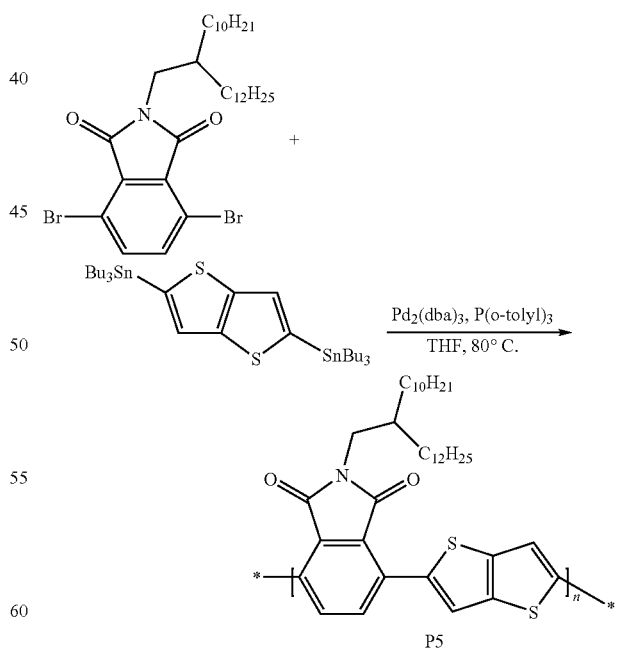

P5

Polymer P5 was prepared and isolated in a manner similar to that employed for P1. After drying in vacuo, an orange-red solid was collected (yield 96%). Molecular weight data not available due to the low solubility in THF at room temperature. $^1$H NMR (C$_2$D$_2$Cl$_4$, 400 MHz, 130° C., ppm): δ 8.25 (b, 4H); 3.72 (b, 2H); 2.42 (b, 1H); 1.36 (m, 40H), 0.95 (m, 6H).

EXAMPLE 6

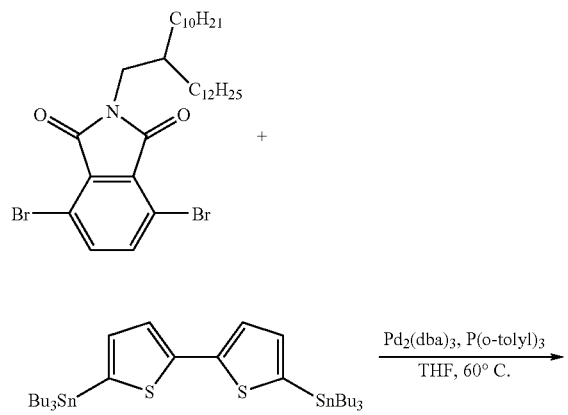

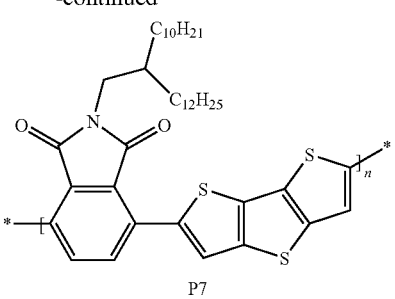

Polymer P6 was prepared and isolated in a manner similar to that employed for P1. After drying in vacuo, a red solid was collected (yield 92%). Molecular weight data not available due to the low solubility in THF at room temperature. $^1$H NMR (C$_2$D$_2$Cl$_4$, 400 MHz, 130° C., ppm): δ 7.90 (b, 4H); 7.40 (b, 2H); 3.71 (b, 2H); 2.04 (b, 1H); 1.41 (m, 40H), 0.95 (t, 6H).

EXAMPLE 7

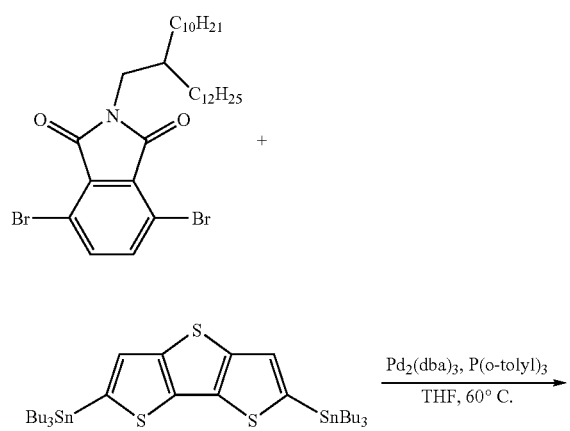

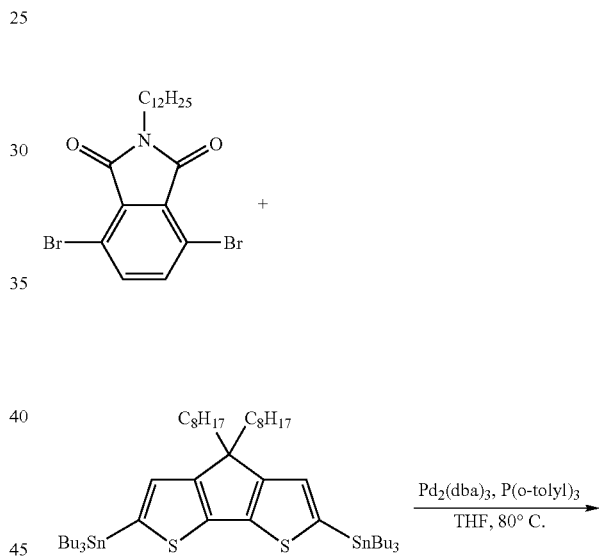

Polymer P7 was prepared and isolated in a manner similar to that employed for P1. After drying in vacuo, a red-brown solid was collected (yield 78%). M$_n$: 35.2 KDa; M$_w$: 309.8; PDI: 8.8. $^1$H NMR (C$_2$D$_2$Cl$_4$, 400 MHz, 130° C., ppm): δ 8.32 (b, 2H); 7.90 (b, 2H); 3.71 (b, 2H); 2.08 (b, 1H); 1.35 (m, 40H), 0.94 (t, 6H).

EXAMPLE 8

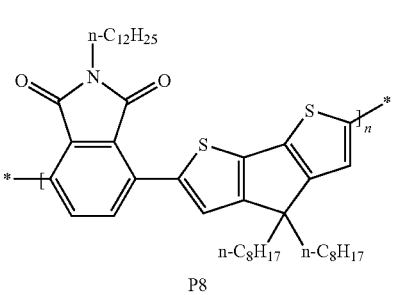

Polymer P8 was prepared and isolated in a manner similar to that employed for P1. After drying in vacuo, an red-brown solid was collected (yield 86%). M$_n$: 31.4 KDa; M$_w$: 211.9 KDa; PDI: 6.74. $^1$H NMR (CDCl$_3$, 400 MHz, ppm): δ 7.92 (s, 2H); 7.83 (s, 2H); 3.72 (b, 2H); 1.99 (b, 2H); 1.72 (b, 2H); 1.47 (b, 4H); 1.37 (b, 4H); 1.24 (m, 1.49 (m, 36H), 0.44 (m, 9H).

EXAMPLE 9

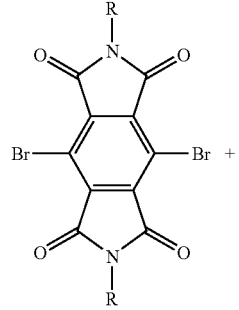

+

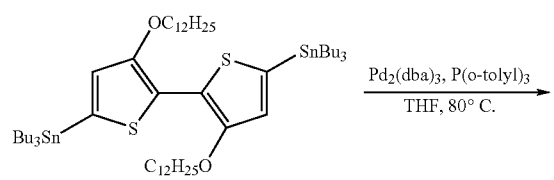

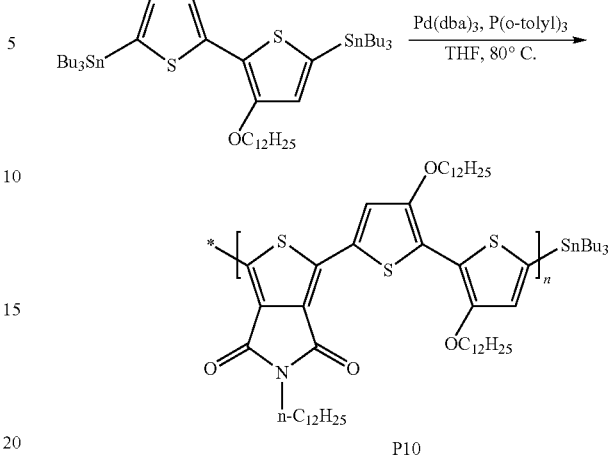

Polymer P10 was prepared and isolated in a manner similar to that employed for P1. After drying in vacuo, a blue solid was collected (yield: 96%). $M_n$: 32.3 KDa, PDI: 2.77. $^1$H NMR ($C_2D_2Cl_4$, 400 MHz, 130° C., ppm): δ 8.08 (bs, 2H); 4.37 (bs, 4H); 3.72 (bs, 2H); 2.08 (bs, 4H); 1.41 (m, 56H); 0.97 (m, 9H).

EXAMPLE 11

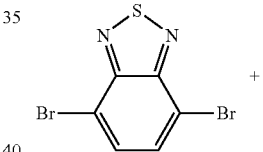

+

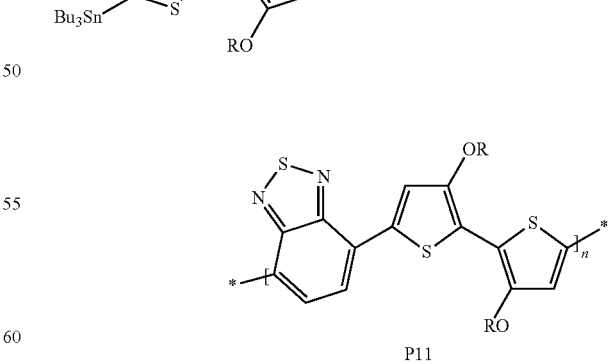

R = 2-butyloctyl

Polymer P11 was prepared and isolated in a manner similar to that employed for P1. After drying in vacuo, a deep green solid was collected (yield: 98%). $M_n$: 29.1 KDa; PDI: 3.23.

P9

R = 2-ethylhexyl

Polymer P9 was prepared and isolated in a manner similar to that employed for P1. After drying in vacuo, a purple solid was collected (yield: 96%). $M_n$: 14.2 KDa, PDI: 2.02. $^1$H NMR (CDCl$_3$, 400 MHz, 65° C., ppm): δ 7.06 (s, 2H); 4.20 (t, 4H); 3.54 (bs, 4H); 1.90 (m, 4H); 1.83 (m, 2H); 1.51 (m, 4H); 1.28 (m, 48H); 0.89 (m, 18H).

EXAMPLE 10

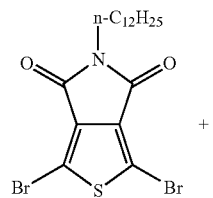

$^1$H NMR (C$_2$D$_2$Cl4, 400 MHz, 130° C., ppm): δ 8.14 (bs, 2H); 7.89 (br, 2H); 4. (bs, 4H); 2.07 (m, 2H); 1.55 (m, 32H); 1.06 (m, 12H).

EXAMPLE 12

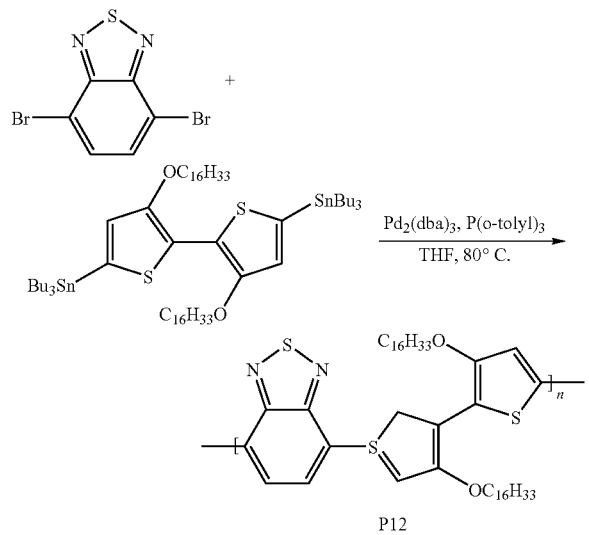

P12

Polymer P12 was prepared and isolated in a manner similar to that employed for P1. The solvents used for soxhlet extraction were: MeOH, acetone, hexane, chloroform and finally chlorobenzene. After drying in vacuo, a green solid was collected (yield: 83%). $M_n$: (N/A due to the low solubility in THF at room temperature). $^1$H NMR (C$_2$D$_2$Cl$_4$, 400 MHz, 130° C., ppm): δ 8.12 (bs, 2H); 7.88 (br, 2H); 4.36 (bs, 4H); 1.54 (m, 56H); 0.99 (m, 6H).

EXAMPLE 13

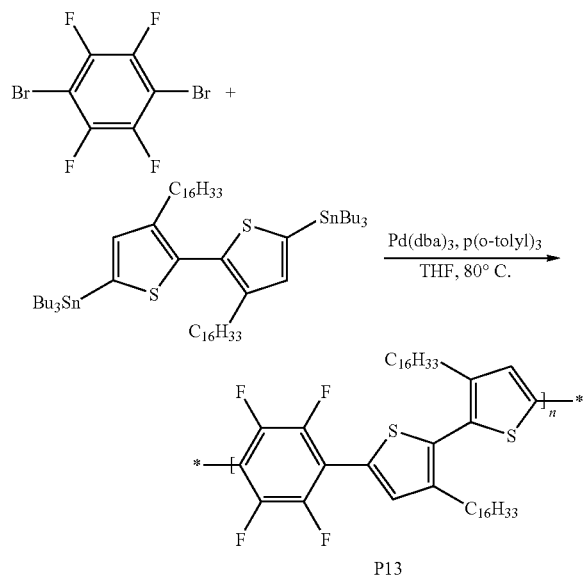

P13

Polymer P13 was prepared and isolated in a manner similar to that employed for P1. After drying in vacuo, a maroonish-red solid was collected (yield 77%). $M_n$: 16 kDa; PDI: 1.57. $^1$H NMR (C$_2$D$_2$Cl$_4$, 90° C., 400 MHz, ppm) δ: 7.63 (S, 2H); 2.71 (t, 4H); 1.70 (m, 4H); 1.31 (br, m, 52H), 0.93 (t, 6H). $^{19}$F NMR (C$_2$D$_2$Cl$_4$, 90° C., 376 MHz) δ (ppm): −140.98 (m, 4F), −141.130 (m, 0.8 F).

EXAMPLE 14

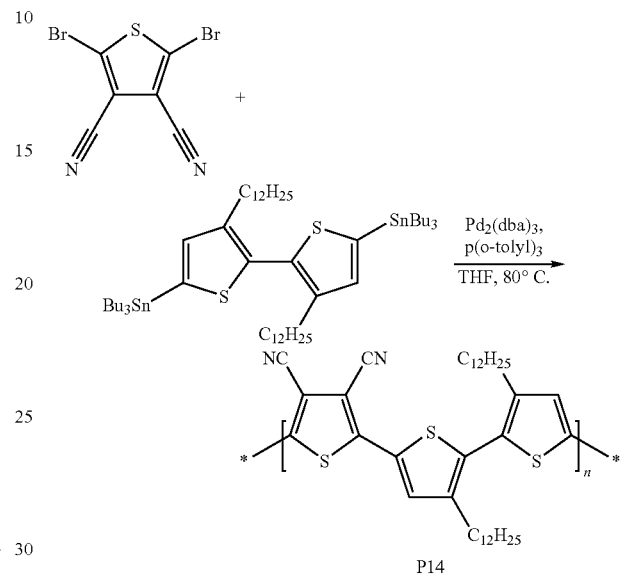

P14

Polymer P14 was prepared and isolated in a manner similar to that employed for P1. After drying in vacuo, a blue solid was collected (yield 77%). $M_n$: 17 kDa; PDI: 1.2. $^1$H NMR (CDCl$_3$, RT, 400 MHz, ppm) δ: 7.55 (br, s, 2H); 2.58 (br, 4H); 1.59 (m, 4H); 1.17 (br, 36H), 0.85 (br, 6H).

EXAMPLE 15

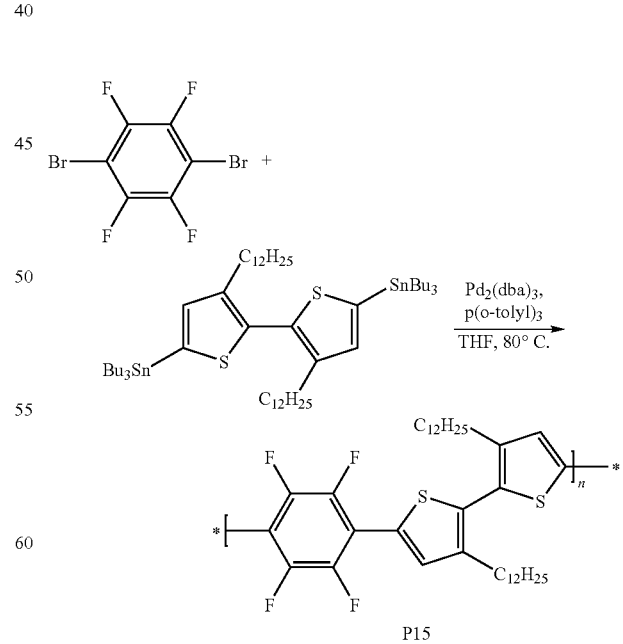

P15

Polymer P15 was prepared and isolated in a manner similar to that employed for P1. After drying in vacuo, a maroonish-red solid was collected (yield 79%). $M_2$: 25 kDa; PDI: 1.82. $^1$H NMR ($C_2D_2Cl_4$, 90° C., 400 MHz, ppm) δ: 7.61 (s, 2H); 2.68 (t, 4H); 1.68 (m, 4H); 1.29 (br, m, 36H), 0.91 (t, 6H). $^{19}$F NMR ($C_2D_2Cl_4$, 90° C., 376 MHz) δ (ppm): −141.83 (broad singlet, 4F), −141.982 (broad singlet, 0.5 F).

EXAMPLE 16

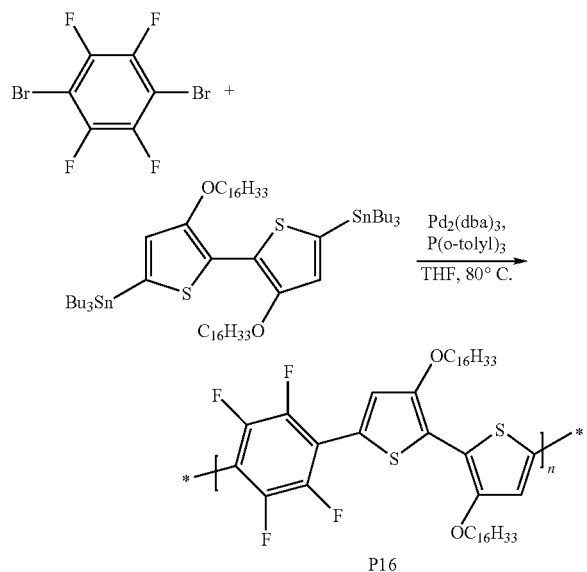

P16

Polymer P16 was prepared and isolated in a manner similar to that employed for P1. After drying in vacuo, a dark blue solid with copper-like metallic luster was obtained (78% yield). $^1$H NMR ($C_2D_2Cl_4$, 130° C., 400 MHz, ppm): δ 7.49 (s, br, 2H), 4.28 (s, br, 4H), 1.99 (m, 4H), 1.39 (m, br, 50H), 0.93 (t, 6H).

EXAMPLE 17

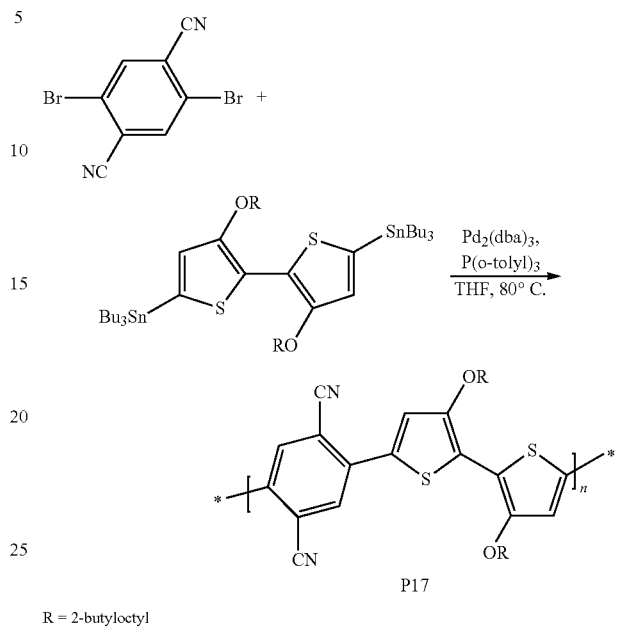

R = 2-butyloctyl

P17

Polymer P17 was prepared and isolated in a manner similar to that of P1. After drying in vacuo, a deep blue solid with copper-like metallic luster was obtained (61% yield). $M_n$: 190 kDa; PDI: 2.8; $^1$H NMR ($C_2D_2Cl_4$, 130° C., 400 MHz, ppm): δ 8.0 (s, 2H), 7.68 (s, 2 H), 4.26 (brs, 4 H), 2.10 (brs, 2 H) 1.39 (m, 32 H), 1.03 (m, 12 H).

EXAMPLE 18

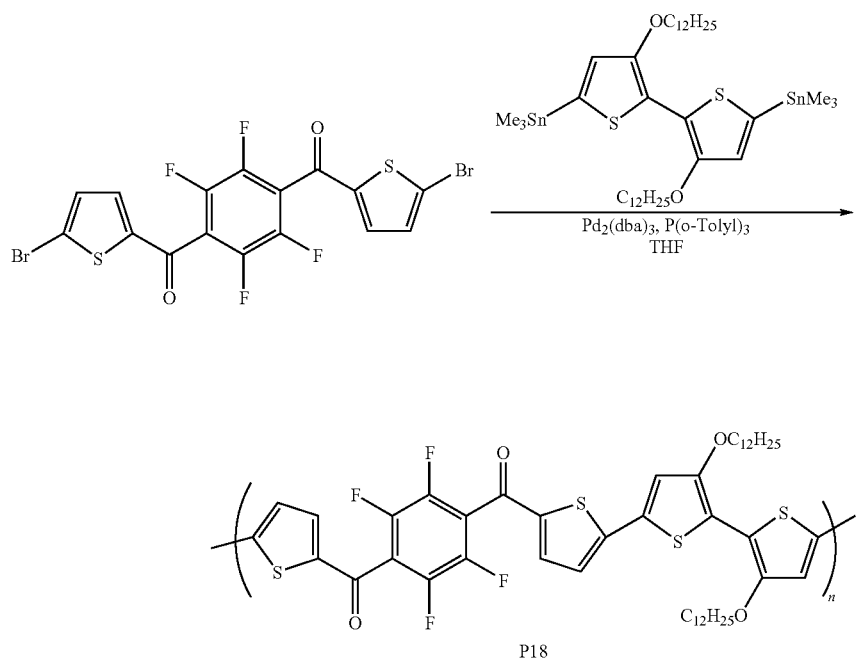

P18

The reagents 5,5'-bis(trimethylstannyl)-3,3'-didodecyloxy-2,2'-bithiophene (162.3 mg, 0.189 mmol), perfluoro-1,4-phenylenebis((5-bromothiophen-2-yl)methanone) (100 mg, 0.189 mmol), Pd$_2$(dba)$_3$ (5.0 mg, 0.0055 mmol), and P(o-tolyl)$_3$ (13.2 mg, 0.043 mmol) in anhydrous THF (6 mL) were heated at 65° C. for 16 h under nitrogen in a sealed flask. After cooling to room temperature, the dark purple viscous reaction mixture was poured into methanol (50 mL). After stirring for 2 hours, the precipitated dark solid was collected by gravity filtration. The polymer was subjected to sequential Soxhlet extraction with methanol, acetone, hexanes, and chloroform. Finally, the chloroform solution (40 mL) was precipitated into methanol (150 mL). The extraction/precipitation procedure was repeated for one more time. The final precipitated polymer was collected by vacuum filtration and dried in a vacuum oven (60° C., overnight) to afford the pure polymer P18 as a dark solid (142 mg, 83% yield). Anal. calcd. for $C_{48}H_{56}F_4O_4S_4$: C, 63.97; H, 6.26. Found: C, 63.32; H, 6.28. GPC (RT in THF): $M_n$=47,670 g mol$^{-1}$, $M_w$=87,952 g mol$^{-1}$, and PDI=1.84 (against PS standard).

EXAMPLE 19

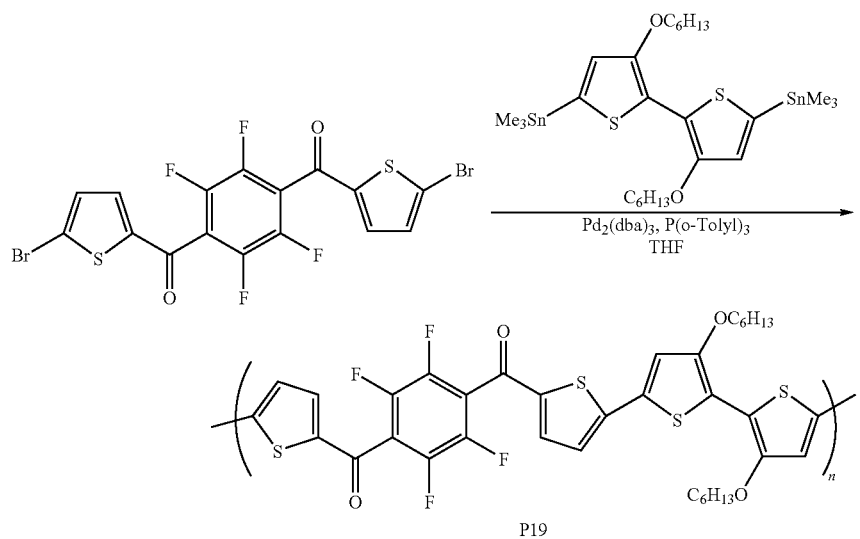

P19

The reagents 5,5'-bis(trimethylstannyl)-3,3'-dihexyloxy-2,2'-bithiophene (130.8 mg, 0.189 mmol), perfluoro-1,4-phenylenebis((5-bromothiophen-2-yl)methanone) (100 mg, 0.189 mmol), Pd$_2$(dba)$_3$ (5.0 mg, 0.0055 mmol), and P(o-tolyl)$_3$ (13.2 mg, 0.043 mmol) in anhydrous THF (6 mL) were heated at 65° C. for 21 h under nitrogen in a sealed flask. After cooling to room temperature, the dark purple viscous reaction mixture was poured into methanol (50 mL). After stirring for 2 hours, the precipitated dark solid was collected by gravity filtration. The polymer was subjected to sequential Soxhlet extraction with methanol, acetone, hexanes, and chloroform. Finally, the chloroform solution (30 mL) was precipitated into methanol (100 mL). The extraction/precipitation procedure was repeated for one more time. The final precipitated polymer was collected by vacuum filtration and dried in a vacuum oven (60° C., overnight) to afford the pure polymer P19 as a dark solid (85 mg, 61% yield). Anal. calcd. for $C_{36}H_{32}F_4O_4S_4$: C, 59.00; H, 4.40. Found: C, 59.20; H, 4.55.

GPC (RT in THF): $M_n$=29,494 g mol$^{-1}$, $M_w$=59,380 g mol$^{-1}$, and PDI=2.01 (against PS standard).

EXAMPLE 20

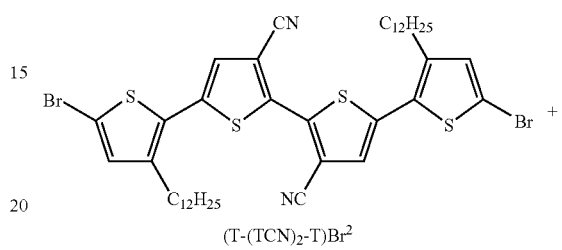

(T-(TCN)$_2$-T)Br$_2$

-continued

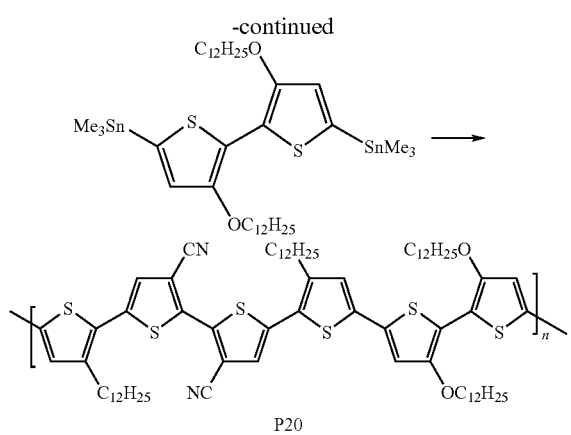

P20

Under argon, a mixture of (T-(TCN)$_2$-T)Br$_2$ (106.4 mg, 0.12 mmol), 5,5'-bis(trimethylstannyl)-3,3'-bisdodecoxy-2, 2'-bithiophene (104.6 mg, 0.12 mmol), tol$_3$P (4.5 mg, 0.015 mmol), and Pd$_2$dba$_3$ (3.4 mg, 0.004 mmol) in anhydrous toluene (20 mL) was stirred at refluxing temperature for 3 hours. Bromobenzene (0.5 mL) was then added and the reaction mixture was maintained at refluxing temperature for an additional 15 hours. Upon cooling to room temperature, the reaction mixture was poured into a mixture of methanol (80 mL) and concentrated HCl (8 mL), and the resulting mixture was stirred at room temperature for 2 hours. The precipitate was collected by filtration and washed with methanol. The obtained solid product was subject to Soxhlet extraction with acetone and hexane for 24 hours each. Finally, the solid product was extracted with chloroform and chlorobenzene for 24 hours each, and the extracts were concentrated and precipitated in methanol, leading to two fractions of dark solid as the product (chloroform: 32.5 mg, yield 21.4%; chlorobenzene: 57.8 mg, yield 38.1%).

EXAMPLE 21

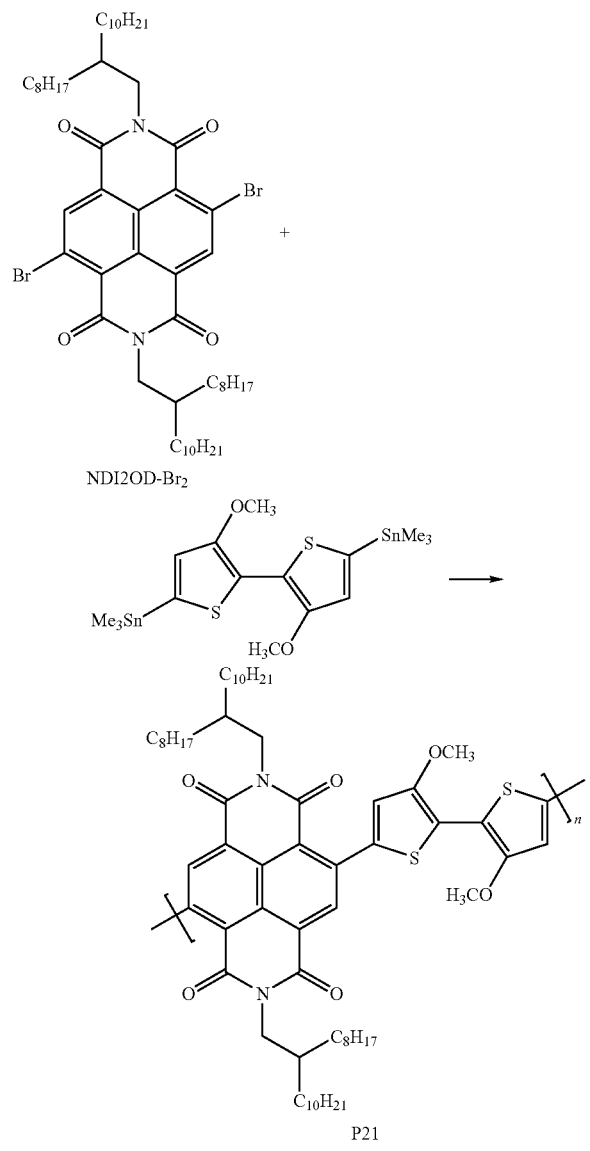

Under argon, a mixture of NDI2OD-Br$_2$ (105.7 mg, 0.107 mmol), 5,5'-bis(trimethylstannyl)-3,3'-dimethoxy-2,2'-bithiophene (51.5 mg, 0.093 mmol), and Pd(PPh$_3$)$_2$Cl$_2$ (3.3 mg, 0.005 mmol) in anhydrous toluene (12 mL) was stirred at 90° C. for 18 hours. Bromobenzene (0.5 mL) was then added and the reaction mixture was maintained at 90° C. for an additional 16 hours. Upon cooling to room temperature, a solution of potassium fluoride (1.5 g) in water (3 mL) was added. This mixture was stirred at room temperature for 1 hour before it was extracted with chloroform (100 mL). Organic layer was washed with water (80 mL×2), dried over anhydrous sodium sulfate, and concentrated on a rotary evaporator. The residue was taken with chloroform (40 mL) and precipitated in methanol (100 mL) and acetone (100 mL) in sequence. The obtained solid product was purified by Soxhlet extraction with acetone for 48 hours. The remaining solid residue was redissolved in chloroform (50 mL) and the resulting mixture was heated to boil. Upon cooling to room temperature, the chloroform solution was filtered through a 5 μm filter, and the filtrate was added slowly to methanol (80 mL). The precipitates were collected by filtration, washed with methanol, and dried in vacuum, leading to a dark solid as the product (89.1 mg, yield 91.0%).

$^1$H NMR (CDCl$_3$, 500 MHz): δ: 8.30-9.20 (m, br, 2H), 7.00-7.20 (m, br, 2H), 3.80-4.50 (m, br, 10H), 2.03 (m, br, 2H), 1.15-1.50 (s, br, 64H), 0.83-0.95 (s, br, 12H). GPC: $M_n$=35.2K Da, $M_w$=193.5K Da, PDI=5.50. Elemental Analysis (calc. C, 73.24; H, 8.84; N, 2.67): found C, 73.35; H, 8.77; N, 2.75.

EXAMPLE 22

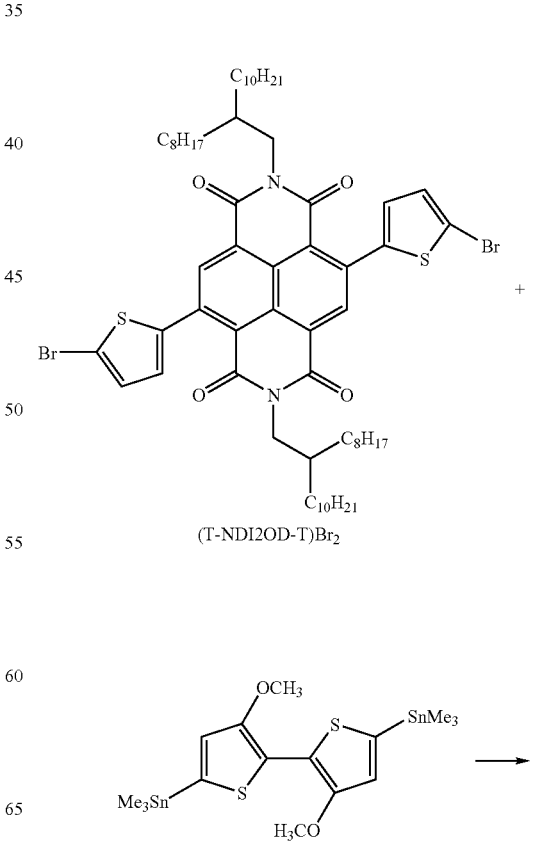

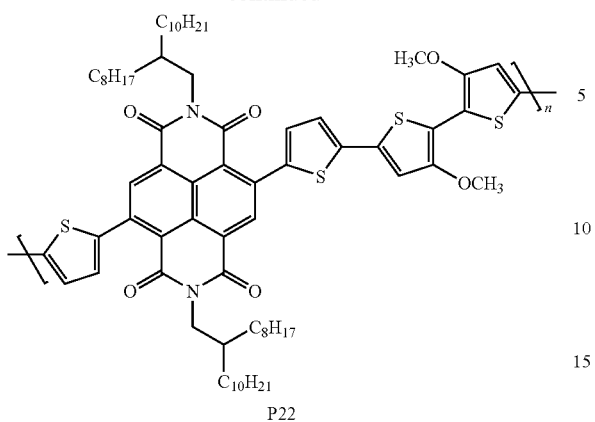

P22

Under argon, a mixture of (T-NDI2OD-T)Br$_2$ (1.34 g, 1.17 mmol), 5,5'-bis(trimethylstannyl)-3,3'-dimethoxy-2,2'-bithiophene (0.56 g, 1.02 mmol), and Pd(PPh$_3$)$_2$Cl$_2$ (35.5 mg, 0.044 mmol) in anhydrous toluene (150 mL) was stirred at 90° C. for 18 hours. Bromobenzene (3.0 mL) was then added and the reaction mixture was maintained at 90° C. for an additional 20 hours. Upon cooling to room temperature, the reaction mixture was poured into a mixture of methanol (600 mL) and concentrated HCl (30 mL), and the resulting mixture was stirred at room temperature for 4 hours. The precipitate was collected by filtration and washed with methanol. The obtained solid product was redissolved in chloroform (200 mL), and this solution was precipitated in methanol (800 mL). The isolated solid was then subject to Soxhlet extraction with methanol, acetone, and hexane for 24 hours each, leading to a dark solid as the product (1.20 g, yield 97.6%).

$^1$H NMR (CDCl$_3$, 500 MHz): δ: 8.20-8.90 (m, br, 2H), 6.80-7.60 (m, br, 6H), 3.60-4.60 (m, br, 10H), 2.00 (m, br, 2H), 1.16-1.50 (s, br, 64H), 0.82-0.90 (s, br, 12H). GPC: M$_n$=10.9K Da, M$_w$=40.4K Da, PDI=3.7.

EXAMPLE 23

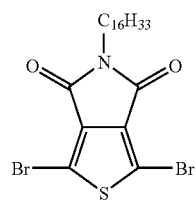

+

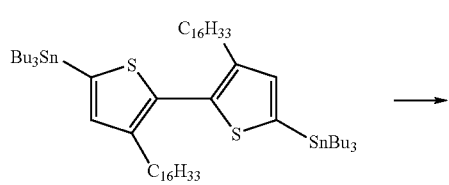

→

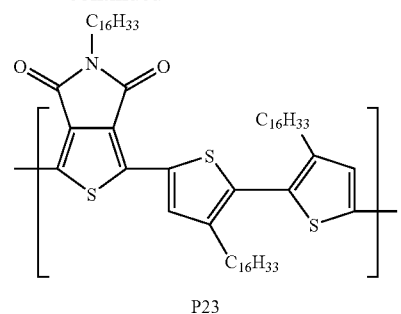

P23

Polymer P23 was prepared and isolated in a manner similar to that employed for P1. After drying in vacuo, a dark brown solid was obtained (86% yield). Mn: 14 kDa, PDI: 1.41. $^1$H NMR (400 MHz, 130° C., C$_2$D$_2$Cl$_4$): δ 7.97 (s, 2H), 3.74 (s, br, 2H), 2.70 (s, br, 4H), 1.74 (m, 6H), 1.34 (m, br, 78H), 0.95 (s, br, 9H).

EXAMPLE 24

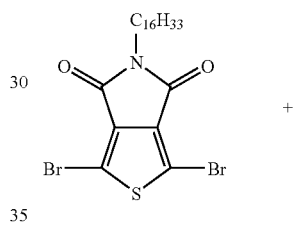

+

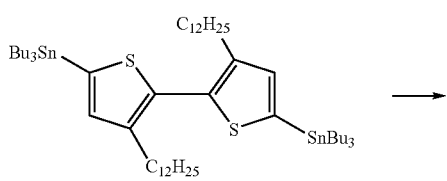

→

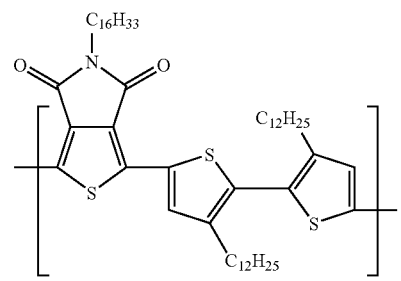

P24

Polymer P24 was prepared and isolated in a manner similar to that employed for P1. After drying in vacuo, a dark brown solid was obtained (92% yield). Mn: 12 kDa, PDI: 1.56. $^1$H NMR (400 MHz, 130° C., $C_2D_2Cl_4$): δ 7.95 (s, 2H), 3.72 (s, br, 2H), 2.68 (s, br, 4H), 1.73 (m, br, 10H), 1.34 (m, br, 58H), 0.92 (s, br, 9H).

EXAMPLE 25

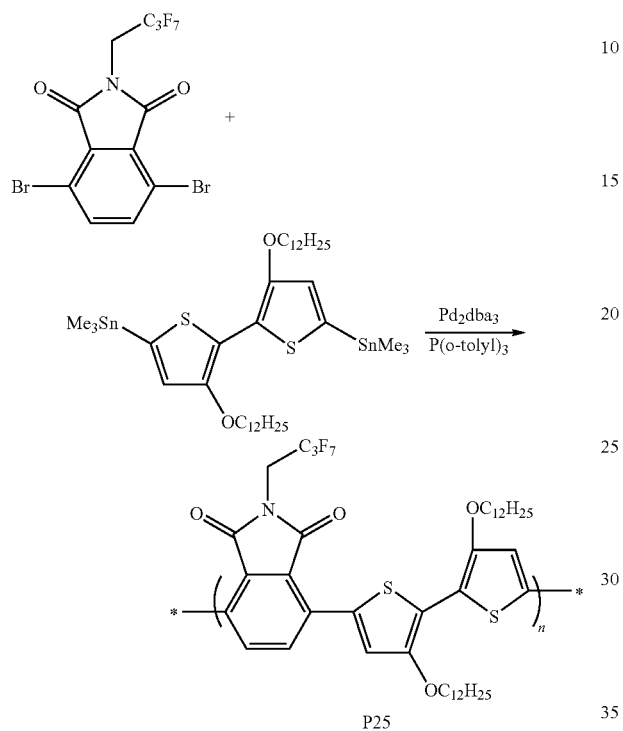

P25

A mixture of 3.0 g (9.8 mmol) of 2,4-dibromophthalic anhydride (*J. Am. Chem. Soc.* 2009, 131, 7206) and 2.53 g (12.7 mmol) of 2,2,3,3,4,4,4-heptafluorobutylamine in 60 mL of acetic anhydride was heated to reflux for 2 hours. The mixture was cooled to room temperature and concentrated in vacuo to dryness. The resulting solid was purified by flash chromatography (silica gel, 5.5×30 cm, chloroform). The product was recrystallized from 75 mL of cold diethyl ether to give 2.4 g (50% yield) of N-(2,2,3,3,4,4,4-heptafluorobutyl)-3,6-dibromophthalimide as white needles. m.p. 165° C. $^1$H NMR (500 MHz) δ 7.76 (s, 2H), 4.40 (t, 2H, J=15.2 Hz).

A solution of 2.9 g (5.42 mmol) of 3,3'-didodecyloxy-2,2'-bithiophene (*Org. Lett.* 2008, 10, 5333) in 150 mL of THF was cooled to −78° C. The resulting suspension was treated dropwise with 5.2 mL (13.0 mmol) of n-BuLi (2.5 M in hexanes) and stirred for an additional 45 minutes. The dry ice bath was then removed and the mixture was stirred at ambient temperature for 1.25 hours. The suspension was cooled to −78° C. and treated with a solution of 3.02 g (15.2 mmol) of trimethyltin chloride in 15 mL of THF. The mixture was stirred for 90 minutes at ambient temperature. The mixture was diluted with 100 mL of ethyl acetate and washed successively with 50 mL of water and 50 mL of brine. The separated organic layer was dried over $K_2CO_3$, filtered, and concentrated in vacuo. The resulting solid was recrystallized from cold pentane to give 3.8 g (81% yield) of 5,5'-bis(trimethylstannyl)-3,3'-bis(dodecyloxy)2,2'-bithiophene as light tan needles. m.p. 66-67° C. $^1$H NMR (500 MHz) δ 6.88 (s, 2H), 4.11 (t, 4H, J=6.4 Hz), 1.84 (m, 4H), 1.55-1.30 (m, 36H), 0.88 (m, 6H), 0.36 (s, 18H).

An air-free vessel was charged with 28 mg (0.0581 mmol) of N-(2,2,3,3,4,4,4-heptafluorobutyl)-3,6-dibromophthalimide, 50 mg (0.0581 mmol) of 5,5'-bis(trimethylstannyl)-3,3'-bis(dodecyloxy)2,2'-bithiophene, 1.6 mg (0.0017 mmol) $Pd_2dba_3$, and 4.2 mg (0.0139 mmol) of $P(o-tolyl)_3$. The mixture was subjected to 3 pump-purge cycles with $N_2$. THF (4 mL) was added, the tube was sealed, and the mixture was stirred in an oil bath at 80° C. for 4 hours. The mixture was cooled to room temperature and poured into 100 mL of methanol containing 5 mL of concentrated hydrochloric acid. The mixture was stirred for 5 minutes and filtered. The solid was purified by soxhlet extraction with methanol (1 h), chloroform (24 h), and chlorobenzene (2 h). The chlorobenzene extract (15 mL) was poured into 15 mL of methanol and filtered to give 21 mg (42% yield) of P25 as a brown solid.

EXAMPLE 26

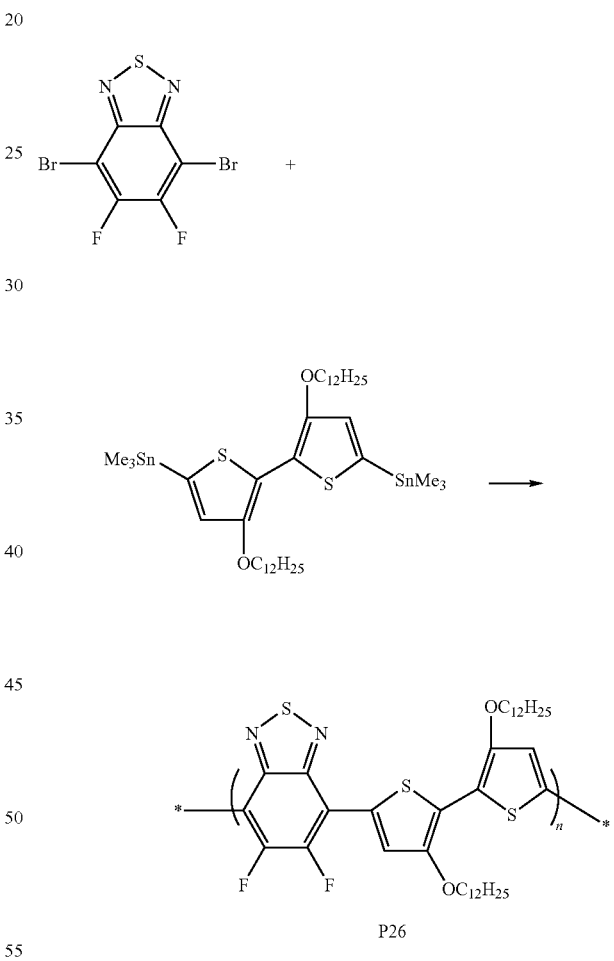

P26

An air-free vessel was charged with 19.2 mg (0.0581 mmol) of 4,7-dibromo-5,6-difluorobenzo[c][1,2,5]thiadiazole, 50 mg (0.0581 mmol) of 5,5'-bis(trimethylstannyl)-3,3'-bis(dodecyloxy)2,2'-bithiophene, 1.6 mg (0.0017 mmol) $Pd_2dba_3$, and 4.2 mg (0.0139 mmol) of $P(o-tolyl)_3$. The mixture was subjected to 3 pump-purge cycles with $N_2$. THF (4 mL) was added, the tube was sealed, and the mixture was stirred in an oil bath at 80° C. for 4 hours. The mixture was cooled to room temperature and poured into 25 mL of methanol containing 1.5 mL of concentrated hydrochloric acid. The mixture was centrifuged, the supernatant was removed, and the remaining solid was suspended in a minimal amount of methanol and filtered. The filter cake was dried to give P26 as a dark solid.

EXAMPLE 27

Synthesis of 4,4'-bis(dodecyloxy)-2,2'-bis(trimethylstannyl)-5,5'-bithiazole

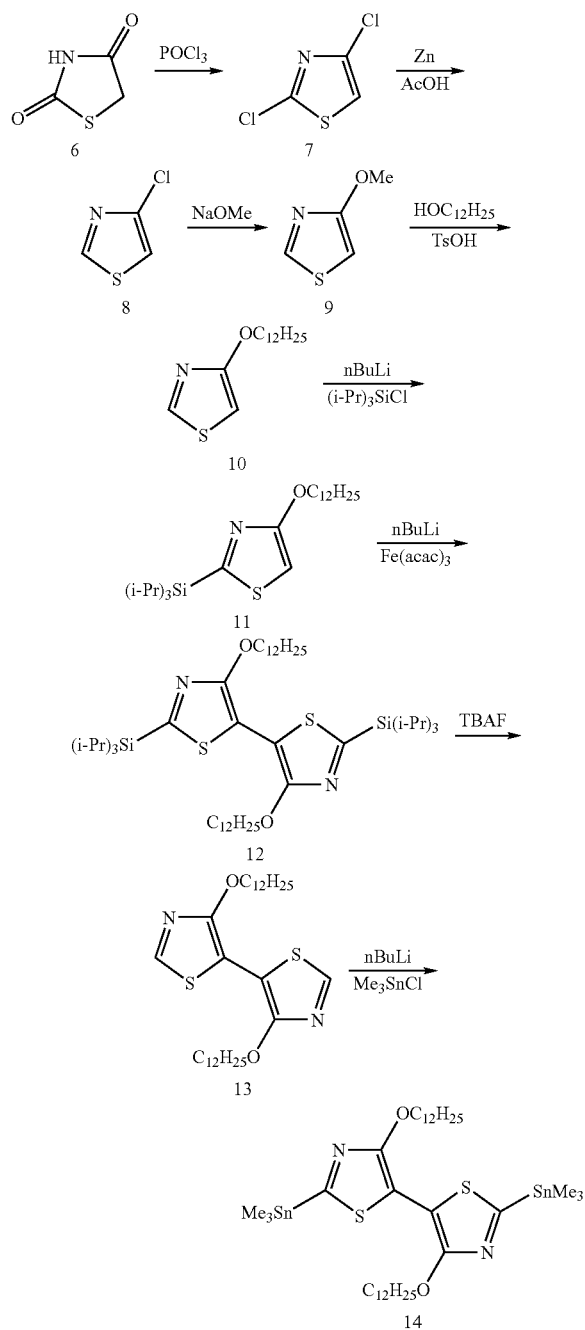

Preparation of 2,4-dichlorothiazole (7) (procedure adapted from *Bull. de la Soc. Chim. Fr.* 1962, 1735): A mixture of 100 g (0.853 mol) of 2,4-thiazolidinedione (6, VWR International), 560 mL (6 mol) of phosphorous oxychloride, and 150 mL (1.86 mol) of pyridine was refluxed for 3 hours. The reaction mixture was reduced in volume by half by distilling volatiles through a short column. The resulting dark slurry was poured onto 1 kg of ice. The mixture was extracted with diethyl ether (3×500 mL) and the combined ethereal extracts were washed successively with 500 mL each of 5% aqueous NaOH and brine. The separated organic layer was dried over $MgSO_4$, filtered, and concentrated in vacuo to a brown oil. The material was purified by vacuum distillation through an air condenser. The solid distillate was recrystallized from 200 mL of cold hexanes to give 68 g (52% yield) of 2,4-dichlorothiazole (7) as colorless needles. m.p. 42-43° C. (lit. 42-43° C.). $^1$H NMR (500 MHz) δ 7.04 (s, 1H).

Preparation of 4-chlorothiazole (8) (procedure adapted from *Bull. de la Soc. Chim. Fr.* 1962, 1735): A mixture of 58 g (377 mmol) of 2,4-dichlorothiazole (7), 87 g (1.3 mol) zinc dust, and 800 mL of acetic acid was refluxed for 6 hours. Thin layer chromatography indicated complete consumption of the dichloride. The mixture was cooled to room temperature and filtered. The filter cake was washed with 3×50 mL of acetic acid. The filtrate was poured onto 2 kg of ice and was treated with about 1.3 L of 50% (w/v) aqueous NaOH until a slightly basic mixture resulted (pH 9). The mixture was extracted with diethyl ether (3×600 mL) and the combined ethereal extracts were washed successively with 500 mL of saturated aqueous $NaHCO_3$ and 500 mL of brine. The separated organic layer was dried over $K_2CO_3$, filtered, and concentrated in vacuo to give 33 g (73% yield) of 4-chlorothiazole (8) as a colorless liquid of sufficient purity to use without further purification. $^1$H NMR (500 MHz) δ 8.77 (d, 1H, J=2.3 Hz), 7.19 (d, 1H, J=2.3 Hz).

Preparation of 4-methoxythiazole (9): A mixture of sodium methoxide, prepared by treating 450 mL of methanol with 21 g (913 mmol) of sodium metal, and 29.3 g (245 mmol) of 4-chlorothiazole (8) was refluxed for 24 hours. The mixture was cooled to room temperature and was reduced in volume by about half by concentrating on a rotovap. The mixture was dissolved in 500 mL of water and extracted with diethyl ether (500 mL, then 3×200 mL). The combined ethereal extracts were washed with 500 mL of brine, dried over $MgSO_4$, filtered, and concentrated in vacuo. The resulting red oil was purified by flash chromatography (silica gel, 5.5×30 cm, chloroform) and then by vacuum distillation to give 17.5 g (62% yield) of 4-methoxythiazole (9) as a colorless liquid. $^1$H NMR (500 MHz) δ 8.58 (d, 1H, J=2.2 Hz), 6.16 (d, 1H, J=2.3 Hz), 3.96 (s, 3H).

Preparation of 4-dodecyloxythiazole (10): A mixture of 4.0 g (34.7 mmol) of 4-methoxythiazole (9), 12.8 g (68.7 mmol) of dodecanol, 0.7 g (3.7 mmol) of p-toluenesulfonic acid monohydrate, and 75 mL of toluene was heated at 130° C. for 24 hours. The mixture was cooled to room temperature and purified by flash chromatography (silica gel, 5.5×30 cm, methylene chloride). The resulting oily solid was recrystallized from 20 mL of cold pentane to give 5.15 g (55% yield) of 4-dodecyloxythiazole (10) as a colorless solid. $^1$H NMR (500 MHz) δ 8.58 (d, 1H, J=2.3 Hz), 6.13 (d, 1H, J=2.3 Hz), 4.13 (t, 2H, J=6.6 Hz), 1.83 (m, 2H), 1.49-1.28 (m, 18H), 0.90 (t, 3H, J=7.0).

Preparation of 4-(dodecyloxy)-2-(triisopropylsilyl)thiazole (11): A solution of 4.38 g (16.3 mmol) of 4-dodecyloxythiazole (10) in 150 mL of THF was cooled to −78° C. The resulting suspension was treated dropwise with 6.50 mL (16.3 mmol) of n-BuLi (2.5 M in hexanes). The mixture was stirred for 2 hours then the dry ice bath was removed for several minutes to form a yellow solution. The mixture was cooled to −78° C. and treated with 3.76 g (19.5 mmol) of triisopropylchlorosilane. The dry ice bath was removed and the mixture was stirred at ambient temperature for 90 minutes. The mixture was concentrated in vacuo and separated by flash chromatography (silica gel, 5.5×33 cm, chloroform) to give 6.24 g (90% yield) of compound 11 as a pale yellow oil. $^1$H NMR (500 MHz) δ 6.24 (s, 1H), 4.10 (t, 2H, J=6.7 Hz), 1.83 (m, 2H), 1.49-1.23 (m, 21H), 1.13 (d, 18H), 0.90 (t, 3H, J=7.0).

Preparation of 4,4'-bis(dodecyloxy)-2,2'-bis(triisopropylsilyl)-5,5'-bithiazole (12): A solution of 6.24 g (14.7 mmol) of compound 11 in 150 mL of THF was cooled to −78° C. and treated dropwise with 6.45 mL (16.1 mmol) of n-BuLi (2.5 M in hexanes). The mixture was stirred for 45 minutes, then the dry ice bath was removed and the mixture was stirred at ambient temperature for 1 hour. The mixture was cooled to 0° C. and treated with 5.69 g (16.1 mmol) of Fe(acac)$_3$ (Strem Chemicals, Inc.). The mixture was heated in an 80° C. oil bath for 2 h, cooled to room temperature, and filtered. The filter cake was washed with 3×25 mL of THF. The filtrate was concentrated in vacuo and purified by flash chromatography (silica gel, 5.5×35 cm, chloroform) to give 6.0 g (96% yield) of compound 12 as a yellow oil. $^1$H NMR (500 MHz) δ 4.51 (t, 4H, J=6.3 Hz), 1.86-0.88 (m, 88H).

Preparation of 4,4'-bis(dodecyloxy)-5,5'-bithiazole (13): To a solution of 6.0 g (7.06 mmol) of compound 12 in 150 mL of THF at 0° C. was added a solution of 21.2 mL (21.2 mmol) of tetrabutylammonium fluoride (1.0 M in THF) dropwise over 5 minutes. The mixture was stirred for 30 minutes at 0° C. then the ice bath was removed and the mixture was stirred at ambient temperature for 90 minutes. The mixture was treated with 2 mL of water, concentrated in vacuo, and separated by flash chromatography (silica gel, 5.5×35 cm, 1:1 hexane:chloroform to methylene chloride). The resulting solid was recrystallized from hexanes to give 2.98 g (79% yield) of compound 13 as colorless needles. $^1$H NMR (500 MHz) δ 8.43 (s, 2H), 4.47 (t, 4H, J=6.5 Hz), 1.90-1.20 (m, 40H), 0.90 (t, 6H, J=7.0 Hz).

Preparation of 4,4'-bis(dodecyloxy)-2,2'-bis(trimethylstannyl)-5,5'-bithiazole (14): A solution of 0.16 g (0.298 mmol) of compound 13 in 24 mL of THF was cooled to −78° C. The resulting suspension was treated dropwise with 0.29 mL (0.725 mmol) n-BuLi (2.5 M in hexanes) and stirred for 30 minutes. The dry ice bath was removed and the mixture was stirred at ambient temperature for 30 minutes. The mixture was treated with 0.167 g (0.84 mmol) of trimethyltin chloride and heated in an oil bath at 60° C. for 30 minutes. The mixture was concentrated in vacuo. The resulting oily solid was triturated with 15 mL of hexanes and filtered warm. The filtrate was concentrated in vacuo to a yellow oil that solidified on standing to give 252 mg (98% yield) of compound 14. $^1$H NMR (500 MHz) δ 4.46 (t, 4H, J=6.5 Hz), 1.88-1.22 (m, 40H), 0.88 (t, 6H, J=7.0 Hz), 0.44 (s, 18H).

Synthesis of Polymer P27

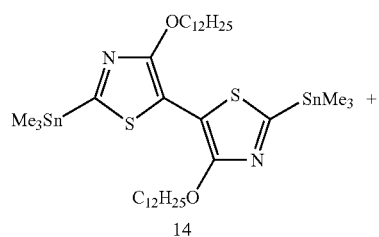

14

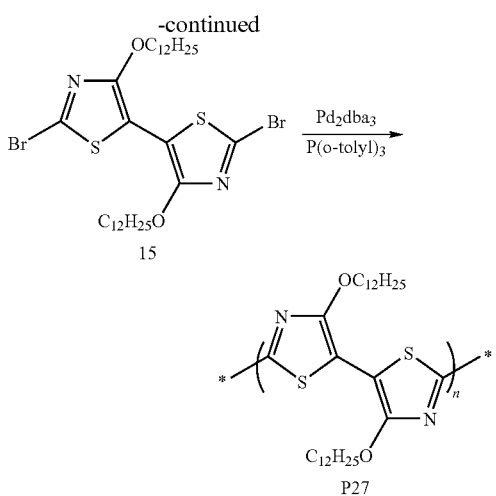

A mixture of 0.20 g (0.373 mmol) of compound 13, 0.16 g (0.90 mmol) of N-bromosuccinimide, and 40 mL of chloroform was heated in an oil bath at 60° C. for 1.5 hours. The mixture was concentrated in vacuo and the resulting solid was boiled with 40 mL of pentane and hot-filtered. The filtrate was concentrated in vacuo and the resulting solid was recrystallized from 20 mL of absolute ethanol to give 197 mg (76% yield) of compound 15 as colorless needles. m.p. 65° C. $^1$H NMR (500 MHz) δ 4.39 (t, 4H, J=6.5 Hz), 1.82-1.24 (m, 40H), 0.90 (t, 6H, J=7.0 Hz).

An air-free vessel was charged with 34.6 mg (0.0498 mmol) of compound 15, 41 mg (0.0475 mmol) of compound 14, 1.4 mg (0.0015 mmol) Pd$_2$dba$_3$, and 3.7 mg (0.012 mmol) of P(o-tolyl)$_3$. The mixture was subjected to 3 pump-purge cycles with N$_2$. THF (4 mL) was added, the tube was sealed, and the mixture was stirred in an oil bath at 80° C. for 4 hours. The mixture was cooled to room temperature, poured into 10 mL of methanol, and filtered through a cellulose thimble for soxhlet extraction with methanol (1 h), acetone (1 h), hexanes (1 h), and chloroform (40 mL, 30 min.). The chloroform extract was cooled to room temperature whereupon a precipitate formed. The mixture was added to 40 mL of methanol and filtered to give 46 mg (90% yield) of polymer P27 as a purple solid.

EXAMPLE 28

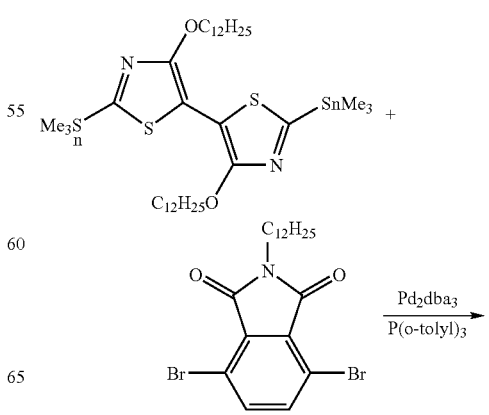

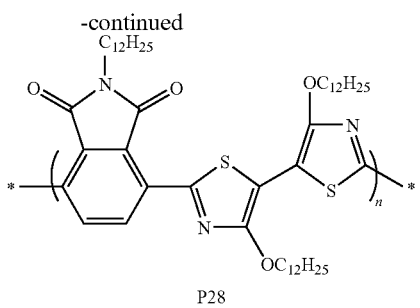

P28

An air-free vessel was charged with 100 mg (0.116 mmol) of compound 14, 50 mg (0.106 mmol) of N-dodecyl-3,6-dibromophthalimide, 3.0 mg (0.003 mmol) $Pd_2\,dba_3$, and 8.0 mg (0.026 mmol) of $P(o\text{-tolyl})_3$. The mixture was subjected to 3 pump-purge cycles with $N_2$. THF (7 mL) was added, the tube was sealed, and the mixture was stirred in an oil bath at 80° C. for 4 hours. The mixture was cooled to room temperature, poured into 50 mL of methanol, and filtered. The solid was purified by soxhlet extraction with methanol (1 h), acetone (1 h), hexanes (1 h), and chloroform. The chloroform extract was cooled to room temperature, added to 40 mL of methanol and filtered to give P28 as a brown solid.

EXAMPLE 29

Cyclic voltammetry measurements of polymers were carried out under nitrogen atmosphere using a BAS-CV-50W voltammetric analyzer with 0.1 M tetra-n-butylammonium hexafluorophosphate in actonitrile as supporting electrolyte. A platinum disk working electrode, a platinum wire counter electrode and silver wire reference electrode were employed and $Fc/Fc^+$ was used as reference for all measurements. The scan rate was 50 mV/S. Polymer films were produced by drop casting from 0.2% (w/w) toluene solutions. The supporting electrolyte solution was thoroughly purged with $N_2$ before all CV measurements.

Figure 4:
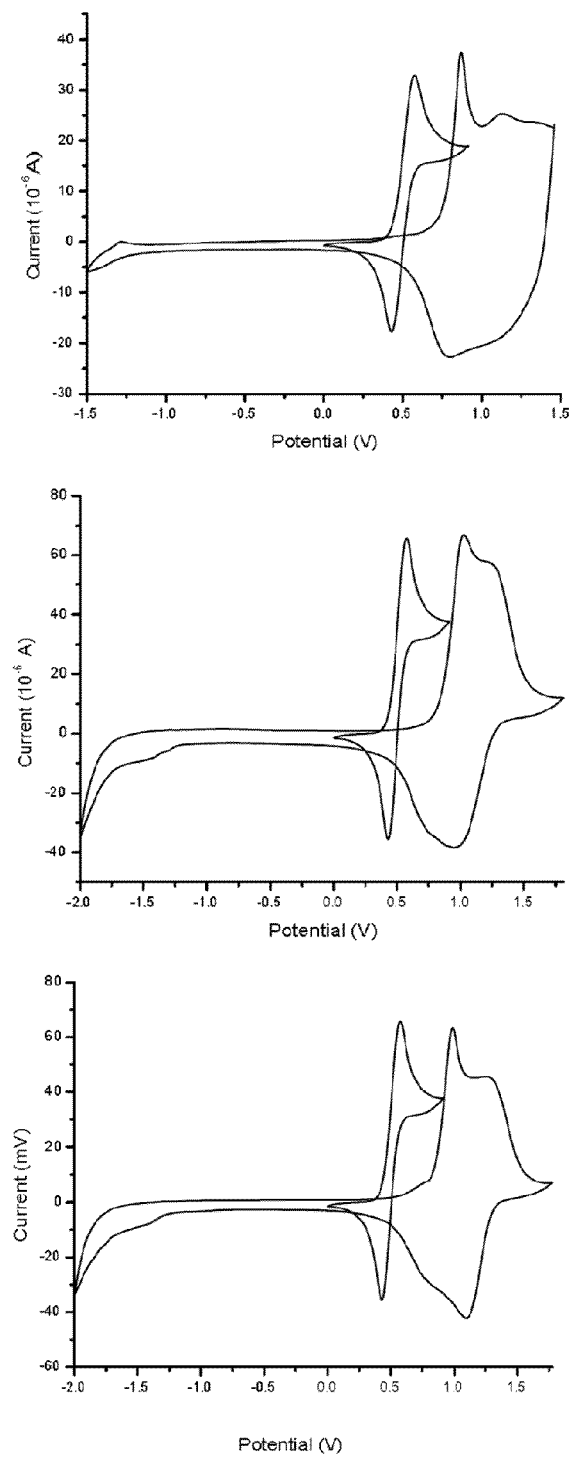
FIG. 4 shows cyclic voltammograms of two exemplary compounds of the present teachings and that of a comparative compound regioregular poly(3-hexylthiophene) (rr-P3HT) (top). Conditions: 0.1 M (n-Bu)$_4$N.PF$_6$ in acetonitrile; working electrode, Pt; counter electrode, Pt wire; reference electrode, Ag/AgCl; scanning rate, 50 mV/s. Each voltammogram is overlaid with that of Fc/Fc$^+$.

FIG. 4 shows cyclic voltammograms of P1 (center), P2 (bottom), and rr-P3HT (top, for comparison). It can be seen that measured under the same conditions, the oxidation potentials of the present polymers P1 and P2 were ~0.1 V more positive than that of rr-P3HT, which suggest that P1 and P2 should have enhanced ambient stability.

EXAMPLE 30

Thin-film transistor (TFT) devices (25-50 μm channel lengths (L) and 500-1000 μm channel widths (W)) were fabricated with P2 using bottom-gate top-contact configuration. N-doped $Si/SiO_2$ (300 nm thick thermal oxide) substrates were pre-treated with octadecyltrichorosilane (OTS). Semiconductor solution of P2 (10 mg/mL in chloroform-dichlorobenzene mixture) was spin-coated onto OTS-treated $SiO_2$ substrates. The semiconductor film was then baked at 100° C. in a vacuum oven for 1 hour. The gate region was accessed by an ohmic contact to the Si substrate, and Au source and drain contacts were evaporated through a shadow mask onto the semiconductor layer. All electrical measurements were performed in ambient atmosphere. Average hole mobility of ~0.20 $cm^2/Vs$ and current on/off ratio of ~$1\times10^5$ were achieved. Data reported here are average values measured from at least three devices tested at different locations on the semiconductor film.

EXAMPLE 31

TFT devices (25-50 μm channel lengths (L) and 500-1000 μm channel widths (W)) were fabricated with P5 using bottom-gate top-contact configuration. N-doped $Si/SiO_2$ (300 nm thick thermal oxide) substrates were pre-treated with octadecyltrichorosilane (OTS). Semiconductor solution of P5 (7 mg/mL in chloroform-dichlorobenzene mixture) was spin-coated onto OTS-treated SiO2 substrates. The semiconductor film was then baked at 100° C. in a vacuum oven for 1 hour. The gate region was accessed by an ohmic contact to the Si substrate, and Au source and drain contacts were evaporated through a shadow mask onto the semiconductor layer. All electrical measurements were performed in ambient atmosphere. Average hole mobility of ~0.07 $cm^2/Vs$ and current on/off ratio of ~$5\times10^6$ were achieved. Data reported here are average values measured from at least three devices tested at different locations on the semiconductor film.

EXAMPLE 32

TFT devices (25-50 μm channel lengths (L) and 500-1000 μm channel widths (W)) were fabricated with P6 using bottom-gate top-contact configuration. N-doped $Si/SiO_2$ (300 nm thick thermal oxide) substrates were pre-treated with octadecyltrichorosilane (OTS). Semiconductor solution of P6 (7 mg/mL in chloroform-dichlorobenzene mixture) was spin-coated onto OTS-treated SiO2 substrates. The semiconductor film was then baked at 100° C. in a vacuum oven for 1 hour. The gate region was accessed by an ohmic contact to the Si substrate, and Au source and drain contacts were evaporated through a shadow mask onto the semiconductor layer. All electrical measurements were performed in ambient atmosphere. Average hole mobility of ~0.002 $cm^2/Vs$ and current on/off ratio of ~$2\times10^5$ were achieved. Data reported here are average values measured from at least three devices tested at different locations on the semiconductor film.

EXAMPLE 33

TFT devices (25-50 μm channel lengths (L) and 500-1000 μm channel widths (W)) were fabricated with P8 using bottom-gate top-contact configuration. N-doped $Si/SiO_2$ (300 nm thick thermal oxide) substrates were pre-treated with octadecyltrichorosilane (OTS). Semiconductor solution of P8 (7 mg/mL in chloroform-dichlorobenzene mixture) was spin-coated onto OTS-treated SiO2 substrates. The semiconductor film was then baked at 100° C. in a vacuum oven for 1 hour. The gate region was accessed by an ohmic contact to the Si substrate, and Au source and drain contacts were evaporated through a shadow mask onto the semiconductor layer. All electrical measurements were performed in ambient atmosphere. Average hole mobility of ~$3\times10^{-5}$ $cm^2/Vs$ and current on/off ratio of ~$3\times10^3$ were achieved. Data reported here are average values measured from at least three devices tested at different locations on the semiconductor film.

EXAMPLE 34

Similar TFT devices (25-50 μm channel lengths (L) and 500-1000 μm channel widths (W)) were fabricated with P9 using bottom-gate top-contact configuration. N-doped $Si/SiO_2$ (300 nm thick thermal oxide) substrates were pre-treated with octadecyltrichorosilane (OTS). Semiconductor solution of P9 (7 mg/mL in chloroform-dichlorobenzene mixture) was spin-coated onto OTS-treated SiO2 substrates. The semiconductor film was then baked at 100° C. in a vacuum oven for 1 hour. The gate region was accessed by an ohmic contact to the Si substrate, and Au source and drain contacts were evaporated through a shadow mask onto the semiconductor layer. All electrical measurements were performed in ambient atmosphere. Average hole mobility of ~2×10⁻⁴ cm²/Vs and current on/off ratio of ~1×10⁵ were achieved. Data reported here are average values measured from at least three devices tested at different locations on the semiconductor film.

EXAMPLE 35

Similar TFT devices (25-50 μm channel lengths (L) and 500-1000 μm channel widths (W)) were fabricated with P10 using bottom-gate top-contact configuration. N-doped Si/SiO₂ (300 nm thick thermal oxide) substrates were pre-treated with octadecyltrichorosilane (OTS). Semiconductor solution of P10 (7 mg/mL in chloroform-dichlorobenzene mixture) was spin-coated onto OTS-treated SiO2 substrates. The semiconductor film was then baked at 100° C. in a vacuum oven for 1 hour. The gate region was accessed by an ohmic contact to the Si substrate, and Au source and drain contacts were evaporated through a shadow mask onto the semiconductor layer. All electrical measurements were performed in ambient atmosphere. Average hole mobility of ~0.001 cm²/Vs and current on/off ratio of ~5×10¹ were achieved. Data reported here are average values measured from at least three devices tested at different locations on the semiconductor film.

EXAMPLE 36

TFT devices (25-50 μm channel lengths (L) and 500-1000 μm channel widths (W)) were fabricated with P13 using bottom-gate top-contact configuration. N-doped Si/SiO₂ (300 nm thick thermal oxide) substrates were pre-treated with octadecyltrichorosilane (OTS). Semiconductor solution of P13 (7 mg/mL in chloroform-dichlorobenzene mixture) was spin-coated onto OTS-treated SiO2 substrates. The semiconductor film was then baked at 100° C. in a vacuum oven for 1 hour. The gate region was accessed by an ohmic contact to the Si substrate, and Au source and drain contacts were evaporated through a shadow mask onto the semiconductor layer. All electrical measurements were performed in ambient atmosphere. Average hole mobility of ~0.003 cm²/Vs and current on/off ratio of ~1×10⁵ were achieved. Data reported here are average values measured from at least three devices tested at different locations on the semiconductor film.

EXAMPLE 37

TFT devices (25-50 μm channel lengths (L) and 500-1000 μm channel widths (W)) were fabricated with P15 using bottom-gate top-contact configuration. N-doped Si/SiO₂ (300 nm thick thermal oxide) substrates were pre-treated with octadecyltrichorosilane (OTS). Semiconductor solution of P15 (7 mg/mL in chloroform-dichlorobenzene mixture) was spin-coated onto OTS-treated SiO2 substrates. The semiconductor film was then baked at 100° C. in a vacuum oven for 1 hour. The gate region was accessed by an ohmic contact to the Si substrate, and Au source and drain contacts were evaporated through a shadow mask onto the semiconductor layer. All electrical measurements were performed in ambient atmosphere. Average hole mobility of ~4×10⁻⁴ cm²/Vs and current on/off ratio of ~1×10⁵ were achieved. Data reported here are average values measured from at least three devices tested at different locations on the semiconductor film.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. An electionic, optical or optoelectronic device comprising a semiconductor component, wherein the semiconductor component comprises a p-type semiconductor consisting of a polymeric compound having a degree of polymerization in the range of 10 to 10,000, wherein the polymeric compound is a copolymer consisting of a first repeating unit:

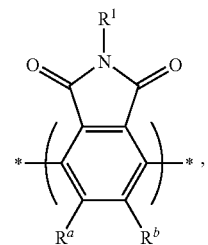

wherein:
R¹ is selected from the group consisting of H, a $C_{1-40}$ alkyl group, a $C_{2-40}$ alkenyl group, and a $C_{1-40}$ haloalkyl group; and $R^a$ and $R^b$ independently are selected from the group consisting of H, a halogen, CN, a $C_{1-40}$ alkyl group, a $C_{2-40}$ alkenyl group, a $C_{1-40}$ haloalkyl group, a $C_{1-40}$ alkoxy group, and a $C_{1-40}$ alkylthio group; and a second repeating unit:

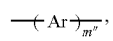

wherein:
each Ar independently is an optionally substituted thienyl group; and m is 1, 2, 3, or 4: and wherein the p-type semiconductor is characterized by a hole mobility of at least about 0.002cm²/Vs.

2. The electronic, optical or optoelectronic device according to claim 1 configured as a thin film transistor comprising a substrate, a source electrode, a drain electrode a gate electrode a gate dielectric component, and the semiconductor component wherein the semiconductor component is in contact with the source electrode and the drain electrode, and the gate dielectric component is in contact with the semiconductor component on one side and the gate electrode on an opposite side.

3. The electronic, optical or optoelectronic device according to claim 1 configured as a photovoltaic device comprising a substrate an anode, a cathode, and the semiconductor component disposed between the anode and the cathode.

4. The device of claim 3, wherein the semiconductor component is photoactive and comprises a blend material comprising one or more fullerene derivatives.

5. The device of claim 1, wherein the second repeating unit is selected from the group consisting of:

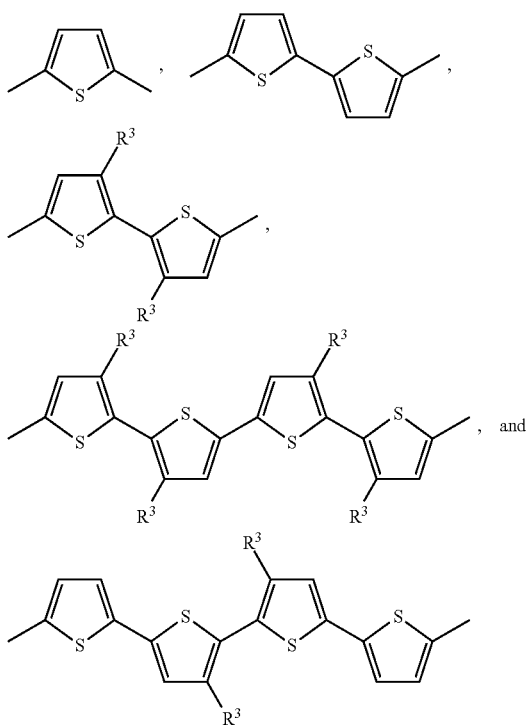

wherein R³, at each occurrence, independently is selected from the group consisting of a $C_{1-20}$ alkyl group and a $C_{1-20}$ alkoxy group.

6. The device of claim 1, wherein R¹ is a linear $C_{1-40}$ alkyl group, a linear $C_{1-40}$ haloalkyl group, or a branched group selected from the group consisting of:

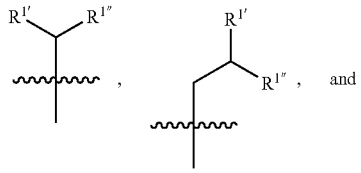

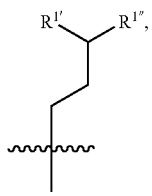

wherein R¹' and R¹'', independently are a linear $C_{1-20}$ alkyl group or a linear $C_{1-20}$ haloalkyl group.

7. An electronic, optical or optoelectronic device comprising a semiconductor component, wherein the semiconductor component comprises a p-type semiconductor consisting of a polymeric compound having a degree of polymerization in the range of 10 to 10,000, wherein the polymeric compound consists of the repeating units:

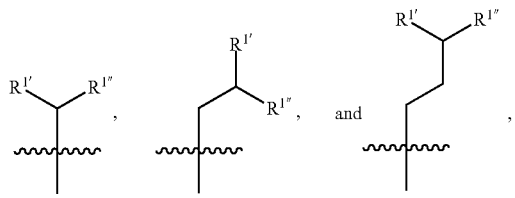

wherein:
R¹ is selected from the group consisting of H, a $C_{1-40}$ alkyl group, a $C_{2-40}$ alkenyl group, and a $C_{1-40}$ haloalkyl group;
L'', at each occurrence, independently is selected from the group consisting of —$CH_2$— and —O—;
R, at each occurrence, independently is selected from the group consisting of a $C_{1-40}$ alkyl group, a $C_{2-40}$ alkenyl group, a $C_{2-40}$ alkynyl group, and a $C_{1-40}$ haloalkyl group, wherein optionally one or more non-adjacent $CH_2$ groups independently are replaced by —O—, provided that no two oxygen atoms are linked directly to one another; and X³ and X⁴ are CH: and
wherein the p-type semiconductor is characterized by a hole mobility of at least about 0.002cm²/Vs.

8. The device of claim 7, wherein R¹ is a linear $C_{1-40}$ alkyl group, a linear $C_{1-40}$ haloalkyl group, or a branched group selected from the group consisting of:

wherein R¹' and R¹''', independently are a linear $C_{1-20}$ alkyl group or a linear $C_{1-20}$ haloalkyl group.

9. The electronic, optical or optoelectronic device according to claim 7 configured as a thin film transistor comprising a substrate, a source electrode, a drain electrode, a gate electrode, a gate dielectric component, and the semiconductor component, wherein the semiconductor component is in contact with the source electrode and the drain electrode, and the gate dielectric component is in contact with the semiconductor component on one side and the gate electrode on an opposite side.

10. The electronic, optical or optoelectronic device according to claim 7 configured as a photovoltaic device comprising a substrate, an anode, a cathode, and the semiconductor component disposed between the anode and the cathode.

11. The device of claim 10, wherein the semiconductor component is photoactive and comprises a blend material comprising one or more fullerene derivatives.

12. An electionic, optical or optoelectionic device comprising a semiconductor component, wherein the semiconductor component comprises a p-type semiconductor consisting of a polymeric compound having a degree of polymerization in the range of 10 to 10,000, wherein the polymeric compound consists of repeating units selected from the group consisting of:

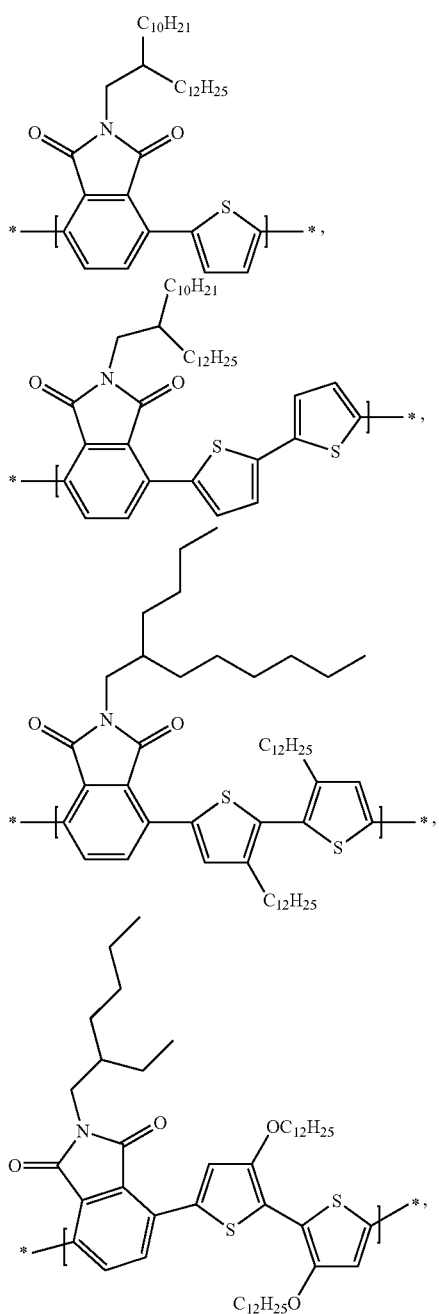

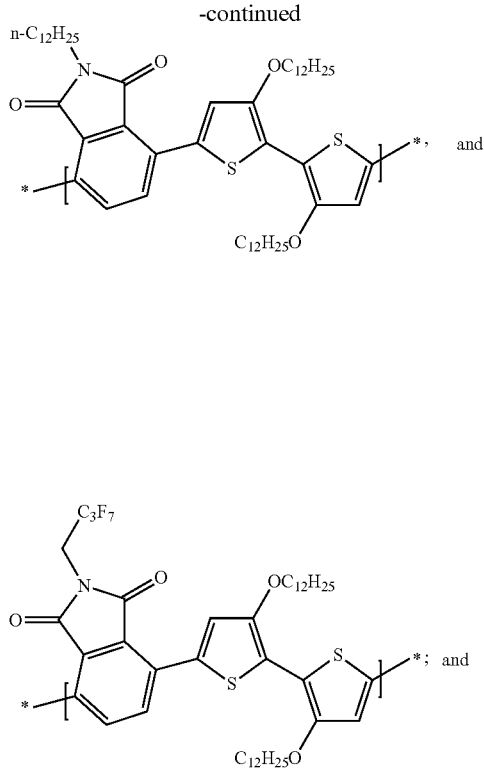

wherein the p-type semiconductor is characterized by a hole mobility of at least about 0.002cm$^2$/Vs.

13. The electronic, optical or optoelectronic device according to claim 12 configured as a thin film transistor comprising a substrate, a source electrode, a drain electrode, a gate electrode, a gate dielectric component, and the semiconductor component, wherein the semiconductor component is in contact with the source electrode and the drain electrode, and the gate dielectric component is in contact with the semiconductor component on one side and the gate electrode on an opposite side.

14. The electronic, optical or optoelectronic device according to claim 12 configured as a photovoltaic device comprising a substrate, an anode, a cathode, and the semiconductor component disposed between the anode and the cathode.

15. The device of claim 14, wherein the semiconductor component is photoactive and comprises a blend material comprising one or more fullerene derivatives.

* * * * *